United States Patent
Shishido et al.

(10) Patent No.: US 9,525,017 B2
(45) Date of Patent: Dec. 20, 2016

(54) DISPLAY DEVICE

(71) Applicant: Semiconductor Energy Laboratory Co., Ltd., Kanagawa-ken (JP)

(72) Inventors: Hideaki Shishido, Kanagawa (JP); Hiroyuki Miyake, Tochigi (JP); Kouhei Toyotaka, Kanagawa (JP); Makoto Kaneyasu, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 0 days.

(21) Appl. No.: 14/848,698

(22) Filed: Sep. 9, 2015

(65) Prior Publication Data

US 2016/0079333 A1    Mar. 17, 2016

(30) Foreign Application Priority Data

Sep. 12, 2014 (JP) ................. 2014-185978
Oct. 28, 2014 (JP) ................. 2014-218933
Dec. 1, 2014 (JP) ................. 2014-242929
May 29, 2015 (JP) ................. 2015-110198

(51) Int. Cl.
*H01L 27/32* (2006.01)

(52) U.S. Cl.
CPC ....... *H01L 27/3276* (2013.01); *H01L 27/3216* (2013.01); *H01L 27/3218* (2013.01); *H01L 27/3248* (2013.01); *H01L 27/3262* (2013.01)

(58) Field of Classification Search
CPC ............. H01L 27/3276; H01L 37/3262; H01L 27/3248; H01L 37/3218
See application file for complete search history.

(56) References Cited

U.S. PATENT DOCUMENTS

| | | |
|---|---|---|
| 7,399,991 B2 | 7/2008 | Seo et al. |
| 8,044,905 B2 | 10/2011 | Kasahara |
| 8,552,635 B2 | 10/2013 | Kim et al. |
| 8,687,161 B2 | 4/2014 | Kasahara |
| 9,147,368 B2 | 9/2015 | Kasahara |

(Continued)

FOREIGN PATENT DOCUMENTS

| | | |
|---|---|---|
| CN | 001892734 A | 1/2007 |
| JP | 2002-324673 | 11/2002 |

(Continued)

OTHER PUBLICATIONS

International Search Report re Application No. PCT/IB2015/056651, dated Dec. 28, 2015.

(Continued)

*Primary Examiner* — Roy Potter
*Assistant Examiner* — Paul Patton
(74) *Attorney, Agent, or Firm* — Husch Blackwell LLP

(57) ABSTRACT

Provided is a display device with high resolution, high display quality, or high aperture ratio. A pixel includes three subpixels and is electrically connected to two gate lines. One of the gate lines is electrically connected to a gate of a transistor included in each of the two subpixels, and the other gate line is electrically connected to a gate of a transistor included in the other subpixel. Display elements of the three subpixels are arranged in the same direction. Three pixel electrodes of the three subpixels are arranged in the same direction.

20 Claims, 34 Drawing Sheets

(56) References Cited

U.S. PATENT DOCUMENTS

| | | | |
|---|---|---|---|
| 2007/0002084 A1* | 1/2007 | Kimura | G09G 3/3241 |
| | | | 345/694 |
| 2009/0140253 A1* | 6/2009 | Kasahara | H01L 27/1214 |
| | | | 257/59 |
| 2014/0104151 A1 | 4/2014 | Yamazaki et al. | |
| 2014/0117339 A1 | 5/2014 | Seo | |
| 2015/0144945 A1 | 5/2015 | Kusunoki et al. | |

FOREIGN PATENT DOCUMENTS

| | | | | |
|---|---|---|---|---|
| JP | 2004-117689 A | | 4/2004 | |
| JP | 2004-117689 A | * | 4/2004 | H05B 33/22 |
| JP | 2007-041578 A | | 2/2007 | |
| JP | 2009-157365 A | | 7/2009 | |
| KR | 2012-0039759 A | | 4/2012 | |
| WO | WO 2009/072452 A1 | | 6/2009 | |

OTHER PUBLICATIONS

Written Opinion re Application No. PCT/IB2015/056651, dated Dec. 28, 2015.

* cited by examiner

FIG. 23A1 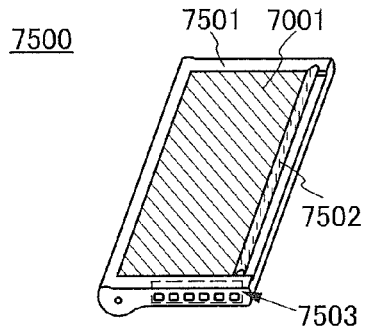

FIG. 23A2

FIG. 23F   FIG. 23G 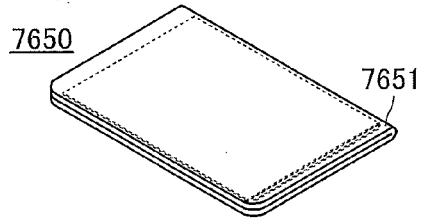 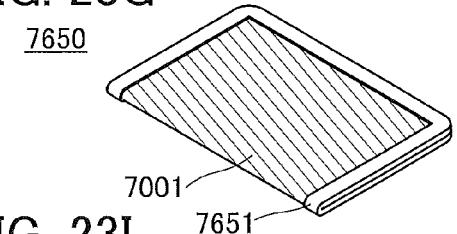

DISPLAY DEVICE

TECHNICAL FIELD

One embodiment of the present invention relates to a display device.

Note that one embodiment of the present invention is not limited to the above technical field. The technical field of one embodiment of the invention disclosed in this specification and the like relates to an object, a method, or a manufacturing method. One embodiment of the present invention relates to a process, a machine, manufacture, or a composition of matter. Examples of the technical field of one embodiment of the present invention disclosed in this specification include a semiconductor device, a display device, a light-emitting device, a lighting device, a power storage device, a storage device, a method for driving any of them, and a method for manufacturing any of them.

BACKGROUND ART

In recent years, a high-definition display device has been required. For example, full high-definition (the number of pixels is 1920×1080) has been in the mainstream of home-use television devices (also referred to as a television or a television receiver); however, 4K (the number of pixels is 3840×2160) and 8K (the number of pixels is 7680×4320) will also be spread with the development of high-definition television devices.

High-definition display panels of portable information terminals, such as mobile phones, smartphones, and tablets, have also been developed.

Examples of the display device include, typically, a liquid crystal display device, a light-emitting device including a light-emitting element such as an organic electroluminescent (EL) element or a light-emitting diode (LED), and an electronic paper performing display by an electrophoretic method or the like.

For example, in a basic structure of an organic EL element, a layer containing a light-emitting organic compound is provided between a pair of electrodes. By voltage application to this element, the light-emitting organic compound can emit light. A display device including such an organic EL element needs no backlight which is necessary for liquid crystal display devices and the like, and a thin, lightweight, high contrast, and low power consumption display device can be thus obtained. Patent Document 1, for example, discloses an example of a display device using organic EL elements.

REFERENCE

Patent Document

[Patent Document 1] Japanese Published Patent Application No. 2002-324673

DISCLOSURE OF INVENTION

The area of a display region of a display panel mounted on a portable information terminal, for example, is smaller than that of a television device and the like, and thus the resolution needs to be increased for high definition.

An object of one embodiment of the present invention is to provide a display device with extremely high resolution. Another object is to provide a display device with high display quality. Another object is to provide a display device with high aperture ratio. Another object is to provide a highly reliable display device. Another object is to provide a display device with a novel structure.

Note that the descriptions of these objects do not disturb the existence of other objects. There is no need to achieve all of these objects with one embodiment of the present invention. Objects other than the above objects will be apparent from and can be derived from the description of the specification and the like.

Means for Solving the Problems

One embodiment of the present invention is a display device including a pixel, a first wiring, and a second wiring. The pixel includes a first subpixel, a second subpixel, and a third subpixel. The first subpixel includes a first transistor and a first display element. The second subpixel includes a second transistor and a second display element. The third subpixel includes a third transistor and a third display element. The first wiring is electrically connected to a gate of the first transistor and a gate of the second transistor. The second wiring is electrically connected to a gate of the third transistor.

In the above, the first display element includes a first electrode, the second display element includes a second electrode, and the third display element includes a third electrode. The third electrode preferably includes a region between the first electrode and the second electrode in a plane view.

In the above, a straight line through a centroid of the first electrode and a centroid of the second electrode does not preferably overlap with a centroid of the third electrode in a plane view.

In the above, it is preferable that the first electrode and the second wiring do not overlap with each other, the second electrode and the second wiring do not overlap with each other, and the third electrode and the first wiring include an overlap region.

Another embodiment of the present invention is a display device including a first pixel, a second pixel, a first wiring, and a second wiring. The first pixel includes a first subpixel, a second subpixel, and a third subpixel. The second pixel includes a fourth subpixel, a fifth subpixel, and a sixth subpixel. The first subpixel includes a first transistor and a first display element. The second subpixel includes a second transistor and a second display element. The third subpixel includes a third transistor and a third display element. The fourth subpixel includes a fourth transistor and a fourth display element. The fifth subpixel includes a fifth transistor and a fifth display element. The sixth subpixel, includes a sixth transistor and a sixth display element. The first wiring is electrically connected to a gate of the first transistor, a gate of the second transistor, and a gate of the fourth transistor. The second wiring is electrically connected to a gate of the third transistor, a gate of the fifth transistor, and a gate of the sixth transistor.

In the above, it is preferable that the first display element include a first electrode, the second display element include a second electrode, the third display element include a third electrode, the fourth display element include a fourth electrode, the fifth display element include a fifth electrode, and the sixth display element include a sixth electrode. In addition, it is preferable that the third electrode include a region between the first electrode and the second electrode in a plane view, the fourth electrode include a region between the fifth electrode and the sixth electrode in a plane view, and the second electrode be adjacent to the fifth electrode in a plane view.

In the above, it is preferable that a centroid of the first electrode, a centroid of the second electrode, and a centroid of the fourth electrode be in a first line; a centroid of the third electrode, a centroid of the fifth electrode, and a centroid of the sixth electrode be in a second line; and the first line be parallel to and do not overlap with the second line.

In the above, it is preferable that the first electrode and the second wiring do not overlap with each other, the second electrode and the second wiring do not overlap with each other, the third electrode and the first wiring include an overlap region, the fourth electrode and the second wiring do not overlap with each other, the fifth electrode and the first wiring include an overlap region, and the sixth electrode and the first wiring include an overlap region.

In the above, it is preferable that the display device include a third wiring, a fourth wiring, and a fifth wiring; one of a source and a drain of the first transistor be electrically connected to the third wiring; one of a source and a drain of the second transistor be electrically connected to the fourth wiring; one of a source and a drain of the third transistor be electrically connected to the third wiring; one of a source and a drain of the fourth transistor be electrically connected to the fifth wiring; one of a source and a drain of the fifth transistor be electrically connected to the fourth wiring; and one of a source and a drain of the sixth transistor be electrically connected to the fifth wiring.

Alternatively, it is preferable that the display device include the third wiring, the fourth wiring, the fifth wiring, and a sixth wiring; one of the source and the drain of the first transistor be electrically connected to the fourth wiring; one of the source and the drain of the second transistor be electrically connected to the fifth wiring; one of the source and the drain of the third transistor be electrically connected to the third wiring; one of the source and the drain of the fourth transistor be electrically connected to the sixth wiring; one of the source and the drain of the fifth transistor be electrically connected to the fourth wiring; and one of the source and the drain of the sixth transistor be electrically connected to the fifth wiring.

In the above, it is preferable that the fourth wiring be between the second electrode and the third electrode and that the fifth wiring be between the fourth electrode and the fifth electrode in a plane view.

In the above, it is preferable that the first display element and the fifth display element have a function of emitting light of a first color, the second display element and the sixth display element have a function of emitting light of a second color, and the third display element and the fourth display element have a function of emitting light of a third color.

In the above, a resolution of the display device is preferably more than or equal to 400 ppi and less than or equal to 2000 ppi.

In the above, the display device preferably includes a circuit having a function of selectively outputting current flowing through each of the first to third display elements and a function of supplying respective predetermined potentials to the first to third display elements.

One embodiment of the present invention can provide a display device with extremely high resolution, a display device with high display quality, a display device with high aperture ratio, a highly reliable display device, or a display device with a novel structure.

Note that the description of these effects does not disturb the existence of other effects. One embodiment of the present invention does not necessarily achieve all the objects listed above. Other effects will be apparent from and can be derived from the description of the specification, the drawings, the claims, and the like.

BRIEF DESCRIPTION OF DRAWINGS

FIGS. 22A, 22B, 22C1, 22C2, 22D, 22E, 22F, 22G, and 22H illustrate examples of electronic devices and a lighting device of one embodiment.
FIGS. 23A1, 23A2, 23B, 23C, 23D, 23E, 23F, 23G, 23H, and 23I illustrate an example of an electronic device of one embodiment.

BEST MODE FOR CARRYING OUT THE INVENTION

Figure 1A:
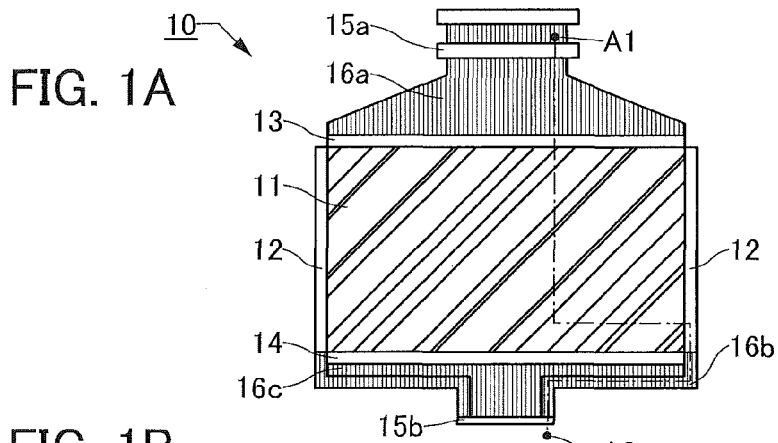
FIGS. 1A, 1B, and 1C illustrate a structure example of a display device of one embodiment.

Embodiments will be described in detail with reference to drawings. Note that the present invention is not limited to the description below, and it is easily understood by those skilled in the art that various changes and modifications can be made without departing from the spirit and scope of the present invention. Accordingly, the present invention should not be interpreted as being limited to the content of the embodiments below.

Note that in the structures of the invention described below, the same portions or portions having similar functions are denoted by the same reference numerals in different drawings, and description of such portions is not repeated. In addition, the same hatching pattern is applied to portions having similar functions, and the portions are not especially denoted by reference numerals in some cases.

Note that in each drawing described in this specification, the size, the layer thickness, or the region of each component is exaggerated for clarity in some cases. Therefore, embodiments of the present invention are not limited to such a scale.

Note that in this specification and the like, ordinal numbers such as "first", "second", and the like are used in order to avoid confusion among components and do not limit the number.

A transistor is a kind of semiconductor elements and can achieve amplification of current or voltage, switching operation for controlling conduction or non-conduction, or the like. A transistor in this specification includes an insulated-gate field effect transistor (IGFET) and a thin film transistor (TFT).

Functions of a "source" and a "drain" are sometimes replaced with each other when a transistor of opposite polarity is used or when the direction of flow of current is changed in circuit operation, for example. Therefore, the terms "source" and "drain" can be used to denote the drain and the source, respectively, in this specification.

Embodiment 1

In this embodiment, a structure example of a display device of one embodiment of the present invention is described.

The display device of one embodiment of the present invention includes a plurality of pixels. Each pixel includes a plurality of subpixels. Each subpixel includes a display element and a pixel circuit. The display elements of the subpixels emit different colors. Each pixel circuit includes at least one transistor. Each display element includes at least one electrode (also referred to as a pixel electrode) which is electrically connected to the corresponding pixel circuit. The transistor included in each pixel circuit has a function as a switch for selecting the subpixel, and can be referred to as a selection transistor. In addition to the selection transistor, an element, such as another transistor, a capacitor, or a diode, a wiring for connecting the elements, and the like may be included in each pixel circuit.

The display device of one embodiment of the present invention includes a plurality of wirings (also referred to as gate lines) each of which is electrically connected to a gate of the selection transistor of the pixel circuit. The potential supplied via the wiring controls on/off of the selection transistor, thereby controlling selection of the subpixel.

In one embodiment of the present invention, the pixel includes two or more subpixels. The number of gate lines electrically connected to the pixel is larger than or equal to two and smaller than or equal to the number of subpixels per pixel. At least one subpixel of the pixel is electrically connected to each of the gate lines.

Described here is a configuration example in which the pixel includes three subpixels and two gate lines are electrically connected to the pixel. Specifically, one gate line is electrically connected to each gate of the selection transistors of the two subpixels, and the other gate line is electrically connected to a gate of the selection transistor of the other subpixel.

Display elements of the three subpixels are arranged in one direction, that is, three pixel electrodes of the three subpixels are arranged in one direction.

Such a pixel structure of the display device of one embodiment of the present invention makes it easier to reduce the area occupied by pixels, and accordingly the resolution of the display device can be increased. One reason why the pixel structure can reduce the area occupied by pixels will be explained.

In order to increase the resolution of a display device, the area occupied by pixels needs to be reduced by narrowing design rule, such as the minimum feature size or alignment accuracy between layers, for example. However, design rule tightening depends on performance capabilities of the manufacturing apparatus and is very difficult. For example, cost of technical development of a light-exposure apparatus is extremely high, and even if a novel manufacturing apparatus is developed, huge cost of capital investment is necessary to replace existing apparatus with the novel one.

A comparison example in which one gate line is connected to each selection transistor of three subpixels is considered. A pixel that is square or substantially square in planar view is preferable. In this case, three pixel circuits are arranged in the extending direction of a gate line. In the case of the square pixel, the pixel circuit needs to be fit at least in a rectangular in which the ratio of the length in the extending direction of a gate line to the length in the direction intersecting with the extending direction is approximately 1:3. In addition, in order to reduce area occupied by the pixel that is square in planar view, not either one of but both of the length in the extending direction of a gate line and the length in the direction intersecting with the extending direction need be reduced to a similar extent.

Because there is design rule for process, the size of an element, an electrode, and a contact hole which are included in a pixel circuit, the width of a wiring between the elements, the distance between the elements, and the distance between the element and the wiring, and the like are not allowed to be below a certain value in the manufacturing process of the pixel circuit It is thus difficult to reduce the length of the subpixel on the short side of the rectangle, that is, the length of the subpixel on the extending direction of a gate line to a similar extent as the length of the subpixel on the long side of the rectangle by taking any measure to arrange an element, a wiring, and the like so that the area occupied by the subpixel, which is fit into the rectangle, can be reduced.

In addition, one or more wiring intersecting a gate line needs to be provided in each pixel circuit. Thus, more components, such as a wiring, are densely provided in the pixel in the extending direction of a gate line than in the direction intersecting with the extending direction. For this reason, it is more difficult to reduce the length of a pixel circuit in the extending direction of a gate line.

In a pixel of one embodiment of the present invention, the number of pixel circuits arranged in the extending direction of a gate line can be reduced, which makes it easier to reduce the length of a pixel in the extending direction of the gate line as compared to the above described structure. In addition, a wiring intersecting with a gate line can be shared by two pixel circuits that are electrically connected to different gate lines in one pixel, which leads to reduction in the number of wirings intersecting with a gate line per pixel and makes it easier to further reduce the length of a pixel in the extending direction of a gate line.

One embodiment of the present invention preferably has a structure including a pixel unit with a pair of pixels. Specifically, the pixel unit includes a first pixel and a second pixel. In the first pixel, two pixel circuits are connected to a first gate line and one pixel circuit is connected to a second gate line. In the second pixel, one pixel circuit is connected to the first gate line and two pixel circuits are electrically connected to the second gate line. Six pixel circuits of a pixel unit are preferably arranged to fit in a rectangle in which the ratio of the length in the extending direction of a gate line to the length in the direction intersecting with the gate line is approximately 2:1, for example. Such a structure makes it easier to reduce the area occupied by the pixel because the pixel circuits can be arranged densely and efficiently. In addition, the number of wirings intersecting with a gate line connected to the pair of pixels can be reduced at least two as compared to the above comparison structure.

In a display device of one embodiment of the present invention, the area occupied by a pixel can be extremely small, and a display device including an extremely high-resolution pixel portion can be achieved. For example, the resolution of the pixel portion can be more than or equal to 400 ppi (pixels per inch) and less than or equal to 2000 ppi, more than or equal to 500 ppi and less than or equal to 2000 ppi, preferably more than or equal to 600 ppi and less than or equal to 2000 ppi, more preferably more than or equal to 800 ppi and less than or equal to 2000 ppi, still more preferably more than or equal to 1000 ppi and less than or equal to 2000 ppi. A 1058 ppi display device can be provided, for example.

Such a high-resolution display device can be preferably used for electrical devices which are relatively small, for example, a portable information terminal such as a mobile phone, a smartphone, and a tablet terminal, a wearable device such as a smart watch, a finder of a camera or the like, and displays for medical use.

Structure examples of one embodiment of the present invention are described below.

Structure Example

Structure examples of a display device of one embodiment of the present invention are described.

Structure Example of Display Device

FIG. 1A is a schematic top view of a display device 10. The display device 10 includes a pixel portion 11, a circuit 12, a circuit 13, a circuit 14, a terminal portion 15a, a terminal portion 15b, a plurality of wirings 16a, a plurality of wirings 16b, and a plurality of wirings 16c.

The pixel portion 11 includes a plurality of pixels and has a function of displaying images.

The circuits 12 and 13 each have a function of outputting signals for driving pixels of the pixel portion 11. For example, the circuits 12 and 13 can function as a gate driver circuit and a source driver circuit, respectively.

In the case where, for example, a large number of pixels are provided in the pixel portion 11, the circuit 13 may be omitted and an IC functioning as a source driver circuit may be mounted on the terminal portion 15a, or a flexible print circuit (FPC) including an IC may be connected to the terminal portion 15a. In the case where an IC is used, a circuit for dividing one signal into two or more wirings (e.g., a demultiplexer) is preferably used as the circuit 13 to further reduce the number of terminals of the IC and the FPC, and the definition of the display device 10 can be increased.

The circuit 14 is a circuit (also referred to as a monitor circuit) having a function of selectively outputting current flowing in display elements of pixels. The circuit 14 may have a function of supplying a predetermined potential to the display elements of the pixels. The potentials of signals supplied to the pixels are adjusted depending on the current output from the circuit 14 to each pixel, and variation in luminance of the pixels in the pixel portion 11 can be compensated. Particularly for the increase in resolution of the pixel portion 11, it is preferable to simplify pixel circuits in pixels to reduce the area occupied by the pixels and to compensate variation by a device or a circuit outside the display device 10 (such a method is referred to as an external compensation). Note that the circuit 14 can be omitted in the case where a pixel circuit has the compensation function (such a method is referred to as an internal compensation). The circuit 14 may have the compensation function.

The terminal portions 15a and 15b consist of a plurality of terminals, to which an FPC or an IC can be connected. Each terminal of the terminal portion 15a is electrically connected to the circuit 13 by the wirings 16a. Some of the terminals of the terminal portion 15b are electrically connected to the circuit 12 by the wirings 16b. Others of the terminals of the terminal portion 15b are electrically connected to the circuit 14 by the wirings 16c. Note that the display devices 10 in which an FPC or an IC is mounted and is not mounted can be referred to as a display module and a display panel, respectively.

Figure 1B:
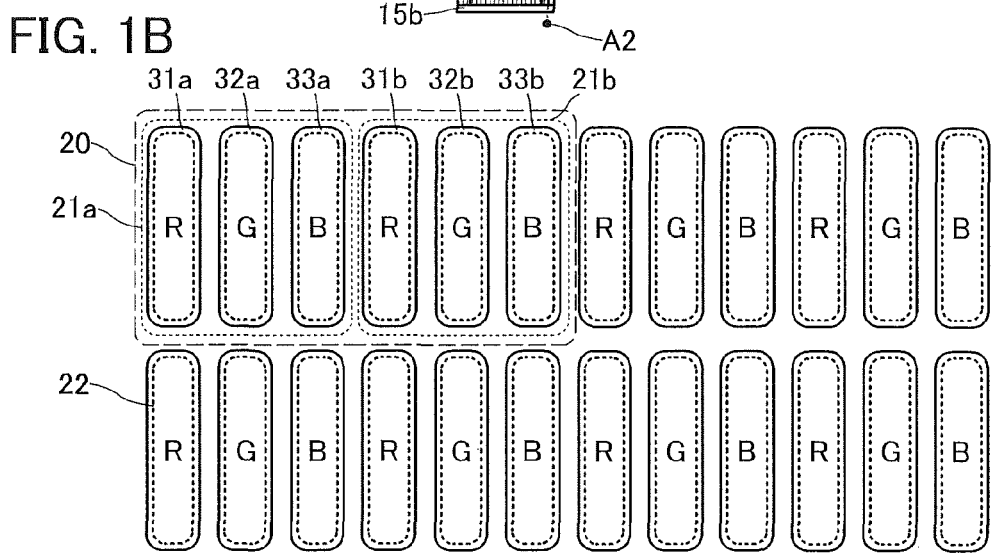

FIG. 1B is a schematic top view showing an arrangement example of pixel electrodes in the pixel portion 11. The pixel portion 11 includes a plurality of pixel units 20. There are four pixel units 20 in FIG. 1B. Each pixel unit 20 includes pixels 21a and 21b. The pixel 21a includes pixel electrodes 31a, 32a, and 33a. The pixel 21b includes pixel electrodes 31b, 32b, and 33b. Each pixel electrode serves as an electrode of a display element, which is described below. A display region 22 of each subpixel is inside its pixel electrode.

Six pixel electrodes included in each of the pixel units 20 are arranged at regular intervals. The pixel electrodes 31a, 32a, and 33a, which are electrodes of display elements, can emit different colors from each other. The pixel electrodes 31b, 32b, and 33b can emit the same color as the pixel electrodes 31a, 32a, and 33a, respectively. Although the three pixel electrodes with different colors are the same in size in the drawings, they may differ in size or the display regions 22 may differ in size between the pixel electrodes.

For simplicity, symbols R, G, and B for representing electrodes of display elements that emit red (R), green (G), and blue (B) are added to the pixel electrodes 31a, 32a, and 33a, respectively. Note that the pixel arrangements shown in FIG. 1B and the like are non-limiting examples.

Figure 1C:
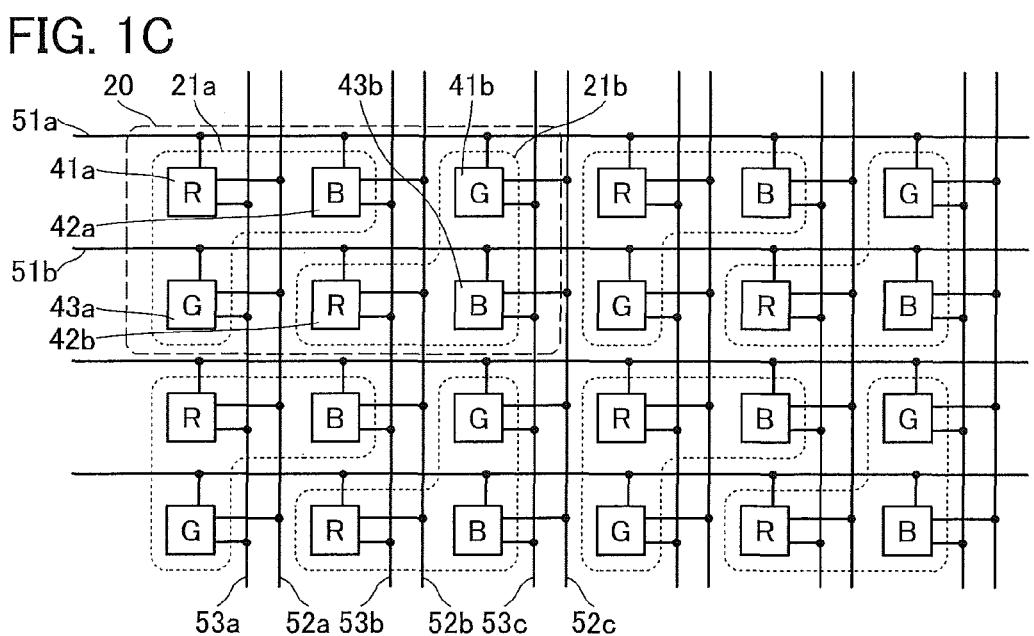

FIG. 1C is a circuit diagram showing an arrangement example of pixel circuits in the pixel portion 11. There are four pixel units 20 in FIG. 1C. The pixel 21a includes pixel circuits 41a, 42a, and 43a. The pixel 21b includes pixel circuits 41b, 42b, and 43b. In addition, the pixel portion 11 includes wirings 51a, 51b, 52a, 52b, 52c, 53a, 53b, and 53c and the like.

The wirings 51a and 51b are electrically connected to the circuit 12 and have a function as a gate line. The wirings 52a, 52b, and 52c are electrically connected to the circuit 13 and each have a function as a signal line (also referred to as a data line). The wirings 53a, 53b, and 53c each have a function of supplying a potential to display elements. Since the display device 10 includes the circuit 14, the wirings 53a, 53b, and 53c are electrically connected to the circuit 14.

The pixel circuit 41a is electrically connected to the wirings 51a, 52a, and 53a. The pixel circuit 42a is electrically connected to the wirings 51a, 52b, and 53b. The pixel circuit 43a is electrically connected to the wirings 51b, 52a, and 53a. The pixel circuit 41b is electrically connected to the wirings 51a, 52c, and 53c. The pixel circuit 42b is electrically connected to the wirings 51b, 52b, and 53b. The pixel circuit 43b is electrically connected to the wirings 51b, 52c, and 53c.

The pixel circuits 41a, 42a, 43a, 41b, 42b, and 43b are electrically connected to the pixel electrodes 31a, 32a, 33a, 31b, 32b, and 33b, respectively. In FIG. 1C, the symbols R, G, and B are put on the pixel circuits for simplicity of correspondence between the pixel circuits and pixel electrodes shown in FIG. 1B.

Figure 2:
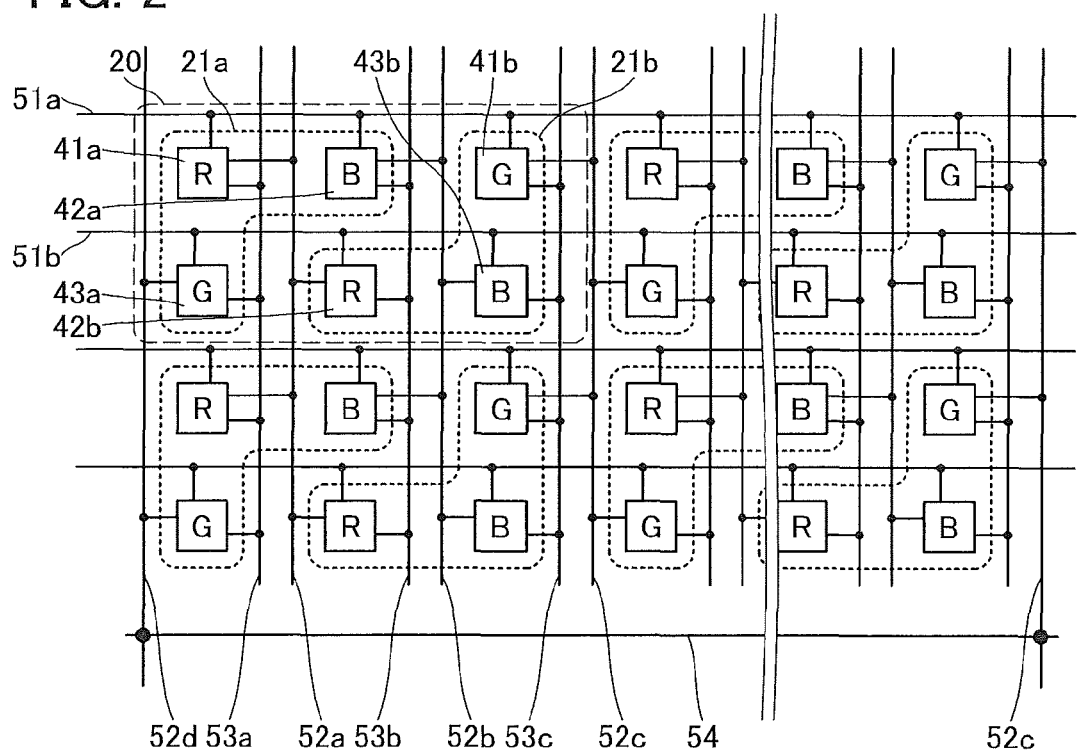
FIG. 2 illustrates a structure example of a display device of one embodiment.

Although three wirings 52a to 52c serving as signal lines are electrically connected to each pixel unit 20 in FIG. 1C, four wirings may be electrically connected to each pixel unit 20 as shown in FIG. 2.

In FIG. 2, a wiring 52d is electrically connected to the pixel circuit 43a, a wiring 52a is electrically connected to the pixel circuits 41a and 42b, a wiring 52b is electrically connected to the pixel circuit 42a and the pixel circuit 43b, and a wiring 52c is electrically connected to the pixel circuit 41b. Note that the wiring 52c is shared by adjacent pixel units and thus the wiring 52c in the pixel unit 20 corresponds to the wiring 52d in a pixel unit adjacent to the pixel unit 20.

Such a configuration in which a wiring functioning as a signal line is connected to pixel circuits of the same color is preferable. This is because compensation values may differ greatly between colors when a signal whose potential is adjusted to compensate variation in luminance between pixels is supplied to the wiring as described above. Thus, it makes compensation easy to connect pixel circuits with one signal line color by color.

In FIG. 2, the number of wirings serving as a signal line (e.g., the wiring 52a) is n+1 when n is the number of pixel circuits arranged in the row direction (the extending direction of the wirings 51a and 51b). Among the wirings serving as a signal line in the pixel portion 11, two wirings at both ends (i.e., the first wiring and the (n+1)-th wiring) are connected to the same-color pixel circuits. In this case, the two wirings at the both ends of the pixel portion 11 (i.e., the wiring 52d and the wiring 52c on the right end in FIG. 2) are electrically connected to each other by a wiring 54 which is outside the pixel portion 11. This is preferable because there is no need to increase the number of signals output from a circuit functioning as a signal line driver circuit.

Configuration Example of Pixel Circuit

Figure 3:
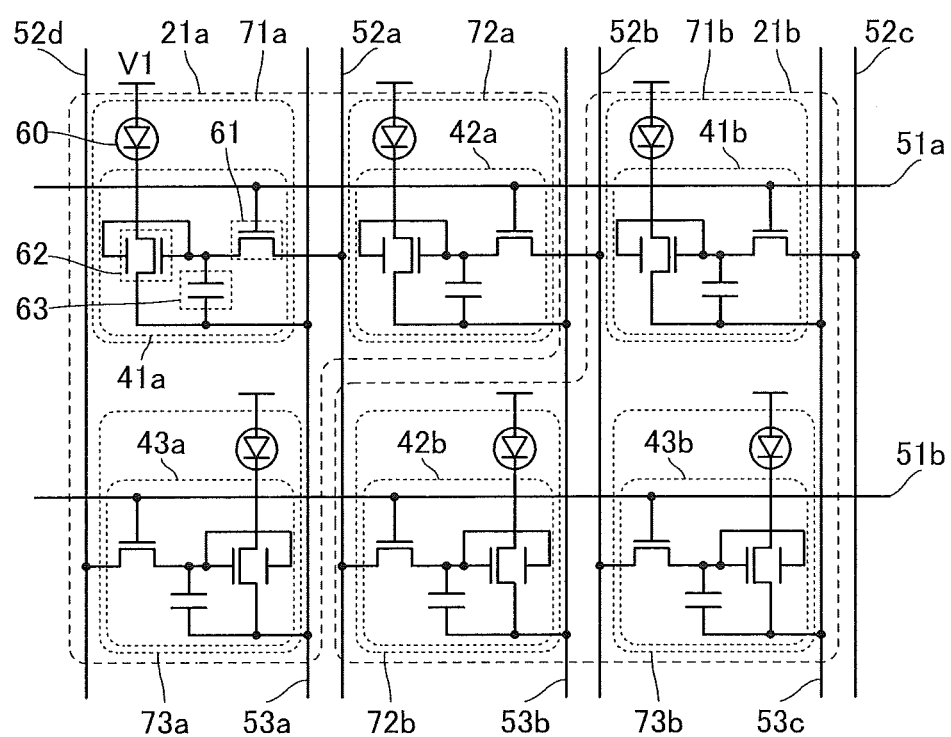
FIG. 3 illustrates a structure example of a display device of one embodiment.

A specific example of a pixel circuit included in the pixel unit 20 is described. FIG. 3 shows an example of a circuit diagram of the pixel unit 20 in which four wirings (the wiring 52a and the like) functioning as a signal line are connected to one pixel unit 20, which is shown in FIG. 2.

The pixel 21a includes subpixels 71a, 72a, and 73a. The pixel 21b includes subpixels 71b, 72b, and 73b. Each subpixel includes a pixel circuit and a display element 60. For example, the subpixel 71a includes a pixel circuit 41a and the display element 60. A light-emitting element such as an organic EL element is used here as the display element 60.

In addition, each pixel circuit includes a transistor 61, a transistor 62, and a capacitor 63. In the pixel circuit 41a, for example, a gate of the transistor 61 is electrically connected to the wiring 51a, one of a source and a drain of the transistor 61 is electrically connected to the wiring 52a, and the other of the source and the drain is electrically connected to a gate of the transistor 62 and one electrode of the capacitor 63. One of a source and a drain of the transistor 62 is electrically connected to one electrode of the display element 60, and the other of the source and the drain is electrically connected to the other electrode of the capacitor 63 and the wiring 53a. The other electrode of the display element 60 is electrically connected to a wiring to which a potential V1 is applied. Note that the other pixel circuits similar to the pixel circuit 41a except that where one of a source and a drain of the transistor 61 and the other electrode of the capacitor 63 are connected (see FIG. 3).

In FIG. 3, the transistor 61 has a function as a selection transistor. The transistor 62 is in a series connection with the display element 60 to control current flowing in the display element 60. The capacitor 63 has a function of holding a/the potential of a node connected to the gate of the transistor 62. Note that the capacitor 63 may be omitted in the case where off-state leakage current of the transistor 61, leakage current through the gate of the transistor 62, and the like are extremely small.

The transistor 62 preferably includes a first gate and a second gate electrically connected to each other as in FIG. 3. The amount of current the transistor 62 can supply can be increased owing to the two gates. It is particularly preferable for a high-resolution display device because the amount of current can be increased without increasing the size, the channel width in particular, of the transistor 62.

Figure 4A:
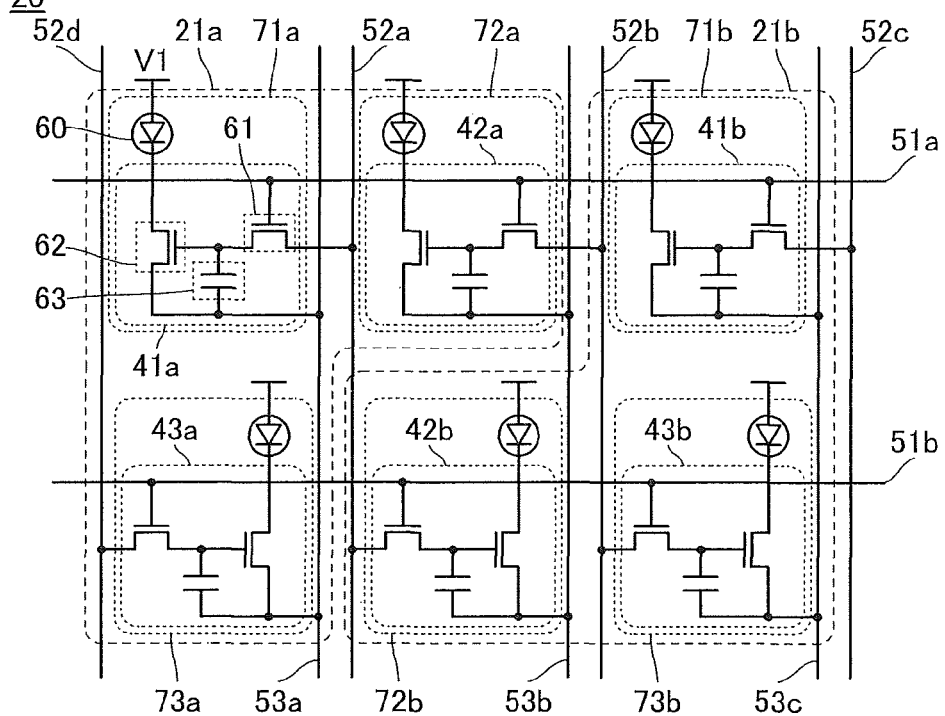
FIGS. 4A and 4B illustrate a structure example of a display device of one embodiment.

Note that the transistor 62 may have only one gate as in FIG. 4A, in which case a step of forming the second gate can be skipped and the process can be simpler than the above. In addition, the transistor 61 may have two gates as in FIG. 4B, in which case both of the transistors 61 and 62 can be reduced in size. In the configurations shown here, the first gate and the second gate of each transistor are electrically connected to each other, but one of them may be electrically connected to another wiring. In this case, threshold voltages of the transistors can be controlled by applying different potentials to the wirings.

Figure 4B:
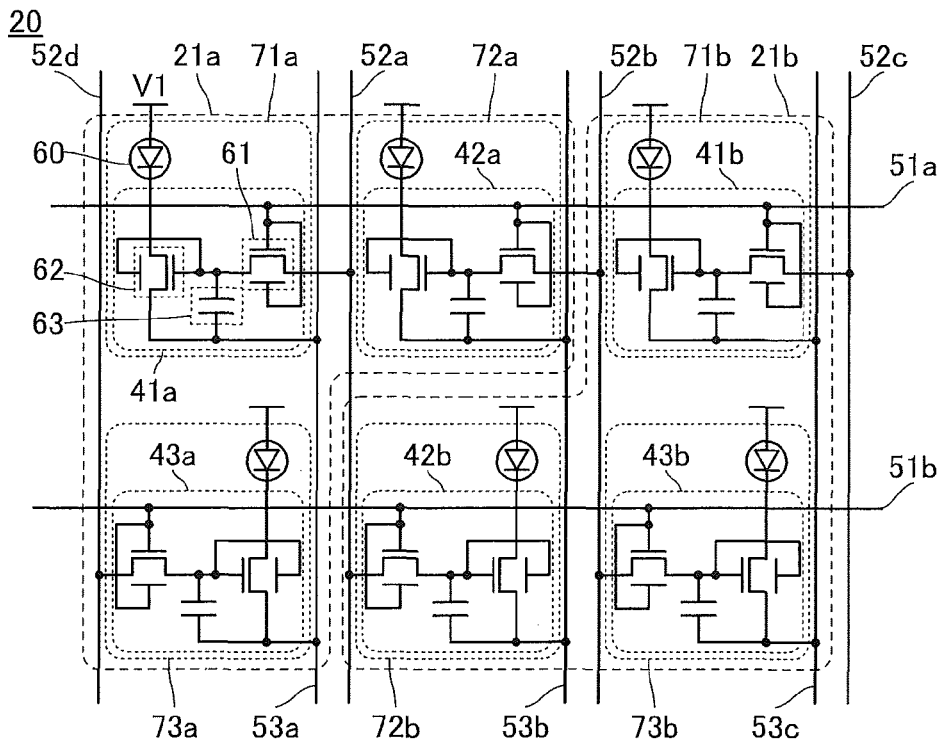

The electrode of the display element 60 which is electrically connected to the transistor 62 corresponds to a pixel electrode (e.g., a pixel electrode 31a). In FIG. 3 and FIGS. 4A and 4B, one electrode electrically connected to the transistor 62 of the display element 60 serves as a cathode and the other serves as an anode, and such a structure is particularly effective when the transistor 62 is an n-channel transistor. When the n-channel transistor 62 is on, the potential applied from the wiring 53a is a source potential, and the amount of current flowing in the transistor 62 can be constant with variation or change in resistance of the display element 60.

Figure 5A:
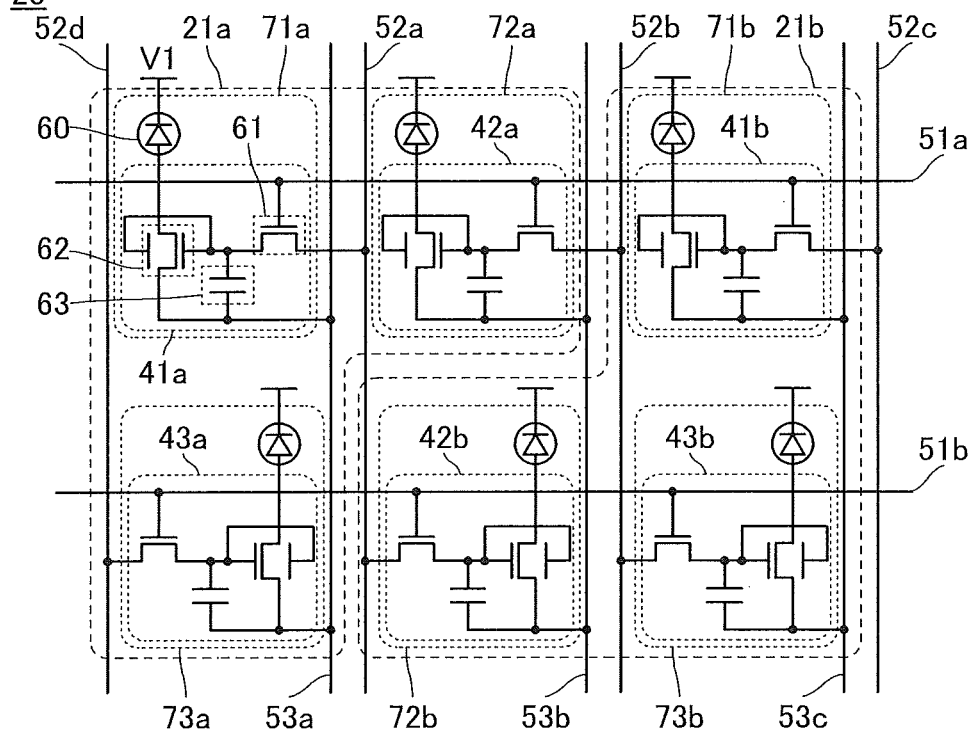
FIGS. 5A and 5B illustrate a structure example of a display device of one embodiment.

Another configuration example shown in FIG. 5A in which the electrode of the display element 60 on the transistor 62 side serves as an anode and the other serves as a cathode may be used. Such a structure allows to use a fixed potential lower than the potential applied to the wiring 53a and the like as the potential V1, which is applied to the other electrode of the display element 60. The use of a common potential or a ground potential as the potential V1 leads to a simpler circuit configuration, which is preferable.

Other than the configuration of FIG. 2, in which one pixel unit is connected to four wirings serving as a signal line, one pixel unit may be connected to three wirings serving as a signal line as in FIG. 1C. In this case, the pixel unit 20 has a configuration of FIG. 5B, for example.

Figure 5B:
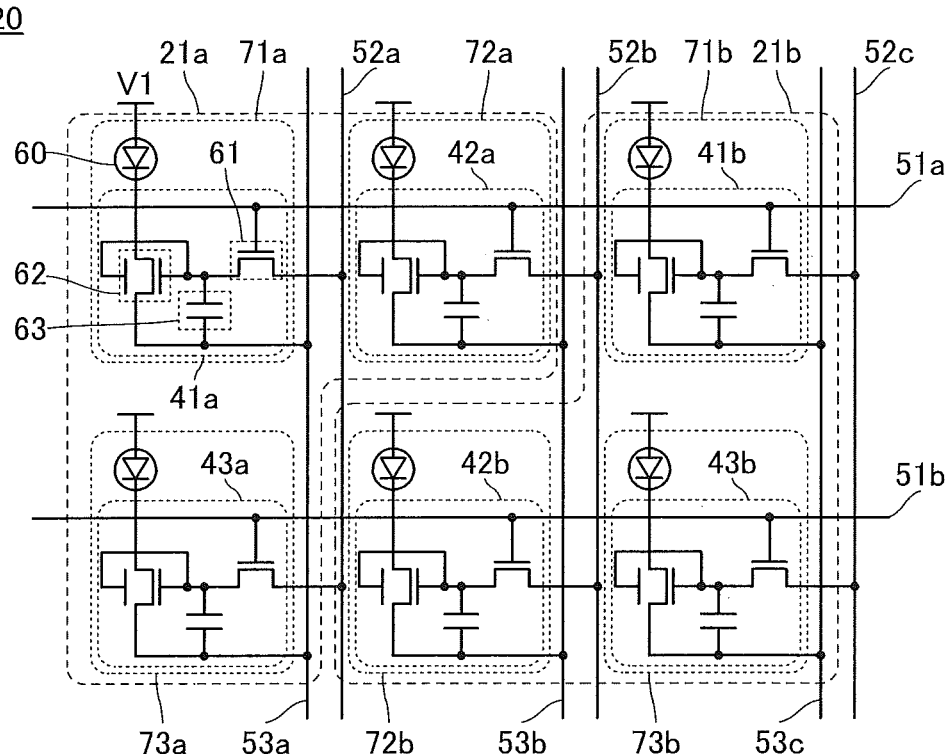
Figure 6A:
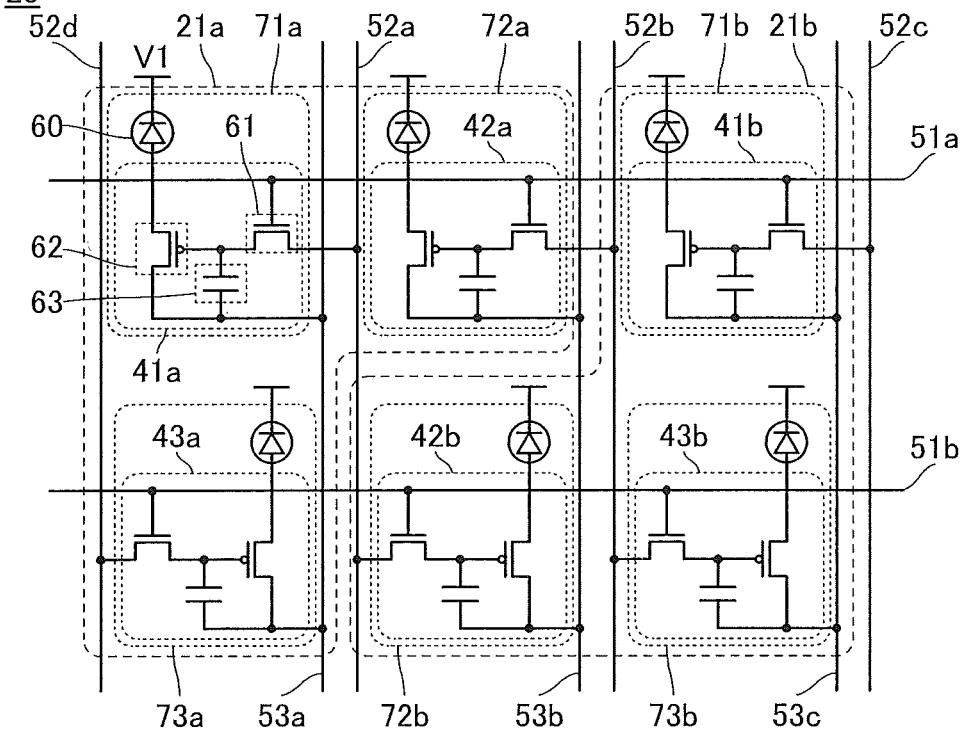
FIGS. 6A and 6B illustrate a structure example of a display device of one embodiment.
Figure 6B:
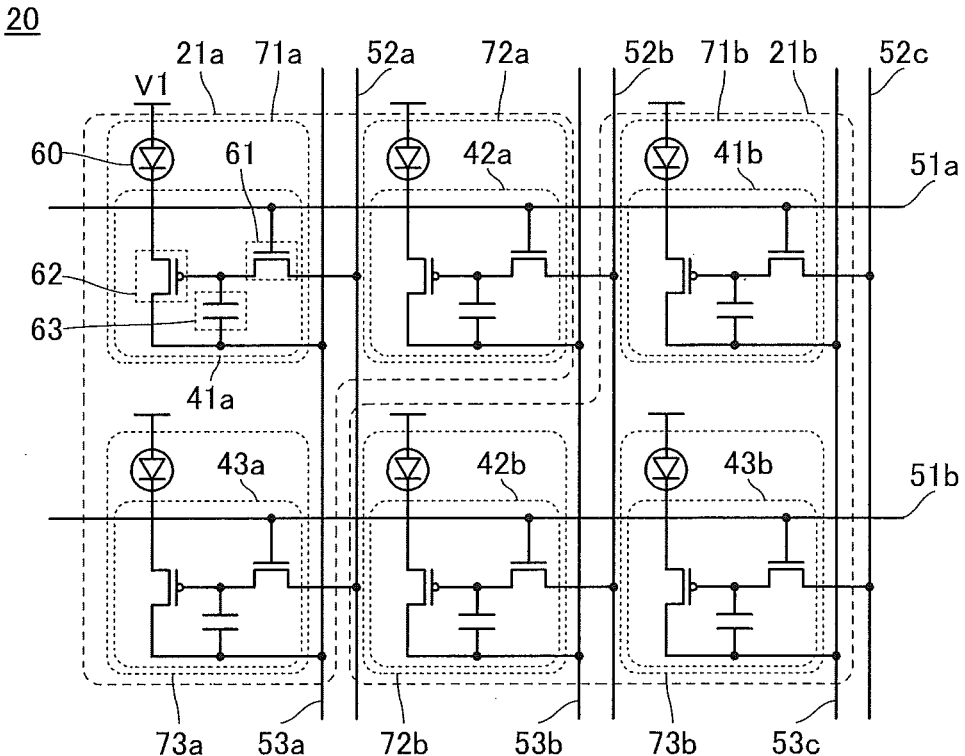

Alternatively, a p-channel transistor may be used as a transistor of a pixel circuit. FIGS. 6A and 6B show configuration examples in which the transistors 62 shown in FIGS. 5A and 5B are p-channel transistors.

Monitor Circuit

Figure 7A:
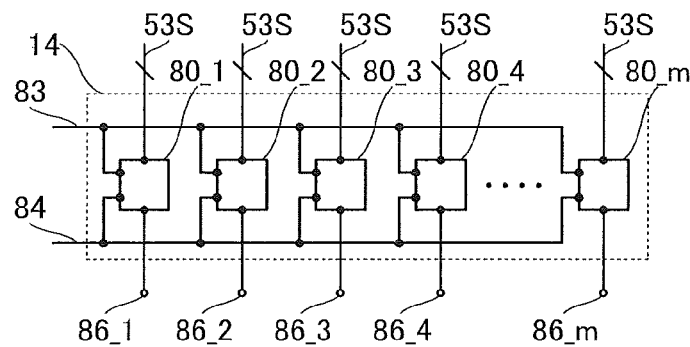
FIGS. 7A, 7B, and 7C are circuit diagrams of a display device of one embodiment.

Next, a structure example of the circuit 14 shown in FIG. 1A is described. FIG. 7A is a circuit diagram of the structure example of the circuit 14. The circuit 14 includes m (m is an integer greater than or equal to 1) circuits 80: circuits 80_1 to 80_m. A wiring 83, a wiring 84, and a plurality of wiring groups 53S are electrically connected to the circuit 14. The wiring group 53S includes wirings 53a, 53b, and 53c at least one or more each. The circuits 14 are electrically connected to m output terminals 86_1 to 86_m. The output terminals 86 are electrically connected to respective circuits 80 in the circuit 14.

Figure 7B:
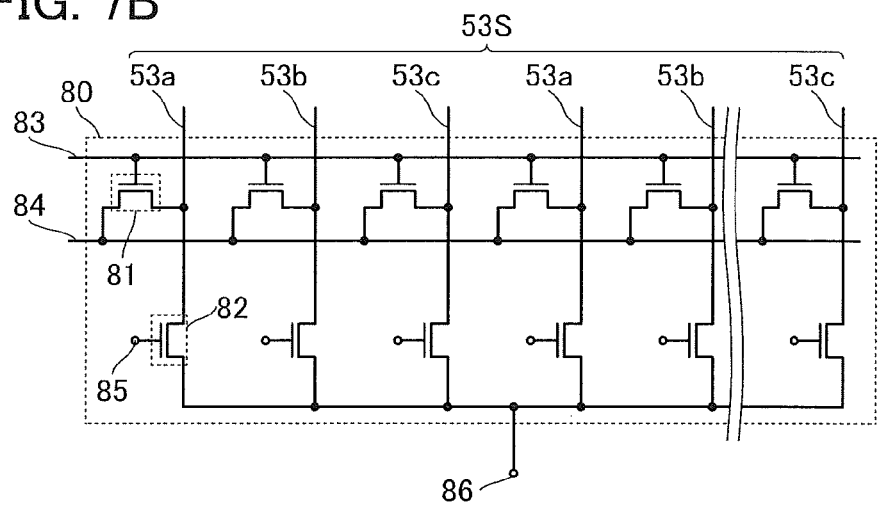

FIG. 7B illustrates a structure example of the circuit 80. Each circuit 80 includes a plurality of transistors 81 and a plurality of transistors 82. A gate of the transistor 81 is electrically connected to the wiring 83, one of a source and a drain of the transistor 81 is electrically connected to one of the wirings of the wiring group 53S, and the other of the source and the drain is electrically connected to the wiring 84. A gate of the transistor 82 is electrically connected to a terminal 85, one of a source and a drain of the transistor 82 is electrically connected to the one of the source and the drain of the transistor 81, and the other of the source and the drain is electrically connected to the output terminal 86.

A fixed potential, such as a potential higher than the potential V1 or a potential lower than the potential V1, can be applied to the wiring 84. A signal for controlling on/off of the transistor 81 can be applied to the wiring 83. In a period for displaying images in the pixel portion 11 (also referred to as a display period), the transistor 81 is turned on to supply the potential, that is applied to the wiring 84, to the wiring group 53S through the transistor 81.

A signal for controlling on/off of the transistor 82 can be applied to the terminal 85. A non-display period of the pixel portion 11 can include a monitor period in which current flowing in each subpixel is output to the outside. To output the current in this period, the plurality of transistors 81 are all turned off and one of the plurality of transistors 82 is turned on, and accordingly any one of the wirings of the wiring group 53S is electrically connected to the output terminal 86 through the transistor 82. Thus, the plurality of transistors 82 are sequentially selected to output current flowing through each wiring of the wiring group 53S by time division to the output terminal 86.

Figure 7C:
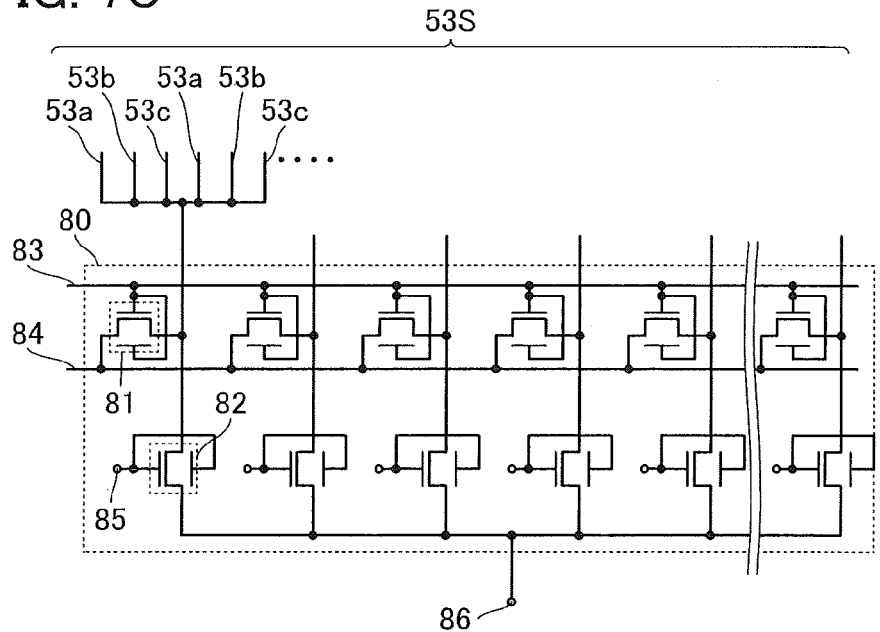

Although each transistor 82 shown in FIG. 7B is connected to one wiring (e.g., the wiring 53a), each transistor 82 is preferably connected to a plurality of adjacent wirings of the wiring group 53S as shown in FIG. 7C, in which case the sum of current which is output from the plurality of pixels is output to the output terminal 86 and accordingly the sensitivity of the display device can be increased. This structure makes compensation easier particularly in such a high-resolution display device in which the size of the display element 60 in each subpixel is small and the value of current from the display element 60 is also small. In addition, the number of output terminals 86 can be reduced thanks to the united wiring, and the circuit configuration can be simplified.

For example, in the circuit configurations illustrated in FIG. 3, FIGS. 4A and 4B, and FIGS. 5A and 5B, the wirings 53a, 53b, and 53c can transmit current flowing in the display element 60 and the transistor 62 to the output terminal 86.

Operation in a monitor period is explained with reference to FIG. 3. Current output from the subpixel 71a is described as an example. First, a potential is applied to the wiring 51a to turn the transistor 61 on, and a predetermined potential is applied to the wiring 52a and a gate of the transistor 62 through the transistor 61. A potential is applied to other wirings (e.g., the wirings 51b) serving as a gate line to turn transistors 61 off. A potential is applied to other wirings (e.g., the wirings 52b) serving as a signal line to turn transistors 62 off. This operation enables current flowing through the display element 60 and the transistor 62 in the subpixel 71a to be output to the wiring 53a.

Note that in the case where a plurality of adjacent wirings of the wiring group 53S is combined into one as shown in FIG. 7C, current flows at the same time through the display elements 60 of a plurality of subpixels in the monitor period. Also at this time, it is preferable that current be output at the same time only from the same-color subpixels in each period.

FIG. 7C shows a structure in which the transistors 81 and 82 each include two gates electrically connected to each other. Such a structure is preferable particularly in the case where a plurality of wirings (e.g., the wiring 53a) is connected to the transistors 81 and 82 because large current needs to flow.

Another structure example of a pixel including the circuit 14 serving as a monitor circuit will be shown.

Figure 8A:
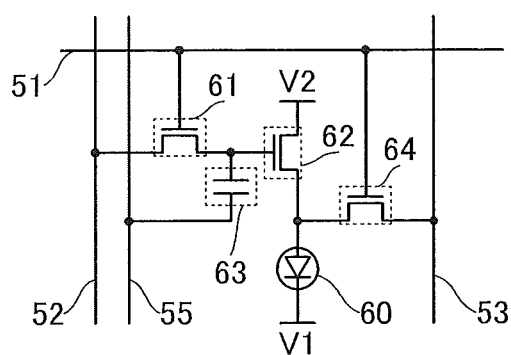
FIGS. 8A, 8B, 8C, and 8D are circuit diagrams of a display device of one embodiment.

A subpixel shown in FIG. 8A includes the transistors 61 and 62, the capacitor 63, and a transistor 64. The subpixel is electrically connected to wirings 51, 52, 53, and 55. The wirings 51 and 52 serve as a gate line and a signal line, respectively. The wiring 53 is electrically connected to the circuit 14. The wiring 55 can supply a predetermined potential or signal.

A gate of the transistor 61 in FIG. 8A is electrically connected to the wiring 51. One of a source and a drain thereof is electrically connected to the wiring 52, and the other thereof is electrically connected to one electrode of the capacitor 63 and a gate of the transistor 62. One of a source and a drain of the transistor 62 is electrically connected to a wiring having a function of supplying a potential V2, and the other thereof is electrically connected to one electrode of the display element 60 and one of a source and a drain of the transistor 64. The other electrode of the capacitor 63 is electrically connected to the wiring 55. A gate of the transistor 64 is electrically connected to the wiring 51, and the other of the source and the drain thereof is electrically connected to the wiring 53. The other electrode of the display element 60 is electrically connected to a wiring having a function of supplying the potential V1.

The potential V1 is lower than the potential V2 in the configuration of FIG. 8A. Note that in the case where an anode and a cathode of the display element 60 are interchanged, the potentials are also interchanged.

With the configuration of FIG. 8A, a predetermined potential is applied to the gate of the transistor 62 to output current flowing in the transistor 62 to the wiring 53 through the transistor 64. For example, the potential of the wiring 51 is set to turn the transistors 61 and 64 on and the potential of the wiring 52 can be used as a potential supplied to the gate of the transistor 62.

The gates of the transistors 61 and 64 are electrically connected to the same wiring, the wiring 51 in FIG. 8A; however, they may be electrically connected to different wirings. For example, a wiring 57 is provided to electrically connect with the gate of the transistor 64 in FIG. 8B. In this preferable case, the transistor 64 can remain off during a display period and generation of unintended current in the wiring 53 is thus avoided.

Figure 8B:
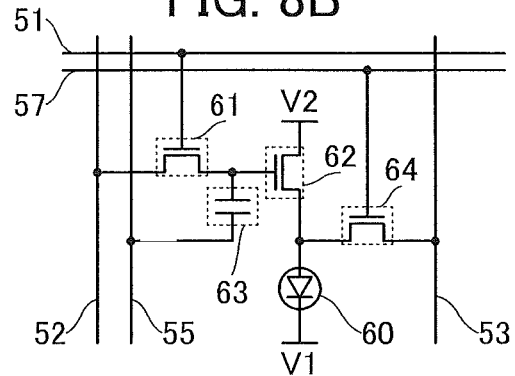
Figure 8C:
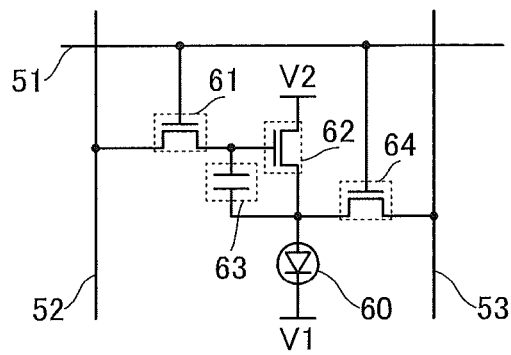

FIG. 8C is different from FIGS. 8A and 8B mainly in that the wiring 55 is not provided. In FIG. 8C, the other electrode of the capacitor 63 is electrically connected to the other of the source and the drain of the transistor 62, one electrode of the display element 60, and one of the source and the drain of the transistor 64. Such a structure can reduce the number of wirings and leads to a high-resolution display device.

Figure 8D:
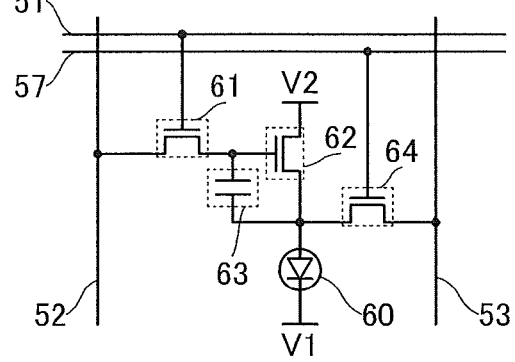

FIG. 8D shows a configuration in which the gates of the transistors 61 and 64 are electrically connected to different wirings, which is similar to the configuration in FIG. 8B.

As already shown, at least one or all of the transistors may have two gates electrically connected to each other, although each transistor has one gate in FIGS. 8A to 8D. One of the two gates may be electrically connected to a wiring for supplying a predetermined potential to control threshold voltage of the transistor.

Figure 9A:
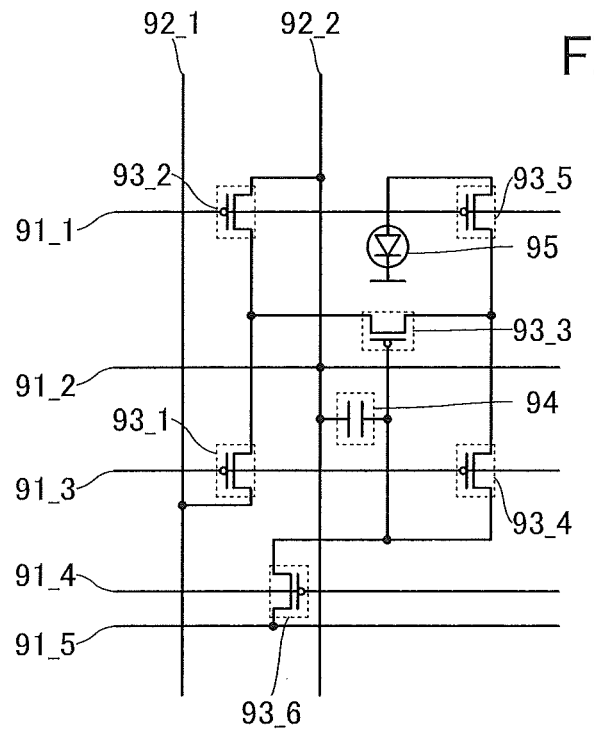
FIGS. 9A and 9B are circuit diagrams of a display device of one embodiment.

Alternatively, a pixel circuit can have a function of compensating variation in threshold voltages of a transistor. FIG. 9A is an example of a subpixel including six transistors 93_1 to 93_6, a capacitor 94, and a display element 95. The subpixel is electrically connected to wirings 91_1 to 91_5 and wirings 92_1 and 92_2.

Figure 9B:
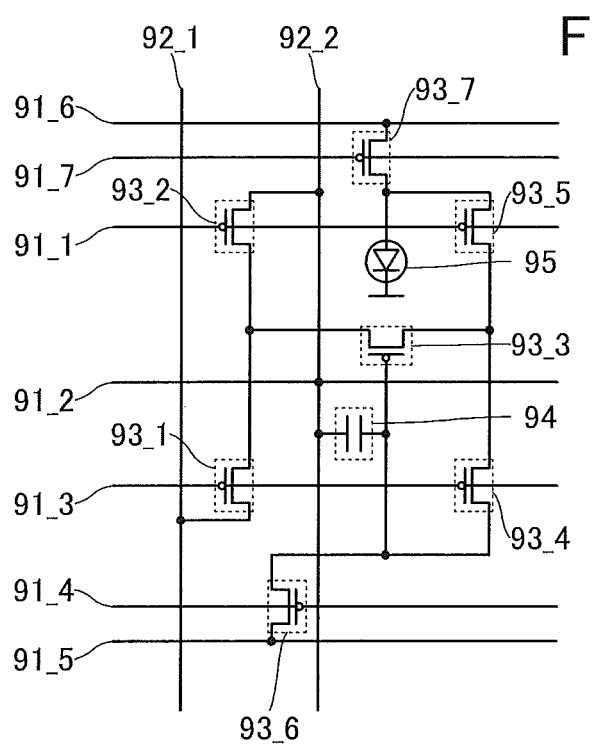

FIG. 9B is an example in which a transistor 93_7 is added to the subpixel shown in FIG. 9A. The subpixel shown in FIG. 9B is electrically connected to wirings 91_6 and 91_7. The wirings 91_5 and 91_6 may be electrically connected to each other.

Figure 10:
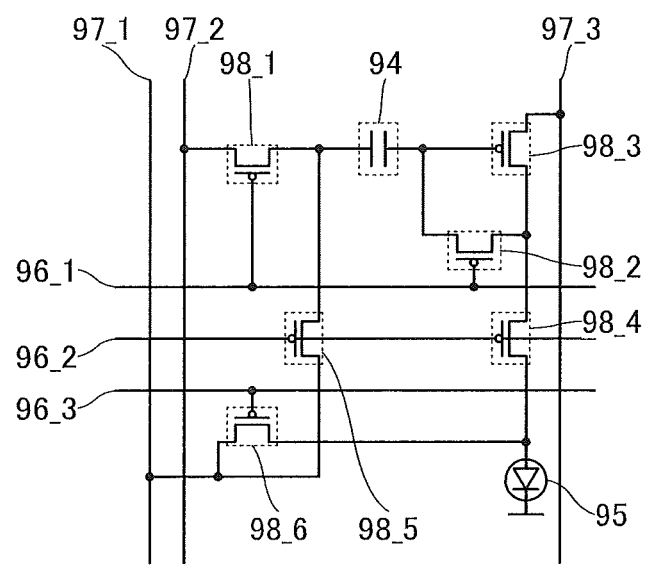
FIG. 10 is a circuit diagram of a display device of one embodiment.

A subpixel shown in FIG. 10 includes six transistors 98_1 to 98_6, a capacitor 94, and a display element 95 and is electrically connected to wirings 96_1 to 96_3 and wirings 97_1 to 97_3. The wirings 96_1 and 96_3 may be electrically connected to each other.

Arrangement Example of Pixel Electrode

Next, relative positional relationships between pixel electrodes and wirings are explained.

Figure 11A:
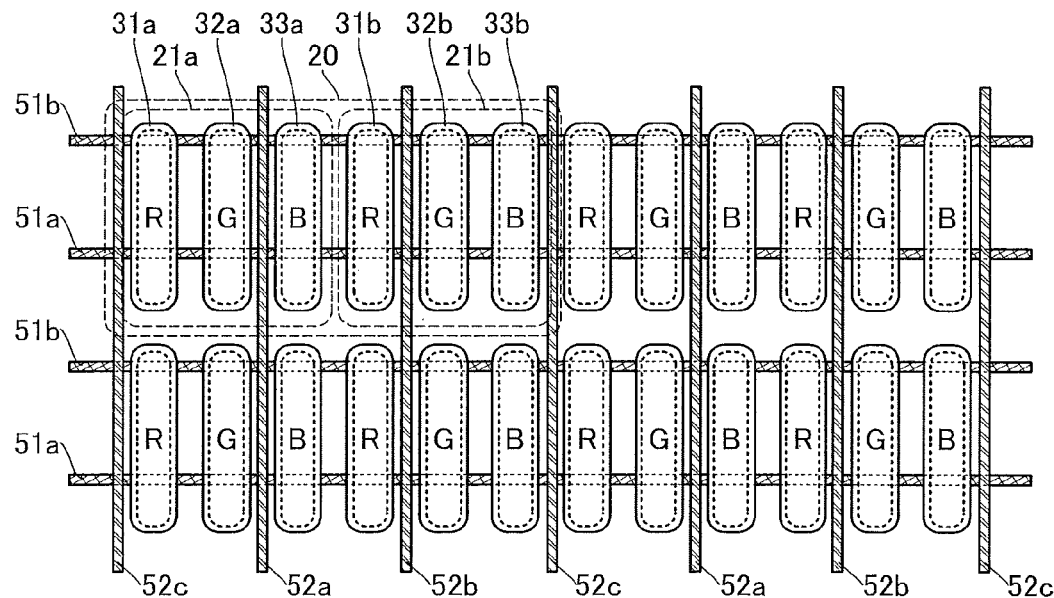
FIGS. 11A and 11B illustrate a structure example of a display device of one embodiment.

FIG. 11A is a schematic top view showing an arrangement example of pixel electrodes and wirings in the pixel portion 11. The wirings 51a and 52b are alternately arranged. The wirings 52a, 52b, and 52c are arranged in this order to intersect with the wirings 51a and 51b. The pixel electrodes are arranged in the extending direction of the wirings 51a and 51b.

In the pixel unit 20, the pixel electrodes 31a and 32a are provided between the wirings 52c and 52a; the pixel electrodes 33a and 31b are provided between the wirings 52a and 52b; and the pixel electrode 32b and 33b are provided between the wirings 52b and 52c. Although the pixel electrodes shown in FIG. 11A do not overlap with their next-to-wirings, part of the pixel electrode may overlap with the wiring.

In addition, each pixel electrode in the pixel unit 20 overlaps with both the wirings 51a and 51b serving as a pair of gate lines, in which case the area of the pixel electrode can be increased and the aperture ratio of the pixel portion can thus be increased.

Figure 11B:
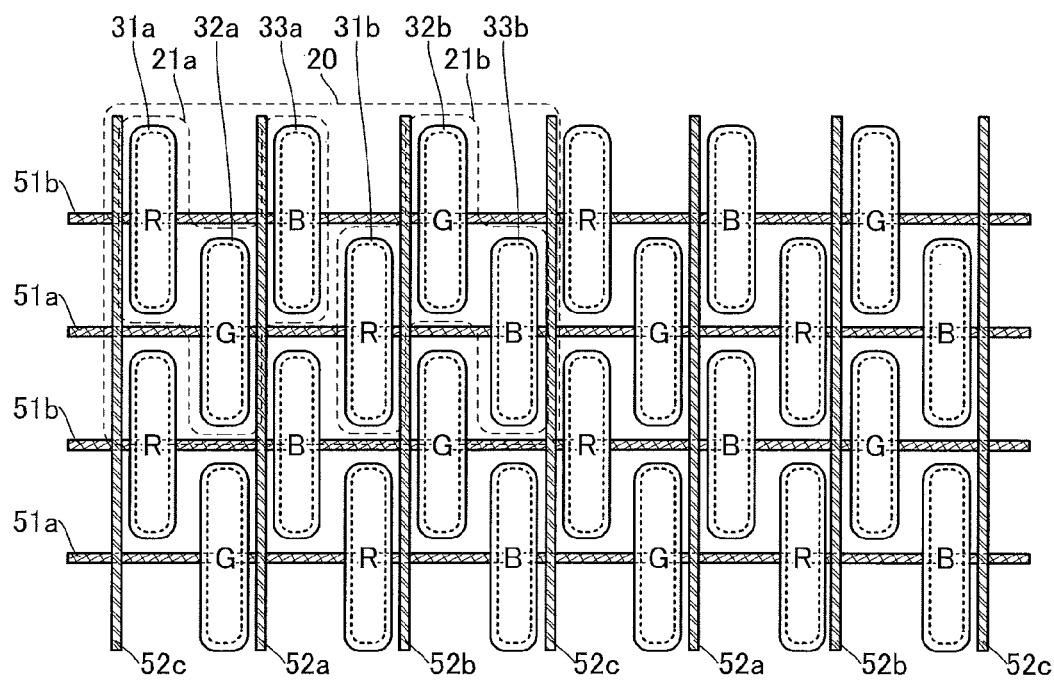

Arrangement shown in FIG. 11B is preferable; two pixel electrodes between a pair of wirings serving as signal lines (e.g., the wirings 52a and 52b) are shifted from each other in the extending direction of the wirings. That is, six pixel electrodes included in each pixel unit 20 are alternately arranged in the extending direction of the wiring serving as a gate line.

Figure 12A:
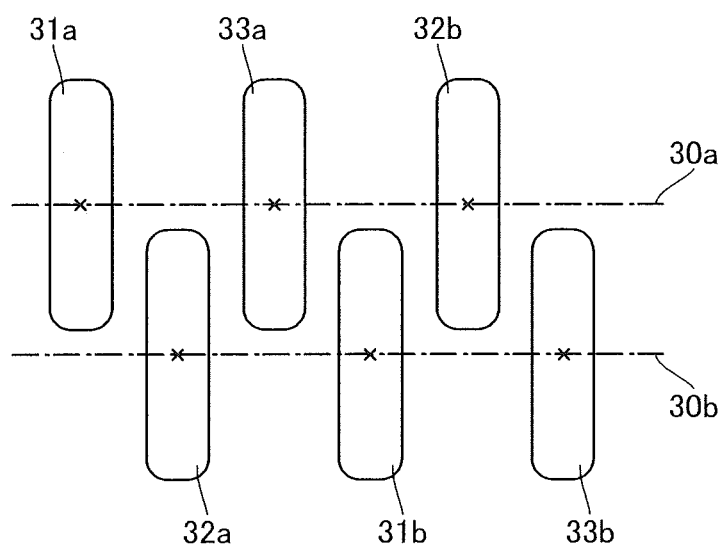
FIGS. 12A and 12B illustrate a structure example of a display device of one embodiment.

FIG. 12A shows a positional relationship between the six pixel electrodes in each pixel unit 20. The mark in each pixel electrode in FIG. 12A denotes a centroid in the plane view, which means a geometric centroid of the outline of the electrode in the plane view (i.e., a two-dimensional view of the electrode).

Arrangement shown in FIG. 12A is preferable; a line connecting the centroid of two pixel electrodes at both ends among three adjacent pixel electrodes in the extending direction of a wiring serving as a gate line does not overlap with the centroid of a pixel electrode between the two pixel electrodes. For example, a straight line 30a connecting the centroid of the pixel electrode 31a with that of the pixel electrode 33a does not overlap with the centroid of the pixel electrode 32a which is provided therebetween.

It is preferable that among six pixel electrodes of each pixel unit 20, each centroid of three pixel electrodes be on a first straight line, and each centroid of the other three pixel electrodes be on a second straight line, and that the first straight line and the second straight line be parallel to and do not overlap with each other. For example, the straight line 30a connecting each centroid of the pixel electrodes 31a, 33a, and 32b is parallel to and does not overlap with a straight line 30b connecting each centroid of the pixel electrodes 32a, 31b, and 33b.

Figure 12B:
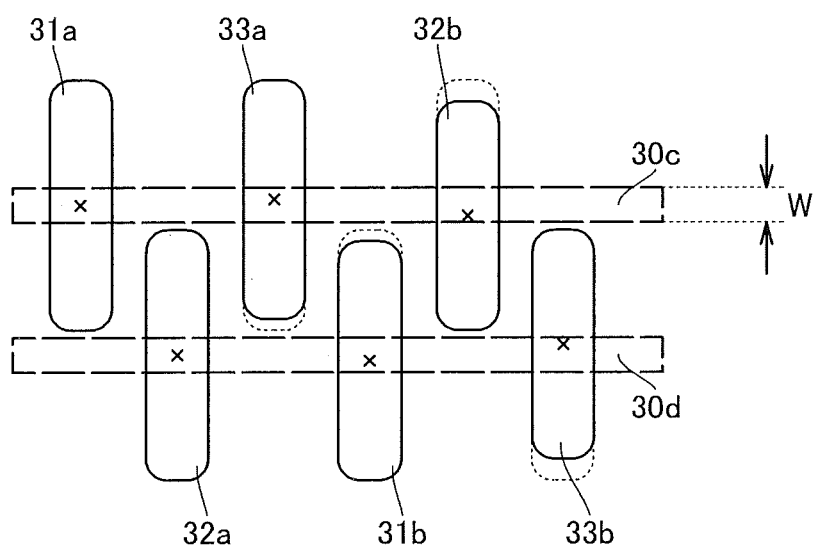

Note that a line connecting centroids of three or more pixel electrodes is not straight in practice in the case where there is a variation in shapes of the pixel electrodes or in the case where the shapes of the pixel electrodes differ depending on the emission color of pixels. In such cases, it can be regarded that the centroids of three or more pixel electrodes are on a straight line as long as they lie within a band-like rectangle which is horizontally long in the extending direction of a wiring serving as a gate line. FIG. 12B shows the case where each centroid of the pixel electrodes lie within a band-like rectangle 30c or 30d. In this case, the short-side width W of the band-like rectangle can be less than or equal to 1/10 of the pixel pitch, preferably less than or equal to 1/20 of the pixel pitch.

It is preferable here that one pixel electrode be provided so as not to overlap with more than two wirings serving as a gate line as shown in FIG. 11B. When the potential of the wiring serving as a gate line is changed, the potential of a pixel electrode overlapping with the wiring is also changed to change voltage applied to a display element in some cases. In addition, if one pixel electrode does not overlap any wiring serving as a gate line, the aperture ratio of the pixel might be decreased. For these reasons, the structure in which one electrode overlaps with one wiring serving as a gate line can reduce the influence of change in potentials of a pixel electrode and also maintain high aperture ratio.

One pixel includes two gate lines serving as a gate line in one embodiment of the present invention; thus it is particularly preferable that adjacent pixel electrodes be shifted to each other and one pixel electrode overlap with a wiring serving as a gate line and connected to a pixel or a wiring serving as a gate line and connected to the adjacent pixel of the pixel electrode as shown in FIG. 11B. In addition, it is preferable that a wiring overlapping with a pixel electrode of one subpixel be a gate line in the previous row in the scanning direction of gate lines. In which case, if the potential of the pixel electrode is changed by a signal applied to the gate line in the previous row and voltage applied to a display element is accordingly changed, data can be rewritten immediately after the change; thus, the influence on display can be reduced.

Note that in the case where a pixel electrode needs to be provided to overlap with two gate lines, the overlap area of the pixel electrode and one of the gate lines is smaller than the overlap area of the pixel electrode and the other of the gate lines. Particularly when the percentage of the overlap area of the pixel electrode and each gate line is less than 3%, change in the potential of the gate line has little influence on the potential of the pixel electrode, and thus it can be regarded that they do not overlap with each other.

Figure 13A:
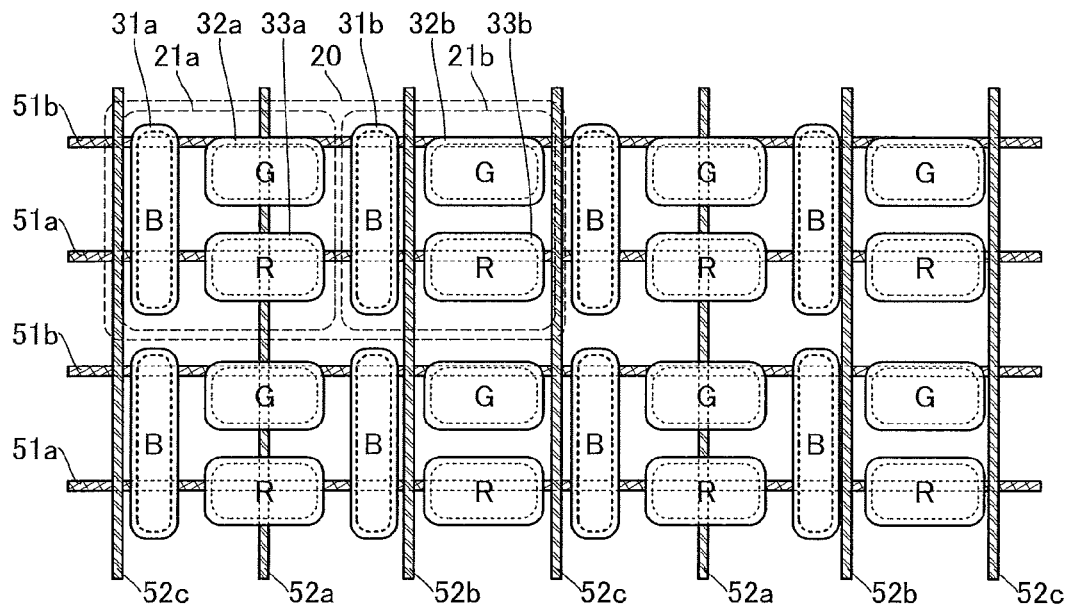
FIGS. 13A and 13B illustrate a structure example of a display device of one embodiment.

FIG. 13A shows an arrangement example of the pixel electrodes, which is different from FIGS. 11A and 11B. In the pixel 21a, the pixel electrodes 32a and 33a are alternately arranged in the extending direction of a wiring serving as a gate line (e.g., the wiring 51a). In addition, the pixel electrode 31a is provided next to both of the pixel electrodes 32a and 33a.

Figure 13B:
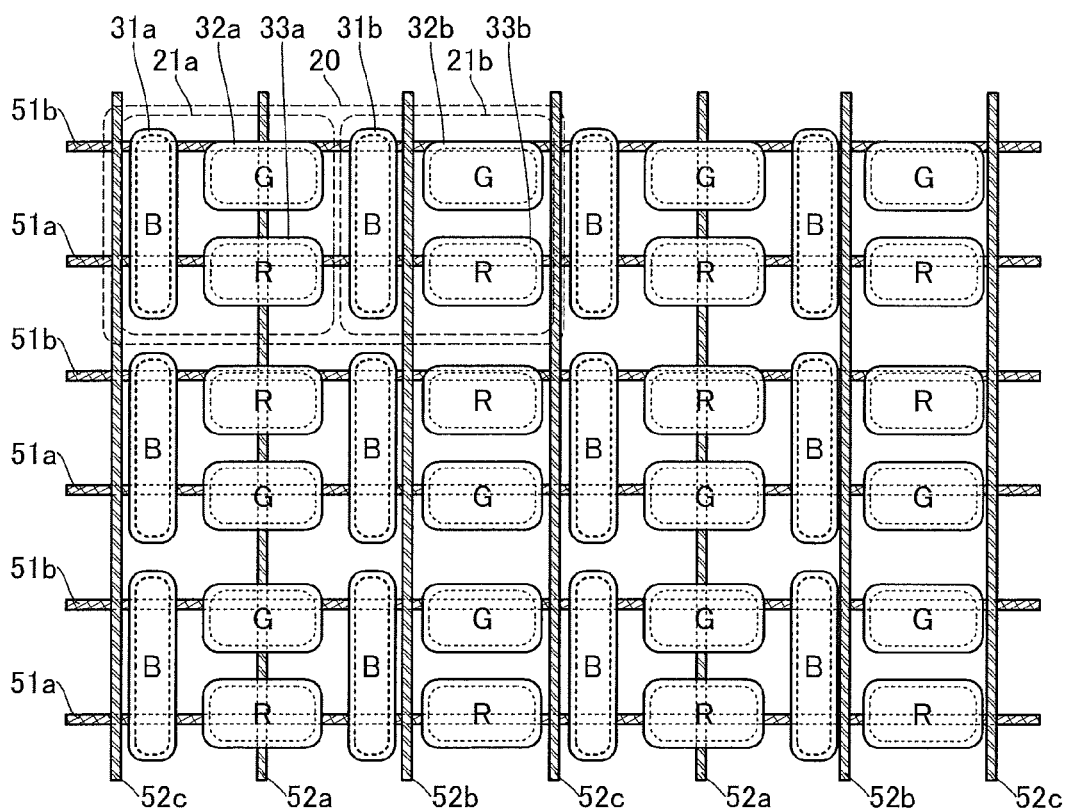

FIG. 13B shows an example in which the pixel electrodes 32a and 33a in one pixel and those in a pixel adjacent to the pixel in the extending direction of a wiring serving as a signal line (e.g., the wiring 52a) are provided in reversed positions. That is, in two adjacent pixels, the pixel electrodes 32a or the pixel electrodes 33a are adjacent to each other.

For easy understanding, the symbols R, G, and B are put on the pixel electrodes and the pixel circuits in the non-limiting examples; however, they can be interchanged with one another.

[Example of Pixel Layout]

A layout example of the pixel unit 20 will be described.

Figure 14A:
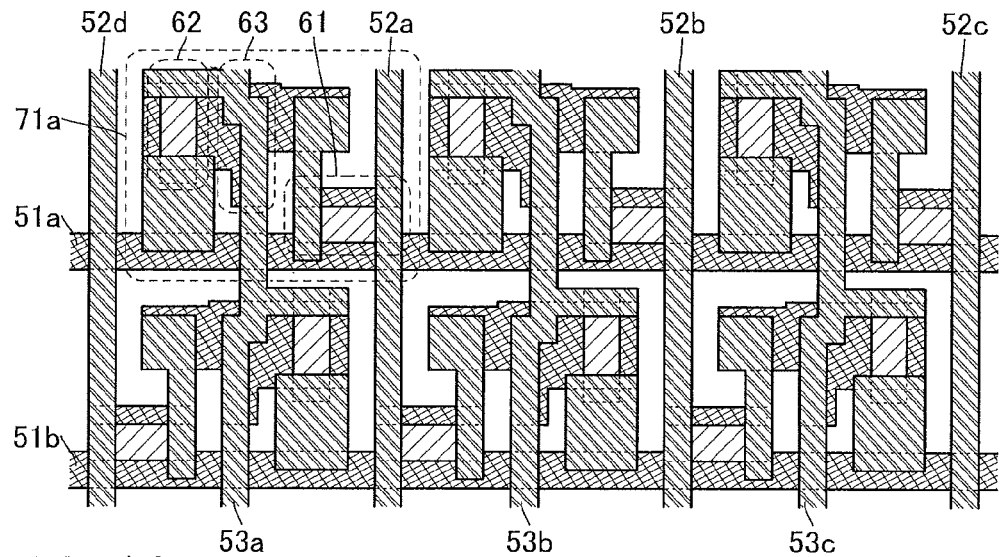
FIGS. 14A and 14B illustrate a structure example of a display device of one embodiment.
Figure 14B:
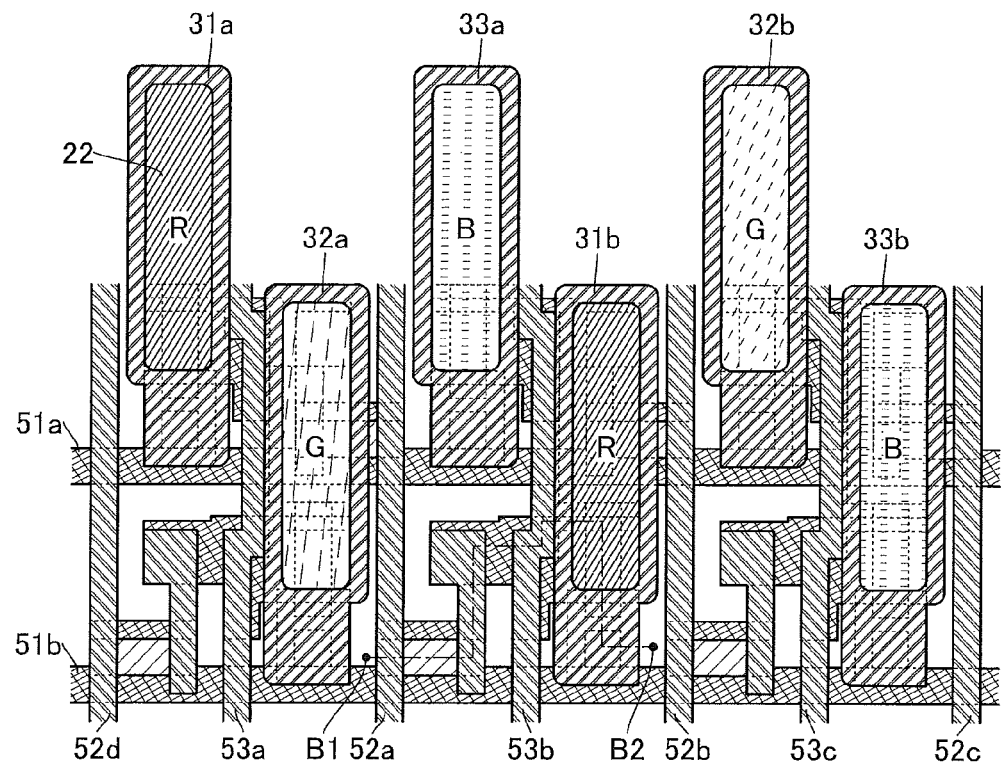

FIGS. 14A and 14B each show a layout example of the pixel unit 20 which is shown in FIG. 4A. In FIG. 14A, structures in a layer below the pixel electrode 31a and the like are shown. In FIG. 14B, the pixel electrode 31a and the like are added to the structures in FIG. 14A. Note that pixel electrodes and the like of a pixel unit adjacent to the pixel unit 20 are not clearly illustrated for simplicity.

In FIG. 14A, the wirings 51a, 51b, and the like are formed using a first conductive film, and the wirings 52a and the like are formed using a second conductive film over the first conductive film.

In the subpixel 71a, the transistor 61 includes a semiconductor layer over the wiring 51a, part of the wiring 52a, and the like. The transistor 62 includes a conductive layer formed of the first conductive film, a semiconductor layer over the conductive layer, the wiring 53a, and the like. The capacitor 63 includes part of the wiring 53a and the conductive layer formed of the first conductive film.

Each pixel electrode in FIG. 14B overlaps with part of a subpixel adjacent to the pixel electrode in the extending direction of the wiring 52a and the like. For example, the pixel electrode 32a overlaps with part of the transistor 61 and the capacitor 63 which are included in the subpixel 71a, a wiring and an electrode which form the subpixel 71a, and the like. Such a structure is effective particularly in a top-emission light-emitting element. The provision of a circuit below a pixel electrode leads to high aperture ratio even when the area occupied by a pixel is reduced.

In addition, the structure shown in FIG. 14B is preferable in that each pixel electrode does not overlap with a wiring serving as a signal line, such as the wiring 52a, in which case the effect of potential change of the signal line on the potential of the pixel electrode can be suppressed. Note that in the case where a pixel electrode needs to overlap with a signal line, the percentage of their overlapping area on the area of a pixel electrode is 10% or less, preferably 5% or less.

In the case where a pixel electrode overlaps with a semiconductor layer of a transistor of a subpixel adjacent to the pixel electrode, the threshold voltage of the transistor might be changed with the potential change of the pixel electrode. In FIG. 14B, for example, the pixel electrode 32a overlaps with a semiconductor layer of the transistor 61 which functions as a selection transistor of the subpixel 71a. It is preferable here that a pixel electrode overlap with a selection transistor of a subpixel in the previous row in the scan direction. With this structure, if the potential of the pixel electrode is changed when the appropriate subpixel is selected, a subpixel overlapping with and adjacent to the selected one is not selected and accordingly a selection transistor of the subpixel adjacent to the selected one remains off. The potential can thus be applied to a gate line of the subpixel adjacent to the selected one so that the selection transistor of the subpixel can be turned off without fail, and driving operation can be performed with no problem despite some change in the threshold voltage.

Figure 15A:
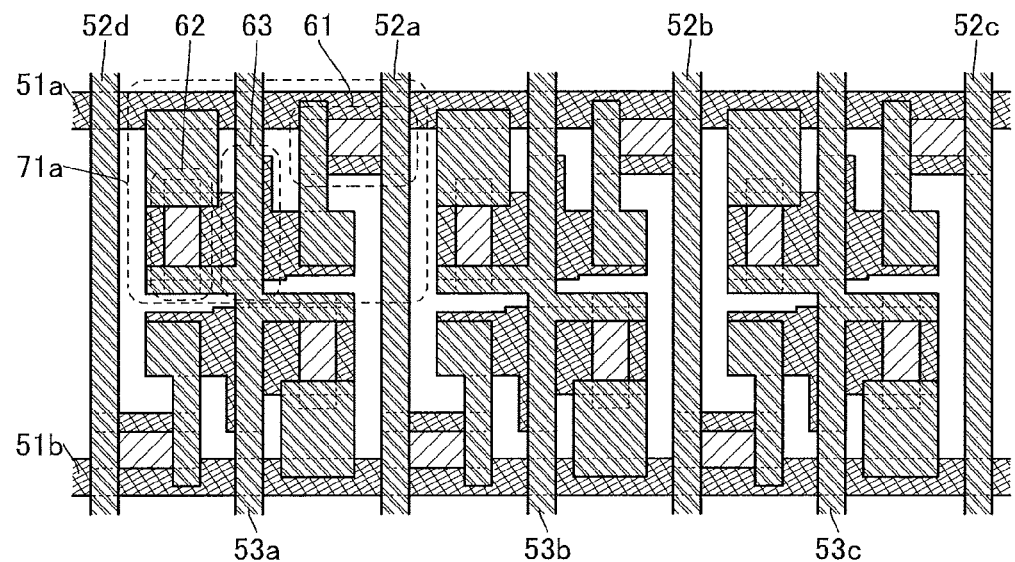
FIGS. 15A and 15B illustrate a structure example of a display device of one embodiment.
Figure 15B:
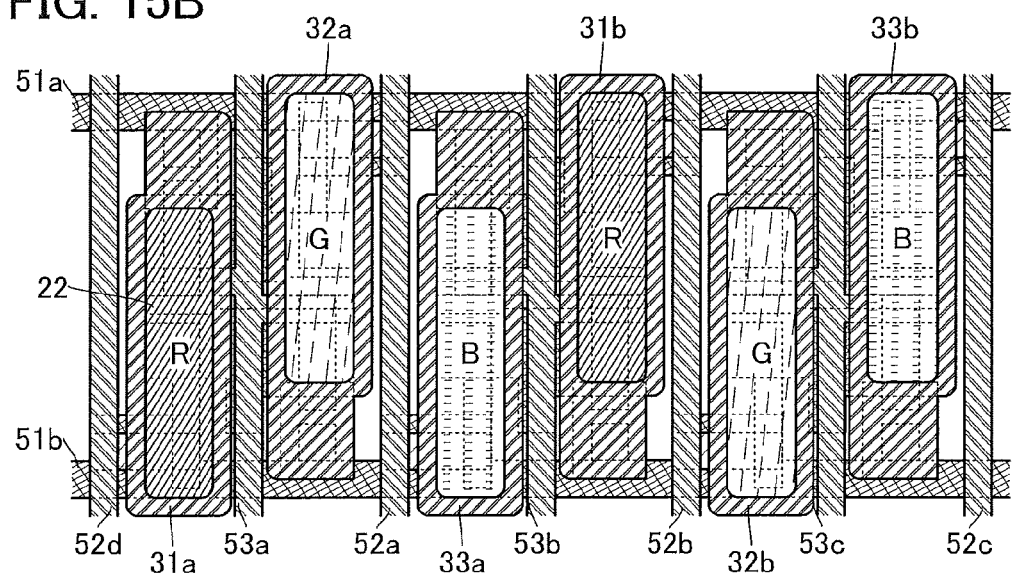

FIGS. 15A and 15B show an arrangement example in which the display region 22 of each subpixel in a pixel unit is provided between a pair of wirings serving as gate lines (i.e., the wirings 51a and 51b). Such an arrangement can reduce misalignment of two display regions 22 adjacent to each other in the extending direction of a wiring serving as a signal line (e.g., the wiring 52a). The wirings 51a and 52b are placed at irregular intervals in this non-limiting example.

That is the description of the structure examples of the display device.

Cross-Sectional Structure Example

A cross-sectional example of the display device 10 will be shown.

Cross-Sectional Structure Example 1

Figure 16:
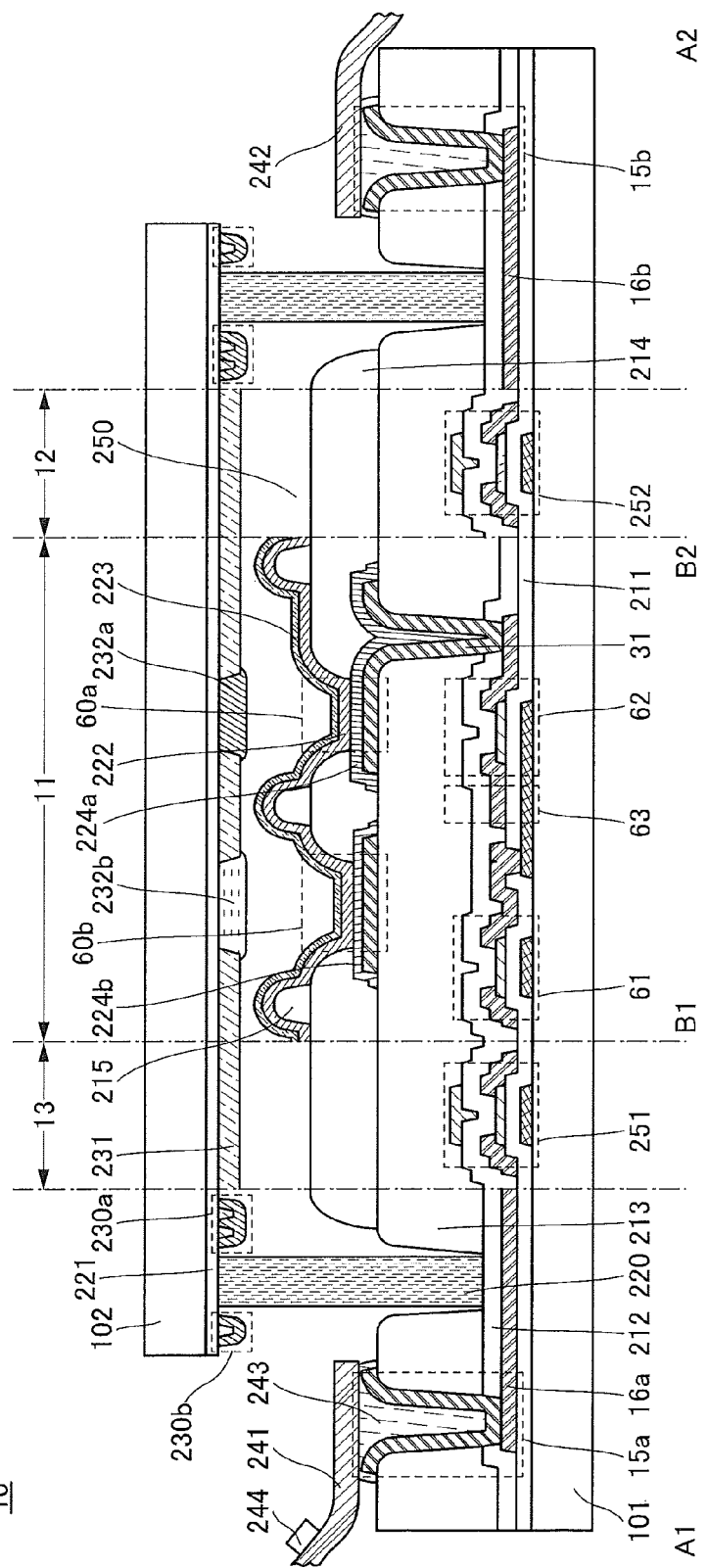
FIG. 16 illustrates a structure example of a display device of one embodiment.

FIG. 16 is a schematic cross-sectional view of the display device 10. FIG. 16 shows a cross-section taken along the cut line A1-A2 of FIG. 1A. A cross section of the pixel portion 11 is along the cut line B1-B2 of FIG. 14B.

The display device 10 includes a first substrate 101 and a second substrate 102 bonded with an adhesive layer 220.

Over the first substrate 101, terminal portions 15a and 15b, wirings 16a and 16b, a transistor 251 constituting a circuit 13, a transistor 252 constituting a circuit 12, transistors 61 and 62, a capacitor 63, and a display element 60a constituting the pixel portion 11, insulating layers 211, 212, 213, and 214, a spacer 215, and the like are provided.

On the second substrate 102, an insulating layer 221, a light-blocking layer 231, coloring layers 232a and 232b, structures 230a and 230b, and the like are provided.

The display element 60a is provided over the insulating layer 213. The display element 60a includes a pixel electrode 31 serving as a first electrode, an EL layer 222, and a second electrode 223. An optical adjustment layer 224a is between the pixel electrode 31 and the EL layer 222. The insulating layer 214 covers end portions of the pixel electrode 31 and the optical adjustment layer 224a.

FIG. 16 shows an example in which the display element 60b of a subpixel next to the subpixel including the display element 60a overlaps with the transistor 61 and the like. The display element 60b includes an optical adjustment layer 224b. In the case where light of different colors is emitted from the display elements 60a and 60b through the coloring layer 232a or 232b, the thickness of the optical adjustment layer 224a preferably differs from that of the optical adjustment layer 224b as shown in FIG. 16. A structure in which one of the optical adjustment layers 224a and 224b is not provided may be used.

The circuits 12 and 13 shown in FIG. 16 include the transistors 252 and 251, respectively.

Transistors included in the circuit 12, the circuit 13, and the pixel portion 11 may have the same structure. The transistors included in the circuit 12 may have the same structure or different structures, and the same is applied to the circuit 13 and the pixel portion 11.

The display elements 60a and 60b in FIG. 16 are top-emission light-emitting elements. Light emission from the display elements 60a and 60b is extracted through the second substrate 102 side. In such a structure, transistors, capacitors, circuits, and the like can be provided below the display elements 60a and 60b (i.e., on the first substrate 101 side); accordingly, the aperture ratio of the pixel portion 11 can be increased.

The coloring layers 232a and 232b overlapping with the display elements 60a and 60b, respectively, are provided on the surface of the second substrate 102 on the first substrate 101 side. The light-blocking layer 231 may be provided in regions where the coloring layers 232a and 232b are not provided. The light-blocking layer 231 may overlap with the circuits 12 and 13 as shown in FIG. 16. A light-transmitting overcoat layer may be provided to cover the coloring layers 232a and 232b and the light-blocking layer 231.

On the second substrate 102, the structure 230a is provided on an inside region which is surrounded by the adhesive layer 220 as seen from above, and the structure 230b is provided on an outside region which is opposed to the inside region with the adhesive layer 220 interposed therebetween as shown in the cross-sectional view of FIG. 16. The structures 230a and 230b have a function of suppressing development of a crack in the insulating layer 221, the second substrate 102, or the like at the ends of the second substrate 102. The structures 230a and 230b in FIG. 16 have stacked-film structures including a film formed of the same film as the light-blocking layer 231 and a film formed of the same film as the coloring layer 232a. Such a stacked structure of more than two films can increase the effect of suppressing crack development. Although the structures 230a and 230b are on both sides of the adhesive layer 220, only one of them is possible. If there is no fear of generation of cracks (e.g., when the second substrate 102 possesses high stiffness), the structures 230a and 230b are not necessarily provided.

The spacer 215 is provided over the insulating layer 214. The spacer 215 serves as a gap spacer for preventing an overdecrease in the distance between the first substrate 101 and the second substrate 102. The angle between the surface where the spacer 215 is formed and at least part of the side surface of the spacer 215 is preferably approximately 90°, for example, preferably more than or equal to 45° and less than or equal to 120°, further preferably more than or equal to 60° and less than or equal to 100°, still further preferably more than or equal to 75° and less than or equal to 90°. Since the spacer 215 includes a portion with the angle, a region of the EL layer 222 with a small thickness can be easily formed on the side surface of the spacer 215. This can prevent a phenomenon in which current flows through the EL layer 222 which causes unnecessary emission of a display element adjacent to a display element emitting light. The spacer 215 having such a shape between display elements is particularly effective in the high-resolution pixel portion 11 because the distance between the adjacent display elements is reduced.

The spacer 215 preferably overlaps with a wiring (e.g., the wirings 52 and 53) which intersects with a gate line.

A color filter method is employed in the display device 10 of one embodiment of the present invention. For example, a structure in which pixels of three colors of red (R), green (G), and blue (B) expresses one color can be employed for the coloring layer 232a or 232b. In addition, the use of a pixel of white (W) or yellow (Y) leads to reduction in power consumption, which is preferable.

Owing to the combination of the coloring layer 232a and a microcavity structure using the optical adjustment layer 224a in the display element 60a, light with high color purity can be extracted from the display device 10, which is one embodiment of the present invention. The thickness of the optical adjustment layer 224a may be determined depending on the color of a subpixel. Some subpixels do not necessarily have the optical adjustment layer.

An EL layer that emits white light is preferably used as the EL layer 222 of the display element 60a. The use of such a display element 60a leads to reduction in cost and increase in yield because there is no need to separately form the EL layers 222 expressing different colors in the subpixels, and the high-resolution pixel portion 11 can be easily formed. Furthermore, the optical adjustment layers with different thicknesses in the subpixels enable to extract light with a wavelength suitable for each subpixel, which increases color purity. Note that the EL layers 222 expressing different colors may be separately formed in the subpixels, in which case one or both of the optical adjustment layer and the coloring layer are not necessarily provided. In the subpixels, at least only the light-emitting layers of the EL layers 222 are separately formed while each of the other layers thereof are not necessarily formed separately.

FIG. 16 shows an example in which an FPC 241 and an FPC 242 are electrically connected to the terminal portion 15a and the terminal portion 15b, respectively, and accordingly the display device 10 of FIG. 16 can be referred to as a display module. Note that a display device without an FPC and the like can be referred to as a display panel.

The terminal portion 15a is electrically connected to the FPC 241 with the connection layer 243 therebetween. Similarly, the terminal portion 15b is electrically connected to the FPC 242 with the connection layer 243 therebetween.

The terminal portion 15a shown in FIG. 16 has a stacked structure of the wiring 16a and a conductive layer formed of the same conductive film as the pixel electrode 31. Similarly, the terminal portion 15b has a stacked structure of the wiring 16b and the conductive layer. The terminal portions 15a and 15b formed of stacked conductive layers can reduce electric resistance and increase mechanical strength, which is preferable.

As the connection layer 243, any of various anisotropic conductive films (ACF), anisotropic conductive pastes (ACP), or the like can be used.

An IC 244 in FIG. 16 is mounted on the FPC 241 by a chip on film (COF) method. An IC functioning as a source driver circuit can be used as the IC 244, for example.

A material in which impurities such as water or hydrogen do not easily diffuse is preferably used for the insulating layer 211 and the insulating layer 221. That is, the insulating layer 211 and the insulating layer 221 can each function as a barrier film. This structure enables diffusion of impurities to the light-emitting element 60a and the transistors to be effectively suppressed even when a material with moisture permeability is used for the first substrate 101 and the second substrate 102, leading to a highly reliable display device.

There is a space 250 between the first substrate 101 and the second substrate 102 in FIG. 16, which is a sealed hollow structure. For example, the space 250 may be filled with an inert gas, such as nitrogen or argon. The sealing method is not limited thereto and solid sealing may be used.

Modification Example 1

Figure 17:
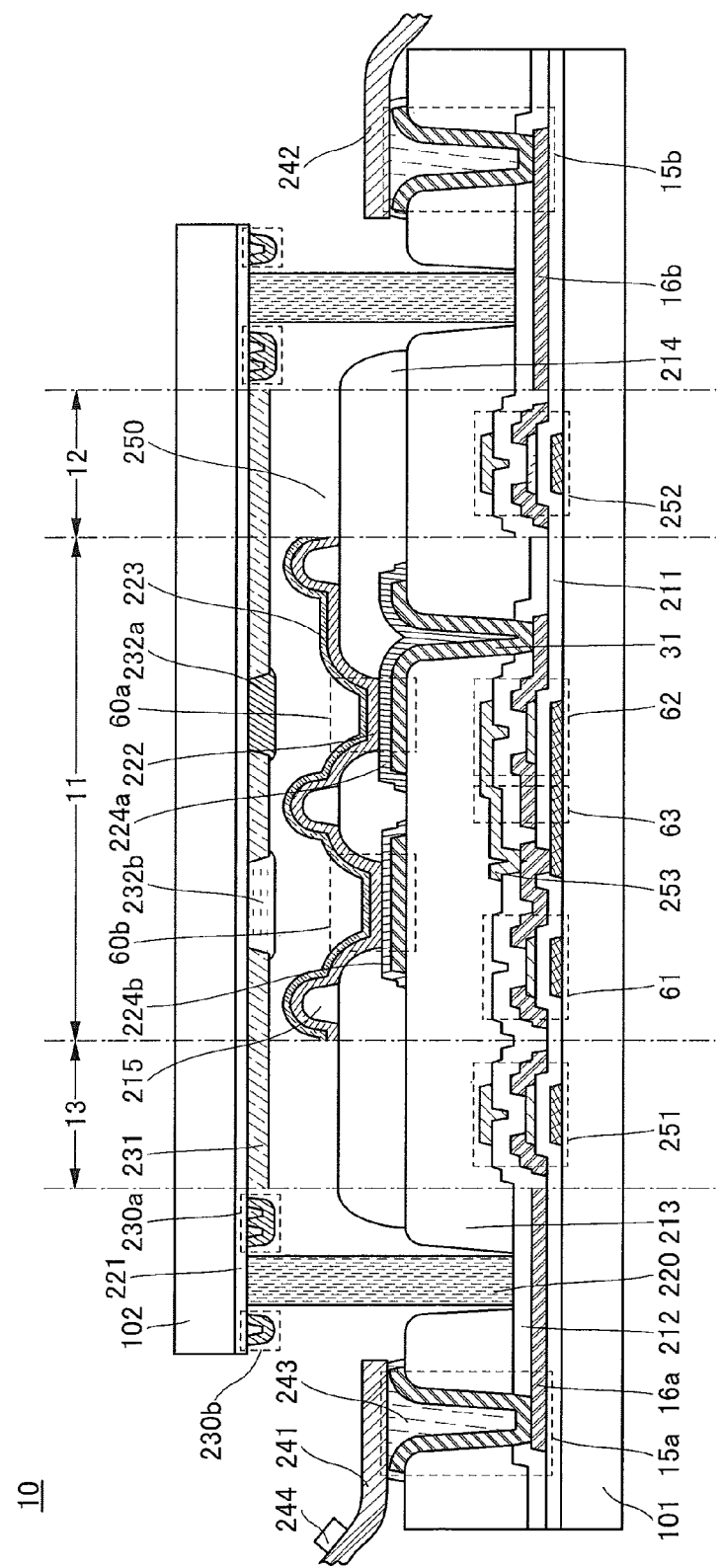
FIG. 17 illustrates a structure example of a display device of one embodiment.

FIG. 17 is an example in which the structure of a transistor is different from the above.

The transistors 62, 251, and 252 include a conductive layer 253 functioning as a second gate electrode. That is, a semiconductor layer in which a channel is formed is provided between two gate electrodes. Such transistors can have higher field-effect mobility and thus have higher on-state current than other transistors. Consequently, a circuit capable of high-speed operation can be obtained. Furthermore, the area occupied by a circuit portion can be reduced. The use of a transistor having high on-state current can reduce signal delay in wirings and can suppress display unevenness even in a display device in which the number of wirings is increased in accordance with the increase in size or resolution.

Cross-Sectional Structure Example 2

Figure 18:
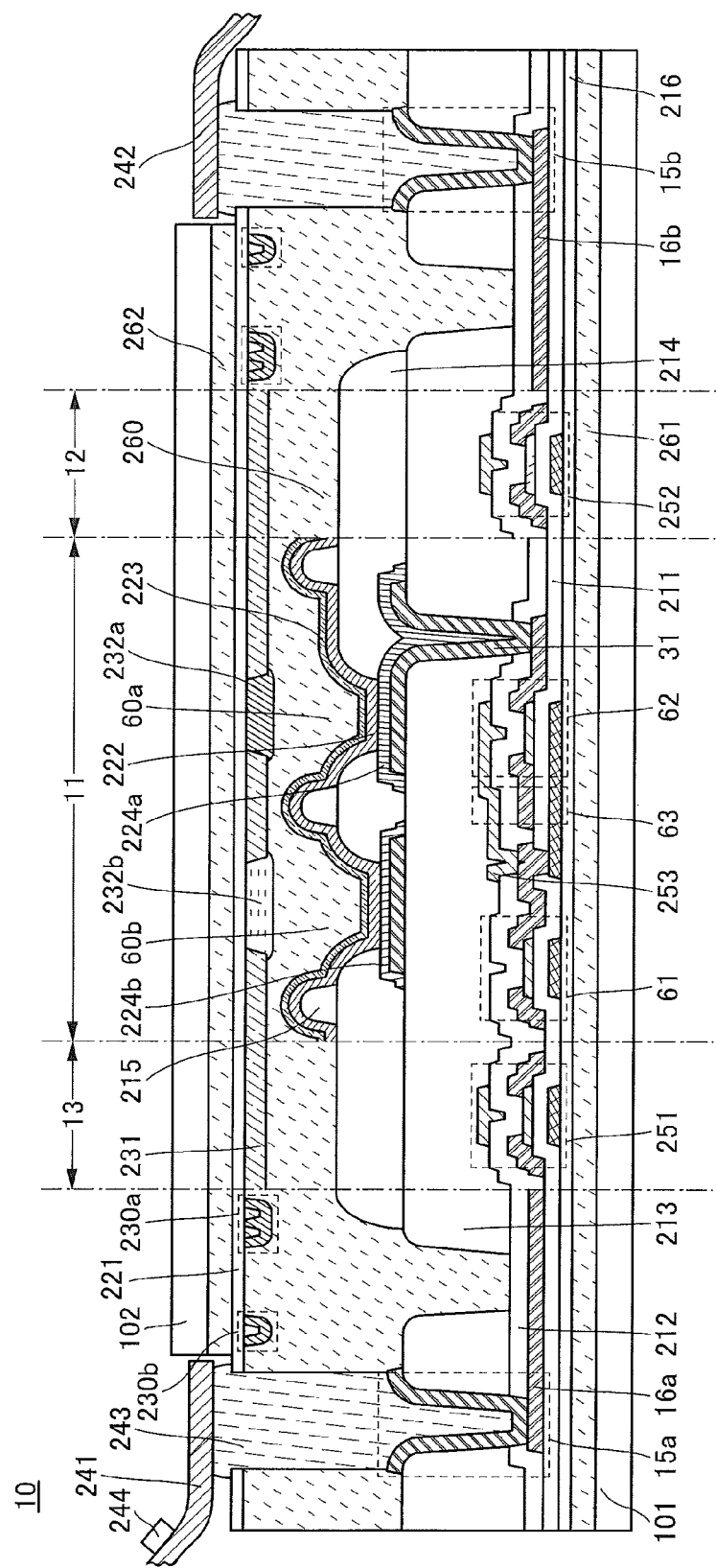
FIG. 18 illustrates a structure example of a display device of one embodiment.

FIG. 18 is a display device which is suitable for bending of the pixel portion 11.

The display device 10 shown in FIG. 18 includes the first substrate 101 and the second substrate 102 bonded with a sealant 260, which is a solid sealing structure. For the sealant 260, a resin such as a polyvinyl chloride (PVC) resin, an acrylic resin, a polyimide resin, an epoxy resin, a silicone resin, a polyvinyl butyral (PVB) resin, an ethylene vinyl acetate (EVA) resin, or the like can be used. A drying agent may be contained in the resin.

An adhesive layer 261 is provided over the first substrate 101. An insulating layer 216 is provided over the adhesive layer 261. A transistor, a display element, and the like are provided over the insulating layer 216. A material in which impurities such as water or hydrogen do not easily diffuse is preferably used for the insulating layer 216 similar to the insulating layers 211 and 221.

An adhesive layer 262 is provided between the second substrate 102 and the insulating layer 221.

In addition, the insulating layer 213 has an opening in a portion closer to the outer periphery of the first substrate 101 than the pixel portion 11 and the circuits 12 and 13. It is preferable to form an opening in the insulating layer 213 formed using a resin material, for example, so as to surround the pixel portion 11, the circuits 12 and 13, and the like. In such a structure, the vicinity of the side surface of the insulating layer 213 which is in contact with the outside of the display device 10 does not form a continuous layer with the region overlapping with the pixel portion 11, the circuits 12 and 13, and the like, so that diffusion of impurities, such as water and hydrogen, from the outside through the insulating layer 213 can be suppressed.

The solid sealing structure shown in FIG. 18 makes it easier to keep the distance between the first substrate 101 and the second substrate 102 constant, and flexible substrates can be preferably used as the first substrate 101 and the second substrate 102 so that part or whole of the pixel portion 11 can be bent. For example, the display device 10 is bonded to a curved surface or the pixel portion of the display device 10 can be foldable to produce a variety of electronic devices.

The above is the description of the modification example.

Components

The components are described below.

A substrate having a flat surface can be used as the substrate included in the display device. The substrate on the side from which light from the light-emitting element is extracted is formed using a material which transmits the light. For example, a material such as glass, quartz, ceramics, sapphire, or an organic resin can be used.

The weight and thickness of the display device can be decreased by using a thin substrate. Furthermore, a flexible display device can be obtained by using a substrate that is thin enough to have flexibility.

Examples of glass include alkali-free glass, barium borosilicate glass, and aluminoborosilicate glass.

Examples of a material that has flexibility and transmits visible light include flexible glass, polyester resins such as polyethylene terephthalate (PET) and polyethylene naphthalate (PEN), a polyacrylonitrile resin, a polyimide resin, a polymethyl methacrylate resin, a polycarbonate (PC) resin, a polyethersulfone (PES) resin, a polyamide resin, a cycloolefin resin, a polystyrene resin, a polyamide imide resin, a polyvinyl chloride resin, and a polytetrafluoroethylene (FIFE). In particular, a material whose thermal expansion coefficient is low is preferred, and for example, a polyamide imide resin, a polyimide resin, or PET can be suitably used. A substrate in which a glass fiber is impregnated with an organic resin or a substrate whose thermal expansion coefficient is reduced by mixing an organic resin with an inorganic filler can also be used. A substrate using such a material is lightweight, and a display device using this substrate can also be lightweight accordingly.

Since the substrate through which light emission is not extracted does not need to have a light-transmitting property, a metal substrate using a metal material or an alloy material or the like can be used as well as the above-described substrates. A metal material and an alloy material, which have high thermal conductivity, are preferably used, in which case heat can be conducted to the whole substrate, so that a local temperature rise in the display device can be prevented. To obtain flexibility and bendability, the thickness of a metal substrate is preferably greater than or equal to 10 μm and less than or equal to 200 μm, more preferably greater than or equal to 20 μm and less than or equal to 50 μm.

Although there is no particular limitation on a material of the metal substrate, it is preferable to use, for example, aluminum, copper, nickel, a metal alloy such as an aluminum alloy or stainless steel.

It is preferable to use a substrate subjected to insulation treatment in such a manner that a surface of the conductive substrate is oxidized or an insulating film is formed on the surface. An insulating film may be formed by, for example, a coating method such as a spin-coating method or a dipping method, an electrodeposition method, an evaporation method, or a sputtering method. An oxide film may be formed on the substrate surface by exposure to or heating in an oxygen atmosphere or by an anodic oxidation method or the like.

The flexible substrate may have a stacked structure of a layer of any of the above-mentioned materials and a hard coat layer (e.g., a silicon nitride layer) that protects a surface of the display device from damage or the like, a layer (e.g., an aramid resin layer) that can disperse pressure, or the like. Furthermore, to suppress a decrease in the lifetime of the light-emitting element due to moisture and the like, an insulating film with low water permeability may be provided. For example, a film containing nitrogen and silicon (e.g., a silicon nitride film, a silicon oxynitride film) or a film containing nitrogen and aluminum (e.g., an aluminum nitride film) may be provided.

The substrate may be formed by stacking a plurality of layers. When a glass layer is used, a barrier property against water and oxygen can be improved and thus a reliable display device can be provided.

A substrate in which a glass layer, an adhesive layer, and an organic resin layer are stacked from the side closer to a light-emitting element can be used. The thickness of the glass layer is greater than or equal to 20 μm and less than or equal to 200 μm, preferably greater than or equal to 25 μm and less than or equal to 100 μm. With such a thickness, the glass layer can have both a high barrier property against water and oxygen and a high flexibility. The thickness of the organic resin layer is greater than or equal to 10 μm and less than or equal to 200 μm, preferably greater than or equal to 20 μm and less than or equal to 50 μm. With such an organic resin layer provided on an outer side of the glass layer, breakage or a crack of the glass layer can be inhibited, resulting in increased mechanical strength. With the substrate that includes such a composite material of a glass material and an organic resin, a highly reliable and flexible display device can be provided.

The transistor in the display device 10 includes a conductive layer functioning as the gate electrode, the semiconductor layer, a conductive layer functioning as the source electrode, a conductive layer functioning as the drain electrode, and an insulating layer functioning as a gate insulating layer. FIG. 16 shows the case where a bottom-gate transistor is used.

Note that there is no particular limitation on the structure of the transistor included in the display device of one embodiment of the present invention. For example, a forward staggered transistor or an inverted staggered transistor may be used. A top-gate transistor or a bottom-gate transistor may be used. A semiconductor material used for the transistor is not particularly limited, and for example, an oxide semiconductor, silicon, or germanium can be used.

There is no particular limitation on the crystallinity of a semiconductor material used for the transistor, and an amorphous semiconductor or a semiconductor having crystallinity (a microcrystalline semiconductor, a polycrystalline semiconductor, a single-crystal semiconductor, or a semiconductor partly including crystal regions) may be used. It is preferable that a semiconductor having crystallinity be used, in which case deterioration of the transistor characteristics can be suppressed.

As a semiconductor material for the semiconductor layer of the transistor, an element of Group 14, a compound semiconductor, or an oxide semiconductor can be used, for example. Typically, a semiconductor containing silicon, a semiconductor containing gallium arsenide, an oxide semiconductor containing indium, or the like can be used.

An oxide semiconductor is preferably used as a semiconductor in which a channel of a transistor is formed. In particular, an oxide semiconductor having a wider band gap than silicon is preferably used. A semiconductor material having a wider band gap and a lower carrier density than silicon is preferably used because off-state leakage current of the transistor can be reduced.

The oxide semiconductor preferably contains at least indium (In) or zinc (Zn). The semiconductor layer more preferably contains an In-M-Zn-based oxide (M is a metal such as Al, Ti, Ga, Ge, Y, Zr, Sn, La, Ce, or Hf).

As the semiconductor layer, it is particularly preferable to use an oxide semiconductor layer including a plurality of crystal parts whose c-axes are aligned perpendicular to a surface on which the semiconductor layer is formed or the top surface of the semiconductor layer and in which the adjacent crystal parts have no grain boundary.

Because such an oxide semiconductor contains no grain boundary, generation of a crack caused by stress when a display panel is bent is prevented. Therefore, such an oxide semiconductor can be preferably used for a flexible touch panel which is used in a bent state, or the like.

Such an oxide semiconductor is resistant to etching and thus has a high etching selectivity to a conductive film, for example, which is an advantage. Thus, the use of such an oxide semiconductor makes it easier to form a channel-etched transistor. This is more suitable for improvement in resolution than a channel protective transistor because the number of fabrication steps and the occupation area can be reduced as compared with those of a channel protective transistor.

Moreover, the use of such an oxide semiconductor for the semiconductor layer makes it possible to provide a highly reliable transistor in which a change in the electrical characteristics is suppressed.

Charge accumulated in a capacitor through a transistor can be held for a long time because of the low off-state current of the transistor. When such a transistor is used for a pixel, operation of a driver circuit can be stopped while a gray scale of an image displayed in each display region is maintained. As a result, a display device with an extremely low power consumption can be obtained.

For stable characteristics of the transistor, a base film is preferably provided. The base film can be formed with an inorganic insulating film such as a silicon oxide film, a silicon nitride film, a silicon oxynitride film, or a silicon nitride oxide film to have a single-layer structure or a stacked-layer structure. The base film can be formed by a sputtering method, a chemical vapor deposition (CVD) method (e.g., a plasma CVD method, a thermal CVD method, or a metal organic CVD (MOCVD) method), an atomic layer deposition (ALD) method, a coating method, a printing method, or the like. Note that the base film is not necessarily provided if not necessary.

Alternatively, silicon is preferably used as a semiconductor in which a channel of a transistor is formed. Although amorphous silicon may be used as silicon, silicon having crystallinity is particularly preferable. For example, microcrystalline silicon, polycrystalline silicon, single crystal silicon, or the like is preferably used. In particular, polycrystalline silicon can be formed at a lower temperature than single crystal silicon and has higher field effect mobility and higher reliability than amorphous silicon. When such a polycrystalline semiconductor is used for a pixel, the aperture ratio of the pixel can be improved. Even in the case where pixels are provided at extremely high resolution, a gate driver circuit and a source driver circuit can be formed over a substrate over which the pixels are formed, and the number of components of an electronic device can be reduced.

As conductive layers such as a gate, a source, and a drain of the transistor and a wiring and an electrode in the touch panel, a single-layer structure or a stacked-layer structure using any of metals such as aluminum, titanium, chromium, nickel, copper, yttrium, zirconium, molybdenum, silver, tantalum, and tungsten, or an alloy containing any of these metals as its main component can be used. For example, a single-layer structure of an aluminum film containing silicon, a two-layer structure in which an aluminum film is stacked over a titanium film, a two-layer structure in which an aluminum film is stacked over a tungsten film, a two-layer structure in which a copper film is stacked over a copper-magnesium-aluminum alloy film, a two-layer structure in which a copper film is stacked over a titanium film, a two-layer structure in which a copper film is stacked over a tungsten film, a three-layer structure in which a titanium film or a titanium nitride film, an aluminum film or a copper film, and a titanium film or a titanium nitride film are stacked in this order, a three-layer structure in which a molybdenum film or a molybdenum nitride film, an aluminum film or a copper film, and a molybdenum film or a molybdenum nitride film are stacked in this order, and the like can be given. Note that a transparent conductive material containing indium oxide, tin oxide, or zinc oxide may be used. Copper containing manganese is preferably used because controllability of a shape by etching is increased.

As a light-transmitting conductive material, a conductive oxide such as indium oxide, indium tin oxide, indium zinc oxide, zinc oxide, or zinc oxide to which gallium is added, or graphene can be used. Alternatively, a metal material such as gold, silver, platinum, magnesium, nickel, tungsten, chromium, molybdenum, iron, cobalt, copper, palladium, or titanium, or an alloy material containing any of these metal materials can be used. Alternatively, a nitride of the metal material (e.g., titanium nitride) or the like may be used. In the case of using the metal material or the alloy material (or the nitride thereof), the thickness is set small enough to be able to transmit light. Alternatively, a stack of any of the above materials can be used as the conductive layer. For example, a stack of indium tin oxide and an alloy of silver and magnesium is preferably used because the conductivity can be increased.

Examples of an insulating material that can be used for the insulating layers, the spacer 215, and the like include a resin such as acrylic or epoxy resin, a resin having a siloxane bond, and an inorganic insulating material such as silicon oxide, silicon oxynitride, silicon nitride oxide, silicon nitride, or aluminum oxide.

As described above, the light-emitting element is preferably provided between a pair of insulating films with low water permeability. Thus, impurities such as water can be prevented from entering the light-emitting element, leading to prevention of a decrease in the reliability of the light-emitting device.

As an insulating film with low water permeability, a film containing nitrogen and silicon (e.g., a silicon nitride film or a silicon nitride oxide film), a film containing nitrogen and aluminum (e.g., an aluminum nitride film), or the like can be used. Alternatively, a silicon oxide film, a silicon oxynitride film, an aluminum oxide film, or the like can be used.

For example, the water vapor transmittance of the insulating film with low water permeability is lower than or equal to $1\times10^{-5}$ [g/(m$^2$·day)], preferably lower than or equal to $1\times10^{-6}$ [g/(m$^2$·day)], further preferably lower than or equal to $1\times10^{-7}$ [g/(m$^2$·day)], still further preferably lower than or equal to $1\times10^{-8}$ [g/(m$^2$·day)].

As the adhesive layer or the sealing layer, a variety of curable adhesives such as a reactive curable adhesive, a thermosetting adhesive, an anaerobic adhesive, and a photo curable adhesive such as an ultraviolet curable adhesive can be used. Examples of these adhesives include an epoxy resin, an acrylic resin, a silicone resin, a phenol resin, a polyimide resin, an imide resin, a polyvinyl chloride (PVC) resin, a polyvinyl butyral (PVB) resin, and an ethylene vinyl acetate (EVA) resin. In particular, a material with low moisture permeability, such as an epoxy resin, is preferred. Alternatively, a two-component-mixture-type resin may be used. Further alternatively, an adhesive sheet or the like may be used.

Further, the resin may include a drying agent. For example, a substance that adsorbs moisture by chemical adsorption, such as oxide of an alkaline earth metal (e.g., calcium oxide or barium oxide), can be used. Alternatively, a substance that adsorbs moisture by physical adsorption, such as zeolite or silica gel, may be used. The drying agent is preferably included because it can prevent an impurity such as moisture from entering the functional element, thereby improving the reliability of the light-emitting device.

In addition, it is preferable to mix a filler with a high refractive index or light-scattering member into the resin, in which case the efficiency of light extraction from the light-emitting element can be improved. For example, titanium oxide, barium oxide, zeolite, zirconium, or the like can be used.

As the light-emitting element, a self-luminous element can be used, and an element whose luminance is controlled by current or voltage is included in the category of the light-emitting element. For example, a light-emitting diode (LED), an organic EL element, an inorganic EL element, or the like can be used.

The light-emitting element may be a top emission, bottom emission, or dual emission light-emitting element. A conductive film that transmits visible light is used as the electrode through which light is extracted. A conductive film that reflects visible light is preferably used as the electrode through which light is not extracted.

The EL layer 222 includes at least a light-emitting layer. In addition to the light-emitting layer, the EL layer 222 may further include one or more layers containing any of a substance with a high hole-injection property, a substance with a high hole-transport property, a hole-blocking material, a substance with a high electron-transport property, a substance with a high electron-injection property, a substance with a bipolar property (a substance with a high electron- and hole-transport property), and the like.

For the EL layer 222, either a low molecular compound or a high molecular compound can be used, and an inorganic compound may be used. Each of the layers included in the EL layer 222 can be formed by any of the following methods: an evaporation method (including a vacuum evaporation method), a transfer method, a printing method, an inkjet method, a coating method, and the like.

In the case where the light-emitting element has a top emission structure, a conductive film that transmits visible light is used for an upper electrode, and a conductive film that reflects visible light is preferably used for a lower electrode. Alternatively, a film of a metal material such as gold, silver, platinum, magnesium, nickel, tungsten, chromium, molybdenum, iron, cobalt, copper, palladium, or titanium; an alloy containing any of these metal materials; or a nitride of any of these metal materials (e.g., titanium nitride) can be formed thin so as to have a light-transmitting property. Alternatively, a stack of any of the above materials can be used as the conductive layer. For example, a stacked film of ITO and an alloy of silver and magnesium is preferably used, in which case conductivity can be increased. Further alternatively, graphene or the like may be used.

For the conductive film that reflects visible light, for example, a metal material, such as aluminum, gold, platinum, silver, nickel, tungsten, chromium, molybdenum, iron, cobalt, copper, or palladium or an alloy including any of these metal materials can be used. Lanthanum, neodymium, germanium, or the like may be added to the metal material or the alloy. Furthermore, an alloy containing aluminum (an aluminum alloy) such as an alloy of aluminum and titanium, an alloy of aluminum and nickel, or an alloy of aluminum and neodymium; or an alloy containing silver such as an alloy of silver and copper, an alloy of silver, copper, and palladium, or an alloy of silver and magnesium can be used for the conductive film. An alloy of silver and copper is preferable because of its high heat resistance. Moreover, a metal film or a metal oxide film is stacked on an aluminum alloy film, whereby oxidation of the aluminum alloy film can be suppressed. Examples of a material for the metal film or the metal oxide film are titanium and titanium oxide. Alternatively, the conductive film having a property of property of transmitting visible light and a film containing any of the above metal materials may be stacked. For example, a stacked film of silver and ITO or a stacked film of an alloy of silver and magnesium and ITO can be used.

The electrodes may be formed separately by an evaporation method or a sputtering method. Alternatively, a discharging method such as an ink-jet method, a printing method such as a screen printing method, or a plating method may be used.

When a voltage higher than the threshold voltage of the light-emitting element is applied between the anode and the cathode, holes are injected to the EL layer from the anode side and electrons are injected to the EL layer from the cathode side. The injected electrons and holes are recombined in the EL layer, so that a light-emitting substance contained in the EL layer emits light.

In the case where a light-emitting element emitting white light is used as the light-emitting element, the EL layer preferably contains two or more kinds of light-emitting substances. For example, light-emitting substances are selected so that two or more light-emitting substances emit complementary colors to obtain white light emission. Specifically, it is preferable to contain two or more selected from light-emitting substances emitting light of red (R), green (G), blue (B), yellow (Y), orange (O), and the like and light-emitting substances emitting light containing two or more of spectral components of R, G, and B. The light-emitting element preferably emits light with a spectrum having two or more peaks in the wavelength range of a visible light region (e.g., 350 nm to 750 nm). An emission spectrum of a material emitting light having a peak in the wavelength range of a yellow light preferably includes spectral components also in the wavelength range of a green light and a red light.

More preferably, a light-emitting layer containing a light-emitting material emitting light of one color and a light-emitting layer containing a light-emitting material emitting light of another color are stacked in the EL layer. For example, the plurality of light-emitting layers in the EL layer may be stacked in contact with each other or may be stacked with a separation layer therebetween. For example, a separation layer may be provided between a fluorescent layer and a phosphorescent layer.

The separation layer can be provided to prevent an energy transfer by the Dexter mechanism (particularly triplet energy transfer) from a phosphorescent material or the like in an excited state which is generated in the phosphorescent layer to a fluorescent material or the like in the fluorescent layer. The thickness of the separation layer may be approximately several nanometers, specifically 0.1 nm or more and 20 nm or less, 1 nm or more and 10 nm or less, or 1 nm or more and 5 nm or less. The separation layer contains a single material (preferably a bipolar material) or a plurality of materials (preferably, a hole-transport material and an electron-transport material).

The separation layer may be formed using a material contained in the light-emitting layer in contact with the separation layer. This facilitates the manufacture of the light-emitting element and reduces the drive voltage. For example; in the case where the phosphorescent layer contains a host material, an assist material, and the phosphorescent material (a guest material), the separation layer may contain the host material and the assist material. In other words, the separation layer includes a region which does not contain the phosphorescent material, while the phosphorescent layer includes a region containing the phosphorescent material. Thus, the separation layer and the phosphorescent layer can be separately deposited depending on the presence of the phosphorescent material. Furthermore, such a structure enables the separation layer and the phosphorescent layer to be deposited in the same chamber, which leads to a reduction in manufacturing cost.

The light-emitting element may be a single element including one EL layer or a tandem element in which a plurality of EL layers are stacked with a charge generation layer therebetween.

As examples of a material that can be used for the light-blocking layer 231, carbon black, a metal oxide, and a composite oxide containing a solid solution of a plurality of metal oxides can be given.

As examples of a material that can be used for the coloring layer 232a and the like, a metal material, a resin material, and a resin material containing a pigment or dye can be given.

Manufacturing Method Example

Here, a method for manufacturing a display device is described.

For convenience, a structure including a pixel and a circuit, or a structure including an optical member such as a color filter is referred to as an element layer. An element layer includes a display element, for example, and may include a wiring electrically connected to the display element or an element such as a transistor used in a pixel or a circuit in addition to the display element.

Here, a support body (e.g., the first substrate 101 or the second substrate 102) with an insulating surface where an element layer is formed is referred to as a substrate.

As a method for forming an element layer over a flexible substrate provided with an insulating surface, there are a method in which an element layer is formed directly over a substrate, and a method in which an element layer is formed over a supporting base material that has stiffness and then the element layer is separated from the supporting base material and transferred to the substrate.

In the case where a material of the substrate can withstand heating temperature in a process for forming the element layer, it is preferable that the element layer be formed directly over the substrate, in which case a manufacturing process can be simplified. At this time, the element layer is preferably formed in a state where the substrate is fixed to the supporting base material, in which case transfer thereof in an apparatus and between apparatuses can be easy.

In the case of employing the method in which the element layer is formed over the supporting base material and then transferred to the substrate, first, a separation layer and an insulating layer are stacked over the supporting base material, and then the element layer is formed over the insulating layer. Next, the element layer is separated from the supporting base material and then transferred to the substrate. At this time, a material is selected that would causes separation at an interface between the supporting base material and the separation layer, at an interface between the separation layer and the insulating layer, or in the separation layer.

For example, it is preferable that a stacked layer of a layer including a high-melting-point metal material, such as tungsten, and a layer including an oxide of the metal material be used as the insulating layer over the separation layer, and a stacked layer of a plurality of layers, such as a silicon nitride layer and a silicon oxynitride layer be used over the separation layer. The use of the high-melting-point metal material is preferable because the degree of freedom of the process for forming the element layer can be increased.

The separation may be performed by application of mechanical power, by etching of the separation layer, by dripping of a liquid into part of the separation interface to penetrate the entire separation interface, or the like. Alternatively, separation may be performed by heating the separation interface by utilizing a difference in thermal expansion coefficient.

The peeling layer is not necessarily provided in the case where peeling can occur at an interface between the supporting base material and the insulating layer. For example, glass may be used as the supporting base material, an organic resin such as polyimide may be used as the insulating layer, a separation trigger may be formed by locally heating part of the organic resin by laser light or the like, and peeling may be performed at an interface between the glass and the insulating layer. Alternatively, a metal layer may be provided between the supporting base material and the insulating layer formed of an organic resin, and separation may be performed at the interface between the metal layer and the insulating layer by heating the metal layer by feeding a current to the metal layer. A layer of a light-absorbing material (e.g., a metal, a semiconductor, or an insulator) may be provided between the supporting base layer and the insulating layer formed of an organic resin and locally heated with laser light or the like to form a separation trigger. In these methods, the insulating layer formed of an organic resin can be used as a substrate.

Examples of such a substrate having flexibility include polyester resins such as polyethylene terephthalate (PET) and polyethylene naphthalate (PEN), a polyacrylonitrile resin, a polyimide resin, a polymethyl methacrylate resin, a polycarbonate (PC) resin, a polyethersulfone (PES) resin, a polyamide resin, a cycloolefin resin, a polystyrene resin, a polyamide imide resin, and a polyvinyl chloride resin. In particular, it is preferable to use a material with a low thermal expansion coefficient, and for example, a polyamide imide resin, a polyimide resin, PET, or the like with a thermal expansion coefficient lower than or equal to $30 \times 10^{-6}$/K can be suitably used. A substrate in which a fibrous body is impregnated with a resin (also referred to as prepreg) or a substrate whose thermal expansion coefficient is reduced by mixing an inorganic filler with an organic resin can also be used.

In the case where a fibrous body is included in the above material, a high-strength fiber of an organic compound or an inorganic compound is used as the fibrous body. The high-strength fiber is specifically a fiber with a high tensile elastic modulus or a fiber with a high Young's modulus. Typical examples thereof include a polyvinyl alcohol based fiber, a polyester based fiber, a polyamide based fiber, a polyethylene based fiber, an aramid based fiber, a polyparaphenylene benzobisoxazole fiber, a glass fiber, and a carbon fiber. As the glass fiber, glass fiber using E glass, S glass, D glass, Q glass, or the like can be used. These fibers may be used in a state of a woven fabric or a nonwoven fabric, and a structure body in which this fibrous body is impregnated with a resin and the resin is cured may be used as the flexible substrate. The structure body including the fibrous body and the resin is preferably used as the flexible substrate, in which case the reliability against bending or breaking due to local pressure can be increased.

Alternatively, glass, metal, or the like that is thin enough to have flexibility can be used as the substrate. Alternatively, a composite material where glass and a resin material are attached to each other may be used.

In the structure shown in FIG. 18, for example, a first separation layer and the insulating layer 216 are formed in this order over a first supporting base material, and then components in a layer over the first separation layer and the insulating layer 216 are formed. Separately, a second separation layer and the insulating layer 221 are formed in this order over a second supporting base material, and then upper components are formed. Next, the first supporting base material and the second supporting base material are bonded to each other using the sealant 260. After that, separation at an interface between the second separation layer and the insulating layer 221 is conducted so that the second supporting base material and the second separation layer are removed, and then the second substrate 102 is bonded to the insulating layer 221 using the adhesive layer 262. Further, separation at an interface between the first separation layer and the insulating layer 216 is conducted so that the first supporting base material and the first separation layer are removed, and then the first substrate 101 is bonded to the insulating layer 216 using the adhesive layer 261. Note that either side may be subjected to separation and attachment first.

The above is the description of a manufacturing method of a flexible display device.

The above is the description of the components.

Note that although the case where the light-emitting element is used as a display element is described here, one embodiment of the present invention is not limited thereto.

In this specification and the like, for example, a display element, a display device or a display panel which is a device including a display element, a light-emitting element, and a light-emitting device which is a device including a light-emitting element can employ a variety of modes or can include a variety of elements. The display element, the display device, the display panel, the light-emitting element, or the light-emitting device includes at least one of an electroluminescence (EL) element (e.g., an EL element containing organic and inorganic materials, an organic EL element, or an inorganic EL element), an LED (e.g., a white LED, a red LED, a green LED, or a blue LED), a transistor (a transistor that emits light depending on current), an electron emitter, a liquid crystal element, electronic ink, an electrophoretic element, a grating light valve (GLV), a plasma display panel (PDP), a display element using micro electro mechanical system (MEMS), a digital micromirror device (DMD), a digital micro shutter (DMS), MIRASOL (registered trademark), an interferometric modulator display (IMOD) element, a MEMS shutter display element, an optical-interference-type MEMS display element, an electrowetting element, a piezoelectric ceramic display, a display device including a carbon nanotube, and the like. Other than the above, display media whose contrast, luminance, reflectivity, transmittance, or the like is changed by electrical or magnetic effect may be included. Note that examples of display devices having EL elements include an EL display. Examples of display devices including electron emitters are a field emission display (FED) and an SED-type flat panel display (SED: surface-conduction electron-emitter display). Examples of display devices including liquid crystal elements include a liquid crystal display (e.g., a transmissive liquid crystal display, a transflective liquid crystal display, a reflective liquid crystal display, a direct-view liquid crystal display, or a projection liquid crystal display). Examples of a display device including electronic ink, Electronic Liquid Powder (registered trademark), or an electrophoretic element include electronic paper. In the case of a transflective liquid crystal display or a reflective liquid crystal display, some of or all of pixel electrodes function as reflective electrodes. For example, some or all of pixel electrodes are formed to contain aluminum, silver, or the like. For example, some or all of pixel electrodes are formed to contain aluminum, silver, or the like. In such a case, a memory circuit such as an SRAM can be provided under the reflective electrodes, leading to lower power consumption. Note that in the case of using an LED, graphene or graphite may be provided under an electrode or a nitride semiconductor of the LED. Graphene or graphite may be a multilayer film in which a plurality of layers are stacked. As described above, provision of graphene or graphite enables easy formation of a nitride semiconductor film thereover, such as an n-type GaN semiconductor layer including crystals. Furthermore, a p-type GaN semiconductor layer including crystals or the like can be provided thereover, and thus the LED can be formed. Note that an AlN layer may be provided between the n-type GaN semiconductor layer including crystals and graphene or graphite. The GaN semiconductor layers included in the LED may be formed by MOCVD. Note that when the graphene is provided, the GaN semiconductor layers included in the LED can also be formed by a sputtering method.

Note that one embodiment of the present invention is not limited to the above technical field. Non-limiting examples of one embodiment of the present invention are described: a structure in which a pixel includes two or more subpixels and is electrically connected to two or more gate lines; a structure in which one pixel includes a plurality of subpixels which is connected to different gate lines; and the like. As another example, a plurality of subpixels included in a pixel may be connected to the same gate line.

At least part of this embodiment can be implemented in combination with any of the embodiments described in this specification as appropriate.

Embodiment 2

In this embodiment, a touch panel of one embodiment of the present invention will be described.

Structure Example

Figure 19A:
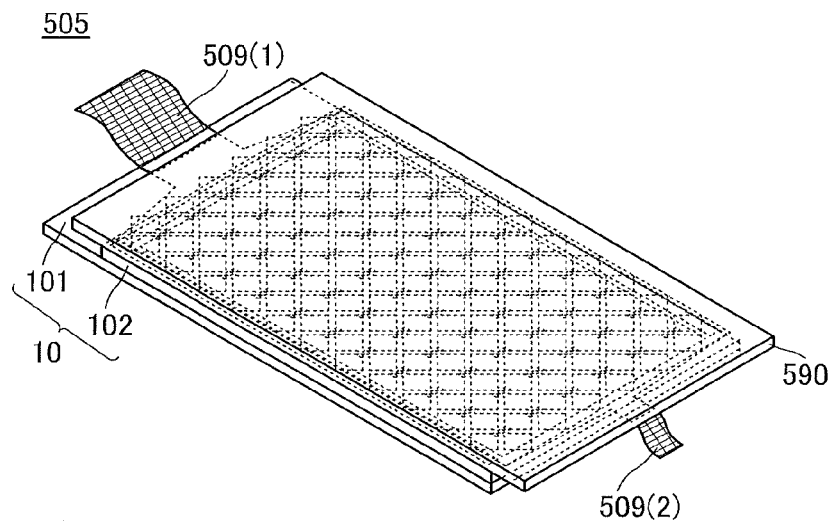
FIGS. 19A and 19B illustrate a structure example of a touch panel of one embodiment.
Figure 19B:
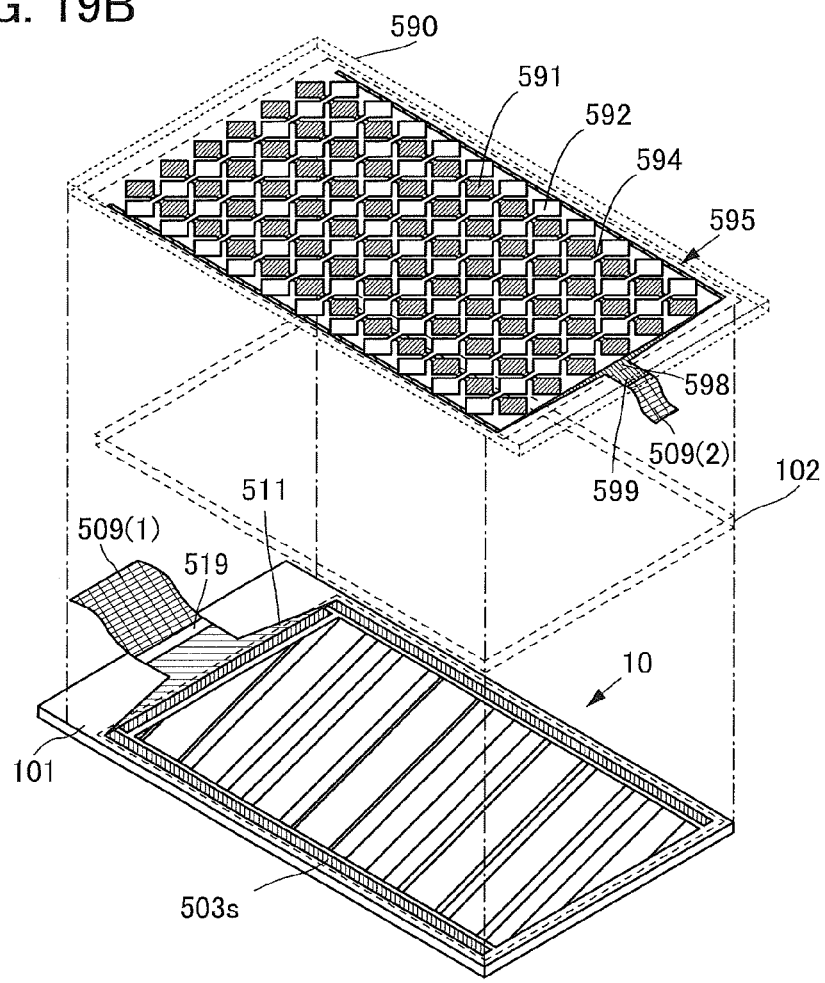

FIGS. 19A and 19B are perspective views of a touch panel 505. FIG. 19B a schematic perspective developed view of FIG. 19A. Note that only main components are illustrated for simplicity.

The touch panel 505 includes the display device 10 and a substrate 590 having a touch sensor 595.

Embodiment 1 can be referred to for the structure of the display device 10. The display device 10 here includes an FPC 509(1), a terminal portion 519, a wiring 511, and a circuit 503s, for example.

The substrate 590 includes the touch sensor 595 and a plurality of wirings 598 electrically connected to the touch sensor 595. The plurality of wirings 598 are led to a peripheral portion of the substrate 590, and part of the plurality of wirings 598 form a terminal. The terminal is electrically connected to an FPC 509(2). Note that in FIG. 19B, electrodes, wirings, and the like of the touch sensor 595 provided on the back side of the substrate 590 (on the substrate 101 side) are indicated by solid lines for clarity.

As the touch sensor 595, a capacitive touch sensor can be used. Examples of the capacitive touch sensor are a surface capacitive touch sensor and a projected capacitive touch sensor.

Examples of the projected capacitive touch sensor are a self-capacitive touch sensor and a mutual capacitive touch sensor, which differ mainly in the driving method. The use of a mutual capacitive touch sensor is preferable because multiple points can be sensed simultaneously.

An example of using a projected capacitive touch sensor will be described below.

Note that a variety of sensors that can sense the closeness or the contact of a sensing target such as a finger can be used.

The projected capacitive touch sensor 595 includes electrodes 591 and electrodes 592. The electrodes 591 are electrically connected to any of the plurality of wirings 598, and the electrodes 592 are electrically connected to any of the other wirings 598.

The electrodes 592 each have a shape of a plurality of quadrangles arranged in one direction with one corner of a quadrangle connected to one corner of another quadrangle as illustrated in FIGS. 19A and 19B.

The electrodes 591 each have a quadrangular shape and are arranged in a direction intersecting with the direction in which the electrodes 592 extend.

A wiring 594 electrically connects two electrodes 591 between which one electrode 592 is positioned. The intersecting area of the electrode 592 and the wiring 594 is preferably as small as possible. Such a structure enables a reduction in the area of a region where the electrodes are not provided, reducing unevenness in transmittance. As a result, unevenness in luminance of light from the touch sensor 595 can be reduced.

Note that the shapes of the electrodes 591 and the electrodes 592 are not limited to the above-mentioned shapes and can be any of a variety of shapes. For example, a plurality of electrodes 591 may be arranged so that the space between two adjacent electrodes are reduced as much as possible, and a plurality of electrodes 592 may be arranged so as to intersect with the electrodes 591 with an insulating layer provided between the adjacent electrodes 592. In that case, two adjacent electrodes may be spaced apart from each other. Moreover, between the two adjacent electrodes 592, a dummy electrode which is electrically insulated from these electrodes is preferably provided, whereby the area of a region having a different transmittance can be reduced.

The touch sensor 595 includes the substrate 590, the electrodes 591 and the electrodes 592 provided in a staggered arrangement on the substrate 590, an insulating layer covering the electrodes 591 and the electrodes 592, and the wiring 594 that electrically connects the adjacent electrodes 591 to each other.

An adhesive layer 597 bonds the substrate 590 to the substrate 570 so that the touch sensor 595 overlaps with the display portion 501.

The electrodes 591 and the electrodes 592 are formed using a light-transmitting conductive material. As the light-transmitting conductive material, a conductive oxide such as indium oxide, indium tin oxide, indium zinc oxide, zinc oxide, or zinc oxide to which gallium is added can be used. Note that a film including graphene may be used as well. The film containing graphene can be formed, for example, by reducing a film containing graphene oxide. As a reducing method, a method with application of heat or the like can be employed.

The electrodes 591 and 592 may have a mesh shape such that mesh openings and light-emitting elements overlap with each other. In this case, a low-conductive metal or alloy, for example, can be used for the electrodes 591 and 592.

Note that, for example, a low-resistance material is preferably used as a material of conductive films such as the electrode 591 and the electrode 592, i.e., a wiring and an electrode in the touch panel. For example, silver, copper, aluminum, a carbon nanotube, graphene, a metal halide (e.g., a silver halide), or the like may be used. Alternatively, a metal nanowire including a number of conductors with an extremely small width (for example, a diameter of several nanometers) may be used. Further alternatively, a net-like metal mesh with a conductor may be used. For example, an Ag nanowire, a Cu nanowire, an Al nanowire, an Ag mesh, a Cu mesh, or an Al mesh may be used. In the case of using an Ag nanowire, light transmittance of 89% or more and a sheet resistance of 40 ohm/square or more and 100 ohm/square or less can be achieved. Note that because of having high transmittance, a metal nanowire, a metal mesh, a carbon nanotube, graphene, or the like may be used as an electrode of the display element, such as a pixel electrode or a common electrode.

One of the electrodes 592 extends in one direction, and a plurality of electrodes 592 are provided in the form of stripes.

The wiring 594 intersects with the electrodes 592.

Adjacent electrodes 591 are provided with one of the electrodes 592 provided therebetween. The wiring 594 electrically connects the adjacent electrodes 591.

Note that the plurality of electrodes 591 is not necessarily arranged in the direction orthogonal to one electrode 592 and may be arranged to intersect with one electrode 592 at an angle of less than 90°.

One wiring 598 is electrically connected to any of the electrodes 591 and the electrodes 592. Part of the wiring 598 serves as a terminal. For the wiring 598, a metal material such as aluminum, gold, platinum, silver, nickel, titanium, tungsten, chromium, molybdenum, iron, cobalt, copper, or palladium or an alloy material containing any of these metal materials can be used.

In addition, the connection layer 599 electrically connects the wiring 598 with the FPC 509(2). For the connection layer 599, various kinds of anisotropic conductive film or paste or the like can be used.

Although the substrate 590 having the touch sensor 595 overlaps with the display device 10 in this non-limiting example, the touch sensor 595 may be formed on a surface of the second substrate 102 opposite to the first substrate 101. The touch sensor 595 may be provided between the first substrate 101 and the second substrate 102, in which case the touch sensor 595 is preferably provided between a coloring layer and the second substrate 102, for example.

The use of flexible materials for the first substrate 101, the second substrate 102, and the substrate 590 can form a flexible touch panel in which the pixel portion can be bent.

At least part of this embodiment can be implemented in combination with any of the embodiments described in this specification as appropriate.

Embodiment 3

In this embodiment, an example of a method for operating the touch panel of one embodiment of the present invention is described with reference to drawings.

Example of Sensing Method of Sensor

Figure 20A:
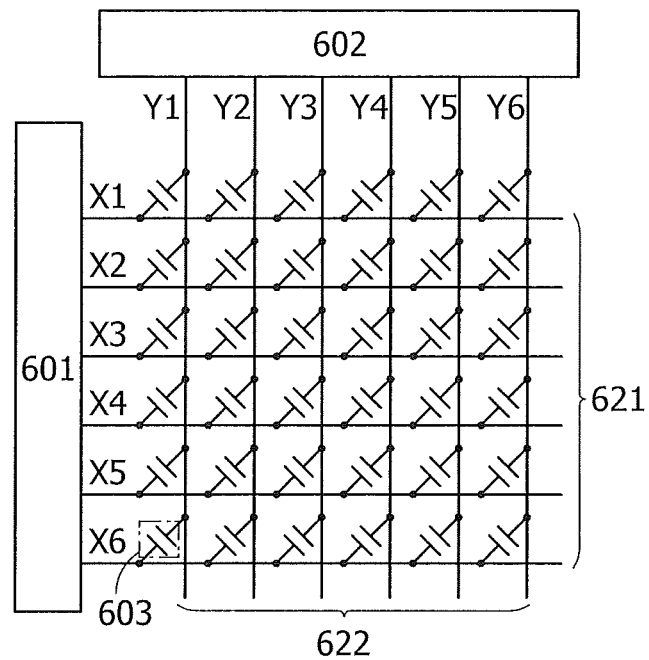
FIGS. 20A and 20B are a block diagram and a timing chart of a touch sensor of one embodiment.

FIG. 20A is a block diagram illustrating the structure of a mutual capacitive touch sensor. FIG. 20A illustrates a pulse voltage output circuit 601 and a current sensing circuit 602. Note that in FIG. 20A, six wirings X1 to X6 represent the electrodes 621 to which a pulse voltage is applied, and six wirings Y1 to Y6 represent the electrodes 622 that detect changes in current. FIG. 20A also illustrates a capacitor 603 that is formed between the electrodes 621 and 622. Note that functional replacement between the electrodes 621 and 622 is possible.

The pulse voltage output circuit 601 is a circuit for sequentially applying a pulse voltage to the wirings X1 to X6. By application of a pulse voltage to the wirings X1 to X6, an electric field is generated between the electrodes 621 and 622 of the capacitor 603. When the electric field between the electrodes is shielded, for example, a change occurs in the capacitor 603 (mutual capacitance). The approach or contact of a sensing target can be sensed by utilizing this change.

The current sensing circuit 602 is a circuit for detecting changes in current flowing through the wirings Y1 to Y6 that are caused by the change in mutual capacitance in the capacitor 603. No change in current value is detected in the wirings Y1 to Y6 when there is no approach or contact of a sensing target, whereas a decrease in current value is detected when mutual capacitance is decreased owing to the approach or contact of a sensing target. Note that an integrator circuit or the like is used for sensing of current values.

Figure 20B:
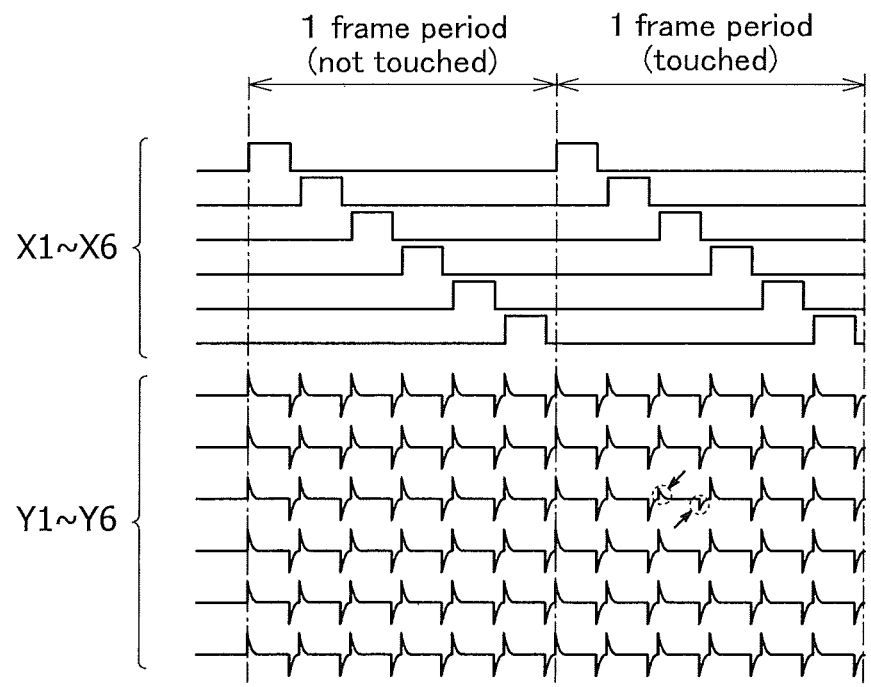

FIG. 20B is a timing chart showing input and output waveform is in the mutual capacitive touch sensor illustrated in FIG. 20A. In FIG. 20B, sensing of a sensing target is performed in all the rows and columns in one frame period. FIG. 20B shows a period when a sensing target is not sensed (not touched) and a period when a sensing target is sensed (touched). Sensed current values of the wirings Y1 to Y6 are shown as the waveforms of voltage values.

A pulse voltage is sequentially applied to the wirings X1 to X6, and the waveforms of the wirings Y1 to Y6 change in accordance with the pulse voltage. When there is no approach or contact of a sensing target, the waveforms of the wirings Y1 to Y6 change in accordance with changes in the voltages of the wirings X1 to X6. The current value is decreased at the point of approach or contact of a sensing target and accordingly the waveform of the voltage value changes.

By detecting a change in mutual capacitance in this manner, the approach or contact of a sensing target can be sensed.

Figure 21:
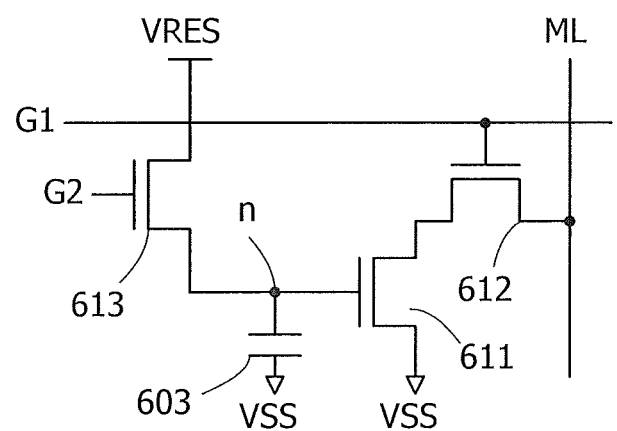
FIG. 21 is a circuit diagram of a touch sensor of one embodiment.

Although FIG. 20A is a passive type touch sensor in which only the capacitor 603 is provided at the intersection of wirings as a touch sensor, an active type touch sensor including a transistor and a capacitor may be used. FIG. 21 is a sensor circuit included in an active matrix type touch sensor.

The sensor circuit includes the capacitor 603 and transistors 611, 612, and 613. A signal G2 is input to a gate of the transistor 613. A voltage VRES is applied to one of a source and a drain of the transistor 613, and one electrode of the capacitor 603 and a gate of the transistor 611 are electrically connected to the other of the source and the drain of the transistor 613. One of a source and a drain of the transistor 611 is electrically connected to one of a source and a drain of the transistor 612, and a voltage VSS is applied to the other of the source and the drain of the transistor 611. A signal G1 is input to a gate of the transistor 612, and a wiring ML is electrically connected to the other of the source and the drain of the transistor 612. The voltage VSS is applied to the other electrode of the capacitor 603.

Next, the operation of the sensor circuit will be described. First, a potential for turning on the transistor 613 is supplied as the signal G2, and a potential with respect to the voltage VRES is thus applied to the node n connected to the gate of the transistor 611. Then, a potential for turning off the transistor 613 is applied as the signal G2, whereby the potential of the node n is maintained.

Then, mutual capacitance of the capacitor 603 changes owing to the approach or contact of a sensing target such as a finger, and accordingly the potential of the node n is changed from VRES.

In reading operation, a potential for turning on the transistor 612 is supplied as the signal G1. A current flowing through the transistor 611, that is, a current flowing through the wiring ML is changed in accordance with the potential of the node n. By sensing this current, the approach or contact of a sensing target can be sensed.

It is preferred that the transistors 611, 612, and 613 each include an oxide semiconductor in a semiconductor layer where a channel is formed. In particular, by using an oxide semiconductor in a semiconductor layer where a channel of the transistor 613 is formed, the potential of the node n can be held for a long time and the frequency of operation (refresh operation) of resupplying VRES to the node n can be reduced.

At least part of this embodiment can be implemented in combination with any of the embodiments described in this specification as appropriate.

Embodiment 4

In this embodiment, electronic devices and lighting devices of one embodiment of the present invention will be described with reference to drawings.

Highly reliable electronic devices and highly reliable lighting devices can be fabricated using the display device of one embodiment of the present invention. Highly reliable electronic devices and highly reliable lighting devices having a curved surface can be fabricated using the display device of one embodiment of the present invention. Highly reliable electronic devices and highly reliable lighting devices having flexibility can be fabricated using the display device of one embodiment of the present invention.

Examples of electronic devices include a television set (also referred to as a television or a television receiver), a monitor of a computer or the like, a digital camera, a digital video camera, a digital photo frame, a mobile phone (also referred to as a mobile phone device), a portable game machine, a portable information terminal, an audio reproducing device, a large-sized game machine such as a pinball machine, and the like.

The electronic device or the lighting device of one embodiment of the present invention has flexibility and therefore can be incorporated along a curved inside-outside wall surface of a house or a building or a curved interior/exterior surface of a car.

Furthermore, the electronic device of one embodiment of the present invention may include a secondary battery. It is preferable that the secondary battery be capable of being charged by non-contact power transmission.

Examples of the secondary battery include a lithium ion secondary battery such as a lithium polymer battery using a gel electrolyte (lithium ion polymer battery), a nickel-hydride battery, a nickel-cadmium battery, an organic radical battery, a lead-acid battery, an air secondary battery, a nickel-zinc battery, and a silver-zinc battery.

The electronic device of one embodiment of the present invention may include an antenna. When a signal is received by the antenna, the electronic device can display an image, data, or the like on a display portion. When the electronic device includes a secondary battery, the antenna may be used for contactless power transmission.

FIGS. 22A, 22B, 22C1, 22C2, 22D, and 22E illustrate an example of an electronic device including a display portion 7000 with a curved surface. The display surface of the display portion 7000 is bent, and images can be displayed on the bent display surface. The display portion 7000 may be flexible.

The display portion 7000 can be formed using the display device or the like of one embodiment of the present invention. One embodiment of the present invention makes it possible to provide a highly reliable electronic device having a curved display portion.

Figure 22A:
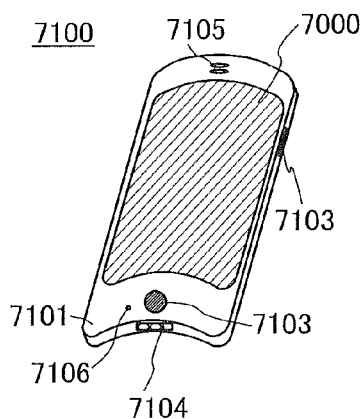

FIG. 22A illustrates an example of a mobile phone. A mobile phone 7100 includes a housing 7101, the display portion 7000, operation buttons 7103, an external connection port 7104, a speaker 7105, a microphone 7106, and the like.

The mobile phone 7100 illustrated in FIG. 22A includes a touch sensor in the display portion 7000. Moreover, operations such as making a call and inputting a letter can be performed by touch on the display portion 7000 with a finger, a stylus, or the like.

With the operation buttons 7103, power ON or OFF can be switched. In addition, types of images displayed on the display portion 7000 can be switched; switching images from a mail creation screen to a main menu screen, for example.

Figure 22B:
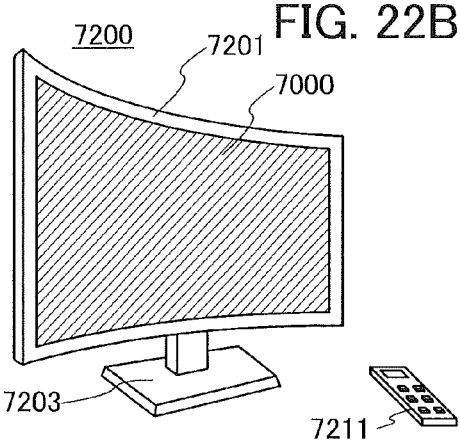
Figure 22B:
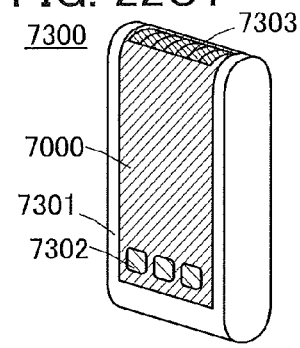

FIG. 22B illustrates an example of a television set. In the television device 7200, the display portion 7000 is incorporated into the housing 7201. Here, the housing 7201 is supported by a stand 7203.

The television set 7200 illustrated in FIG. 22B can be operated with an operation switch of the housing 7201 or a separate remote controller 7211. The display portion 7000 may include a touch sensor. The display portion 7000 can be operated by touching the display portion with a finger or the like. The remote controller 7211 may be provided with a display portion for displaying data output from the remote controller 7211. With operation buttons or a touch panel of the remote controller 7211, channels and volume can be controlled and images displayed on the display portion 7000 can be controlled.

The television set 7200 is provided with a receiver, a modem, and the like. A general television broadcast can be received with the receiver. When the television set is connected to a communication network with or without wires via the modem, one-way (from a transmitter to a receiver) or two-way (between a transmitter and a receiver or between receivers) data communication can be performed.

FIGS. 22C1, 22C2, 22D, and 22E illustrate an example of a portable information terminal. Each of the portable information terminals includes a housing 7301 and the display portion 7000. Each of the portable information terminals may also include an operation button, an external connection port, a speaker, a microphone, an antenna, a battery, or the like. The display portion 7000 is provided with a touch sensor. An operation of the portable information terminal can be performed by touching the display portion 7000 with a finger, a stylus, or the like.

Figure 22D:
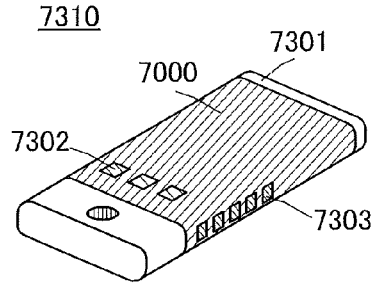
Figure 22E:
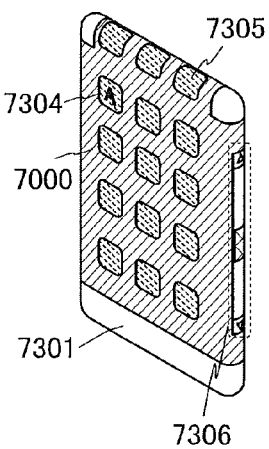
Figure 22E:
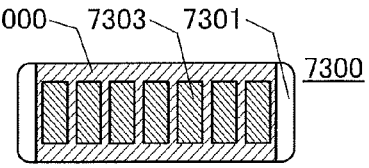

FIG. 22C1 is a perspective view of a portable information terminal 7300. FIG. 22C2 is a top view of the portable information terminal 7300. FIG. 22D is a perspective view of a portable information terminal 7310. FIG. 22E is a perspective view of a portable information terminal 7320.

Each of the portable information terminals functions as, for example, one or more of a telephone set, a notebook, and an information browsing system. Specifically, each of the portable information terminals can be used as a smartphone. Each of the portable information terminals is capable of executing a variety of applications such as mobile phone calls, e-mailing, reading and editing texts, music reproduction, Internet communication, and a computer game, for example.

The portable information terminals 7300, 7310, and 7320 can display characters and image information on its plurality of surfaces. For example, as illustrated in FIGS. 22C1 and 22D, three operation buttons 7302 can be displayed on one surface, and information 7303 indicated by a rectangle can be displayed on another surface. FIG. 22C2 illustrates an example in which information 7303 is displayed at the top of the portable information terminal. FIG. 22D illustrates an example in which information 7303 is displayed on the side of the portable information terminal. Information may be displayed on three or more surfaces of the portable information terminal. FIG. 22E illustrates an example where information 7304, information 7305, and information 7306 are displayed on different surfaces.

Examples of the information include notification from a social networking service (SNS), display indicating reception of an e-mail or an incoming call, the title of an e-mail, the sender of an e-mail, the date, the time, remaining battery, the reception strength of an antenna, and the like. Alternatively, the operation button, an icon, or the like may be displayed instead of the information.

For example, a user of the portable information terminal 7300 can see the display (here, the information 7303) with the portable information terminal 7300 put in a breast pocket of his/her clothes.

Specifically, a caller's phone number, name, or the like of an incoming call is displayed in a position that can be seen from above the portable information terminal 7300. Thus, the user can see the display without taking out the portable information terminal 7300 from the pocket and decide whether to answer the call.

Figure 22F:
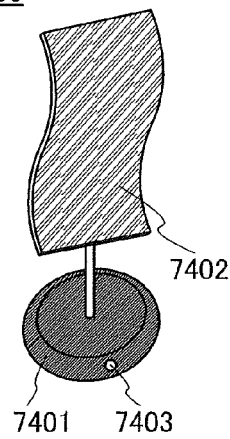
Figure 22G:
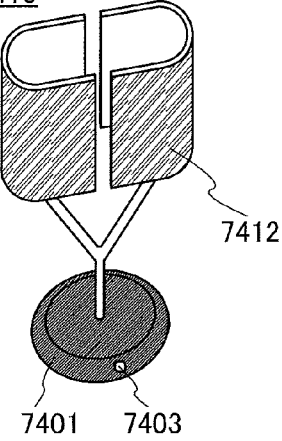
Figure 22H:
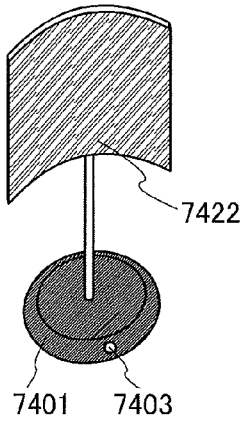

FIGS. 22F to 22H each illustrate an example of a lighting device having a curved light-emitting portion.

The light-emitting portion included in each of the lighting devices illustrated in FIGS. 22F to 22H can be manufactured using the display device or the like of one embodiment of the present invention. One embodiment of the present invention makes it possible to provide a highly reliable lighting device having a curved light-emitting portion.

A lighting device 7400 illustrated in FIG. 22F includes a light-emitting portion 7402 with a wave-shaped light-emitting surface and thus is a good-design lighting device.

A light-emitting portion 7412 included in the lighting device 7410 illustrated in FIG. 22G has two convex-curved light-emitting portions symmetrically placed. Thus, all directions can be illuminated with the lighting device 7410 as a center.

A lighting device 7420 illustrated in FIG. 22H includes a concave-curved light-emitting portion 7422. This is suitable for illuminating a specific range because light emitted from the concave-curved light-emitting portion 7422 is collected to the front of the lighting device 7420. In addition, with this structure, a shadow is less likely to be produced.

The light-emitting portion included in each of the lighting devices 7400, 7410 and 7420 may be flexible. The light-emitting portion may be fixed on a plastic member, a movable frame, or the like so that an emission surface of the light-emitting portion can be bent freely depending on the intended use.

The lighting devices 7400, 7410, and 7420 each include a stage 7401 provided with an operation switch 7403 and a light-emitting portion supported by the stage 7401.

Note that although the lighting device in which the light-emitting portion is supported by the stage is described as an example here, a housing provided with a light-emitting portion can be fixed on a ceiling or suspended from a ceiling. Since the light-emitting surface can be curved, the light-emitting surface can be deformed to have a depressed shape, whereby a particular region can be brightly illuminated, or the light-emitting surface is deformed to have a projecting shape, whereby a whole room can be brightly illuminated.

FIGS. 23A1, 23A2, 23B, 23C, 23D, 23E, 23F, 23G, 23H, and 23I each illustrate an example of a portable information terminal including a display portion 7001 having flexibility.

The display portion 7001 included in each of the portable information terminals is manufactured using the light-emitting device, the display device, the input-output device, or the like of one embodiment of the present invention. For example, a light-emitting device, a display device, or an input-output device that can be bent with a radius of curvature of greater than or equal to 0.01 mm and less than or equal to 150 mm can be used. The display portion 7001 may include a touch sensor so that the portable information terminal can be operated by touching the display portion 7001 with a finger or the like. One embodiment of the present invention makes it possible to provide an electronic device including a display portion having flexibility with a high yield.

FIGS. 23A1 and 23A2 are a perspective views and a side view illustrating an example of the portable information terminal. A portable information terminal 7500 includes a housing 7501, the display portion 7001, a display portion tab 7502, operation buttons 7503, or the like.

The portable information terminal 7500 includes a rolled flexible display portion 7001 in the housing 7501.

The portable information terminal 7500 can receive a video signal with a control portion incorporated therein and can display the received video on the display portion 7001. The portable information terminal 7500 incorporates a battery. A terminal portion for connecting a connector may be included in the housing 7501 so that a video signal or power can be directly supplied from the outside with a wiring.

By pressing the operation buttons 7503, power ON/OFF, switching of displayed videos, and the like can be performed. Although FIGS. 23A1, 23A2, and 23B illustrate an example where the operation buttons 7503 are positioned on a side surface of the portable information terminal 7500, one embodiment of the present invention is not limited thereto. The operation buttons 7503 may be placed on a display surface (a front surface) or a rear surface of the portable information terminal 7500.

Figure 23B:
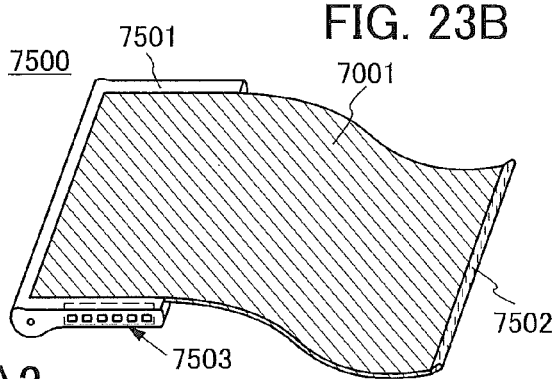

FIG. 23B illustrates the portable information terminal 7500 in a state where the display portion 7001 is pulled out with the display portion tab 7502. Videos can be displayed on the display portion 7001 in this state. In addition, the portable information terminal 7500 may perform different displays in the state where part of the display portion 7001 is rolled as shown in FIG. 23A1 and in the state where the display portion 7001 is pulled out as shown in FIG. 23B. For example, in the state shown in FIG. 23A1, the rolled portion of the display portion 7001 is put in a non-display state, which results in a reduction in power consumption of the portable information terminal 7500.

A reinforcement frame may be provided for a side portion of the display portion 7001 so that the display portion 7001 has a flat display surface when pulled out.

Note that in addition to this structure, a speaker may be provided for the housing so that sound is output with an audio signal received together with a video signal.

Figures 23C, 23D, 23E:
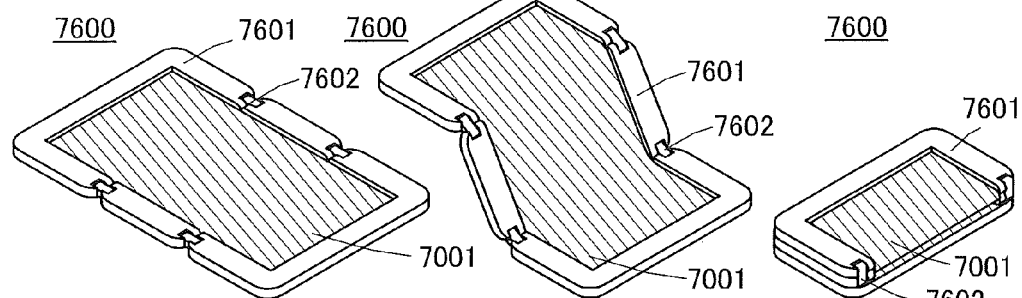

FIGS. 23C to 23E illustrate an example of a foldable portable information terminal. FIG. 23C illustrates a portable information terminal 7600 that is opened. FIG. 23D illustrates the portable information terminal 7600 that is being opened or being folded. FIG. 23E illustrates the portable information terminal 7600 that is folded. The portable information terminal 7600 is highly portable when folded, and is highly browsable when opened because of a seamless large display area.

A display portion 7001 is supported by three housings 7601 joined together by hinges 7602. By folding the portable information terminal 7600 at a connection portion between two housings 7601 with the hinges 7602, the portable information terminal 7600 can be reversibly changed in shape from an opened state to a folded state.

FIGS. 23F and 23G illustrate an example of a foldable portable information terminal. FIG. 23F illustrates a portable information terminal 7650 that is folded so that the display portion 7001 is on the inside. FIG. 23G illustrates the portable information terminal 7650 that is folded so that the display portion 7001 is on the outside. The portable information terminal 7650 includes the display portion 7001 and a non-display portion 7651. When the portable information terminal 7650 is not used, the portable information terminal 7650 is folded so that the display portion 7001 is on the inside, whereby the display portion 7001 can be prevented from being contaminated or damaged.

Figure 23H:
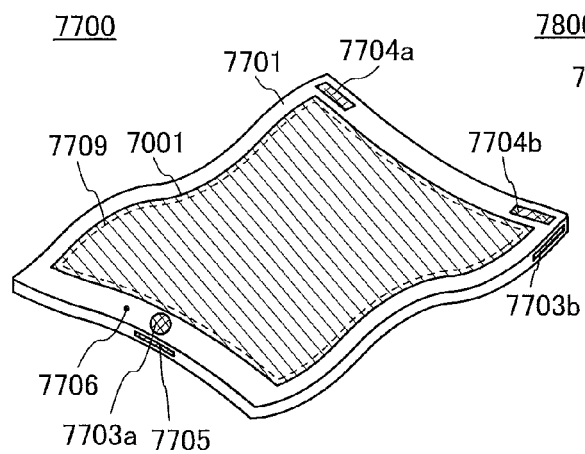

FIG. 23H illustrates an example of a flexible portable information terminal. A portable information terminal 7700 includes a housing 7701 and the display portion 7001. The portable information terminal 7700 may include buttons 7703a and 7703b which serve as input means, speakers 7704a and 7704b which serve as sound output means, an external connection port 7705, a microphone 7706, or the like. A flexible battery 7709 can be mounted on the portable information terminal 7700. The battery 7709 may be arranged to overlap with the display portion 7001, for example.

The housing 7701, the display portion 7001, the battery 7709 are flexible. Thus, it is easy to curve the portable information terminal 7700 into a desired shape or to twist the portable information terminal 7700. For example, the portable information terminal 7700 can be curved so that the display portion 7001 is on the inside or in the outside. The portable information terminal 7700 can be used in a rolled state. Since the housing 7701 and the display portion 7001 can be transformed freely in this manner, the portable information terminal 7700 is less likely to be broken even when the portable information terminal 7700 falls down or external stress is applied to the portable information terminal 7700.

The portable information terminal 7700 can be used effectively in various situations because the portable information terminal 7700 is lightweight. For example, the portable information terminal 7700 can be used in the state where the upper portion of the housing 7701 is suspended by a clip or the like, or in the state where the housing 7701 is fixed to a wall by magnets or the like.

Figure 23I:
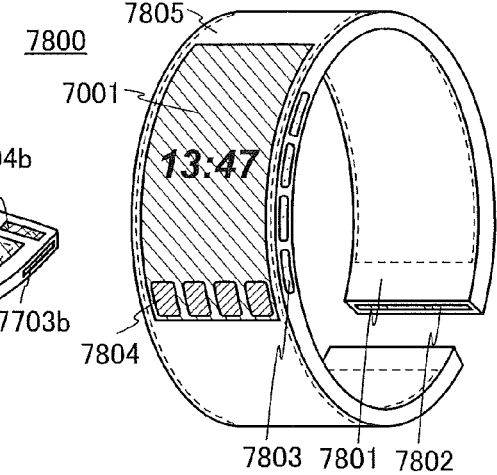

FIG. 23I illustrates an example of a wrist-watch-type portable information terminal. The portable information terminal 7800 includes a band 7801, the display portion 7001, an input-output terminal 7802, operation buttons 7803, or the like. The band 7801 has a function of a housing. A flexible battery 7805 can be mounted on the portable information terminal 7800. The battery 7805 may overlap with the display portion 7001 and the band 7801, for example.

The band 7801, the display portion 7001, and the battery 7805 have flexibility. Thus, the portable information terminal 7800 can be easily curved to have a desired shape.

With the operation buttons 7803, a variety of functions such as time setting, ON/OFF of the power, ON/OFF of wireless communication, setting and cancellation of silent mode, and setting and cancellation of power saving mode can be performed. For example, the functions of the operation button 7803 can be set freely by the operating system incorporated in the portable information terminal 7800.

By touching an icon 7804 displayed on the display portion 7001 with a finger or the like, application can be started.

The portable information terminal 7800 can employ near field communication that is a communication method based on an existing communication standard. In that case, for example, mutual communication between the portable information terminal 7800 and a headset capable of wireless communication can be performed, and thus hands-free calling is possible.

In the case where the input-output terminal 7802 is included in the portable information terminal 7800, data can be directly transmitted to and received from another information terminal via a connector. Charging through the input-output terminal 7802 is also possible. Note that charging of the portable information terminal described as an example in this embodiment can be performed by non-contact power transmission without using the input-output terminal.

Figure 24A:
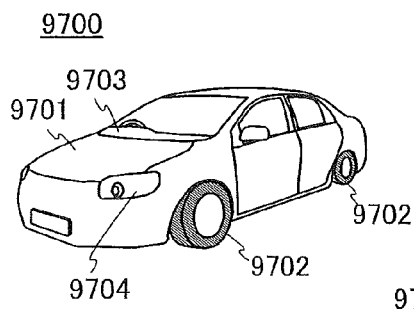
FIGS. 24A, 24B, 24C, 24D, and 24E illustrate an example of an electronic device of one embodiment.
Figure 24B:
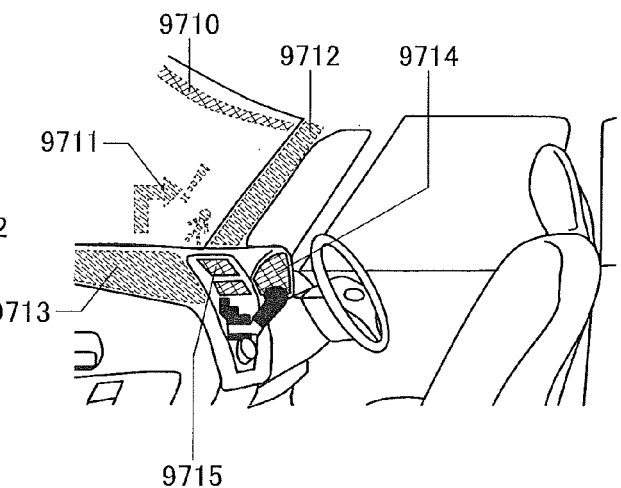

FIG. 24A is an external view of an automobile 9700. FIG. 24B illustrates a driver's seat of the automobile 9700. The automobile 9700 includes a car body 9701, wheels 9702, a dashboard 9703, lights 9704, and the like. The display device of one embodiment of the present invention can be used in a display portion or the like of the automobile 9700. For example, the display device of one embodiment of the present invention can be used in display portions 9710 to 9715 illustrated in FIG. 24B.

The display portion 9710 and the display portion 9711 are display devices provided in an automobile windshield. The display device of one embodiment of the present invention can be a see-through display device, through which the opposite side can be seen, by using a light-transmitting conductive material for its electrodes. Such a see-through display device does not hinder driver's vision during driving the automobile 9700. Therefore, the display device of one embodiment of the present invention can be provided in the windshield of the automobile 9700. Note that in the case where a transistor or the like for driving the display device is provided in the display device, a transistor having light-transmitting properties, such as an organic transistor using an organic semiconductor material or a transistor using an oxide semiconductor, is preferably used.

The display portion 9712 is a display device provided on a pillar portion. For example, an image taken by an imaging unit provided in the car body is displayed on the display portion 9712, whereby the view hindered by the pillar portion can be compensated. The display portion 9713 is a display device provided on the dashboard. For example, an image taken by an imaging unit provided in the car body is displayed on the display portion 9713, whereby the view hindered by the dashboard can be compensated. That is, by displaying an image taken by an imaging unit provided on the outside of the automobile, blind areas can be eliminated and safety can be increased. Displaying an image to compensate for the area which a driver cannot see, makes it possible for the driver to confirm safety easily and comfortably.

Figure 24C:
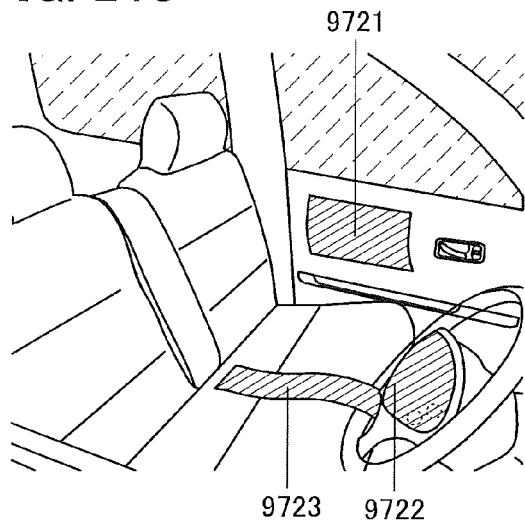

FIG. 24C illustrates the inside of a car in which bench seats are used for a driver seat and a front passenger seat. A display portion 9721 is a display device provided in a door portion. For example, an image taken by an imaging unit provided in the car body is displayed on the display portion 9721, whereby the view hindered by the door can be compensated. A display portion 9722 is a display device provided in a steering wheel. A display portion 9723 is a display device provided in the middle of a seating face of the bench seat. Note that the display device can be used as a seat heater by providing the display device on the seating face or backrest and by using heat generation of the display device as a heat source.

The display portion 9714, the display portion 9715, and the display portion 9722 can display a variety of kinds of information such as navigation data, a speedometer, a tachometer, a mileage, a fuel meter, a gearshift indicator, and air-condition setting. The content, layout, or the like of the display on the display portions can be changed freely by a user as appropriate. The information listed above can also be displayed on the display portions 9710 to 9713, 9721, and 9723. The display portions 9710 to 9715 and 9721 to 9723 can also be used as lighting devices. The display portions 9710 to 9715 and 9721 to 9723 can also be used as heating devices.

The display portion including the display device of one embodiment of the present invention can be flat, in which case the display device does not necessarily have a curved surface or flexibility.

Figure 24D:
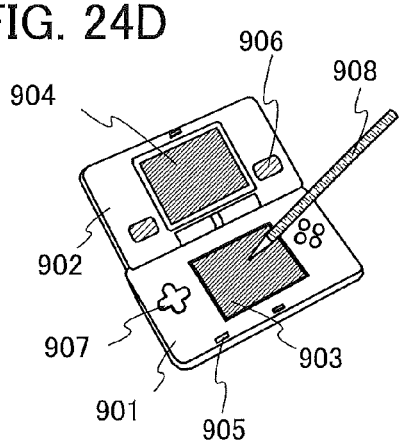

FIG. 24D illustrates a portable game console including a housing 901, a housing 902, a display portion 903, a display portion 904, a microphone 905, a speaker 906, an operation button 907, a stylus 908, and the like.

The portable gate console shown in FIG. 24D includes two display portions 903 and 904. Note that the number of display portions of an electronic device of one embodiment of the present invention is not limited to two and can be one or three or more as long as at least one display portion includes the display device of one embodiment of the present invention.

Figure 24E:
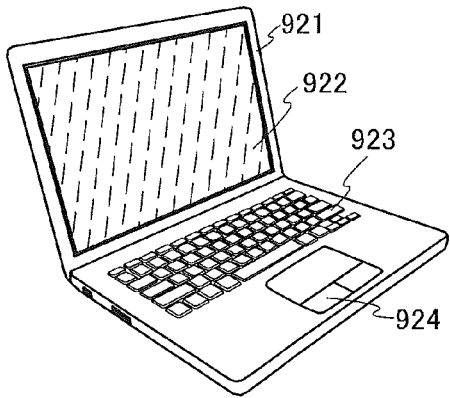

FIG. 24E illustrates a laptop personal computer, which includes a housing 921, a display portion 922, a keyboard 923, a pointing device 924, and the like.

The display device of one embodiment of the present invention can be used in the display portion 922.

Figure 25A:
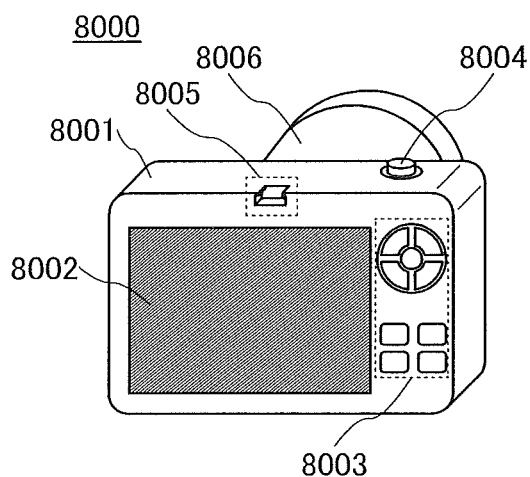
FIGS. 25A, 25B, and 25C illustrate an example of an electronic device of one embodiment.

FIG. 25A is an external view of a camera 8000. The camera 8000 includes a housing 8001, a display portion 8002, an operation button 8003, a shutter button 8004, and a connection portion 8005. A lens 8006 can be put on the camera 8000.

The connection portion 8005 includes an electrode to connect with a finder 8100, which is described below, a stroboscope, or the like.

Although the lens 8006 of the camera 8000 here is detachable from the housing 8001 for replacement, the lens 8006 may be included in a housing 8001.

Images can be taken at the touch of the shutter button 8004. In addition, images can be taken at the touch of the display portion 8002 which serves as a touch panel.

The display device of one embodiment of the present invention can be used in the display portion 8002.

Figure 25B:
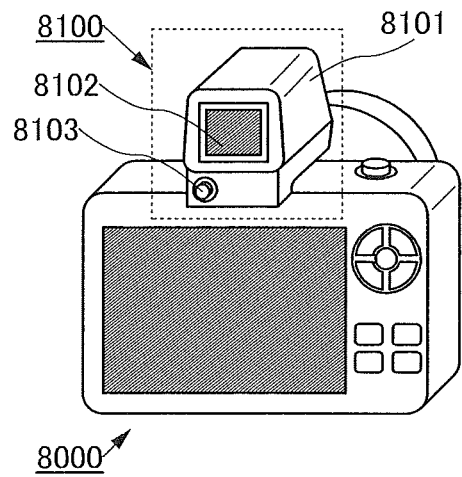

FIG. 25B shows the camera 8000 with the finder 8100 connected.

The finder 8100 includes a housing 8101, a display portion 8102, and a button 8103.

The housing 8101 includes a connection portion for the camera 8000 and the connection portion 8005, and the finder 8100 can be connected to the camera 8000. The connection portion includes an electrode, and an image or the like received from the camera 8000 through the electrode can be displayed on the display portion 8102.

The button 8103 has a function of a power button, and the display portion 8102 can be turned on and off by the button 8103.

The display device of one embodiment of the present invention can be used in the display portion 8102.

Although the camera 8000 and the finder 8100 are separate and detachable electronic devices in FIGS. 25A and 25B, the housing 8001 of the camera 8000 may include a finder having a display device of one embodiment of the present invention.

Figure 25C:
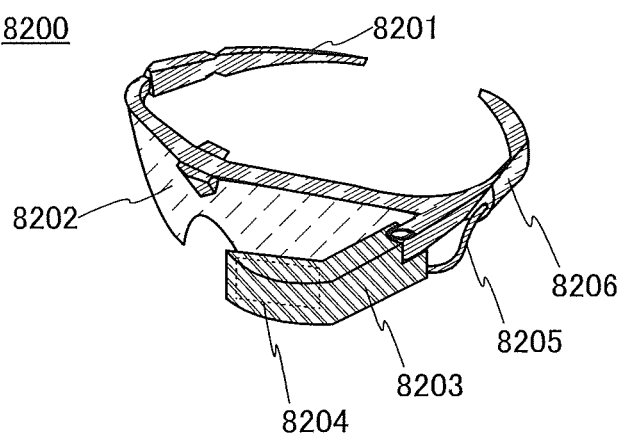

FIG. 25C illustrates an external view of a head-mounted display 8200.

The head-mounted display 8200 includes a mounting portion 8201, a lens 8202, a main body 8203, a display portion 8204, a cable 8205. The mounting portion 8201 includes a battery 8206.

Power is supplied from the battery 8206 to the main body 8203 through the cable 8205. The main body 8203 includes a wireless receiver or the like to receive video data, such as image data, and display it on the display portion 8204. The movement of the eyeball and the eyelid of a user is captured by a camera in the main body 8203 and then coordinates of the points the user looks at are calculated based on the captured data to utilize the eye point of the user as an input means.

The mounting portion 8201 may include a plurality of electrodes in contact with the user. The main body 8203 may be configured to sense current flowing through the electrodes with the movement of the user's eyeball to recognize the location of his eye. The main body 8203 may be configured to sense current flowing through the electrodes to monitor the user's pulse. The mounting portion 8201 may include sensors, such as a temperature sensor, a pressure sensor, or an acceleration sensor and display the user's biological information on the display portion 8204. The main body 8203 may be configured to sense the movement of the user's head to move an image displayed on the display portion 8204 in synchronization with the movement of the user's head.

The display device of one embodiment of the present invention can be used in the display portion 8204.

At least part of this embodiment can be implemented in combination with any of the embodiments described in this specification as appropriate.

Example 1

A display panel (a display device) of one embodiment of the present invention was fabricated in this example.

One glass substrate over which a transistor and a light-emitting element were formed and another glass substrate over which a coloring layer was formed were bonded together to fabricate the display panel in this example.

As the transistor, a transistor including a c-axis aligned crystalline oxide semiconductor (CAAC-OS) was used. Since the CAAC-OS, which is not amorphous, has few defect states, using the CAAC-OS can improve the reliability of the transistor. Moreover, since the CAAC-OS does not have a grain boundary, a stable and uniform film can be formed over a large area and stress that is caused by bending a flexible light-emitting device does not easily make a crack in a CAAC-OS film.

A CAAC-OS is a crystalline oxide semiconductor having c-axis alignment of crystals in a direction substantially perpendicular to the film surface. It has been found that oxide semiconductors have a variety of crystal structures other than a single-crystal structure. An example of such structures is a nano-crystal (nc) structure, which is an aggregate of nanoscale microcrystals. The crystallinity of a CAAC-OS structure is lower than that of a single-crystal structure and higher than that of an nc structure.

In this example, a channel-etched transistor including an In—Ga—Zn-based oxide was used. The transistor was fabricated over a glass substrate at a process temperature lower than 500° C.

In a method of fabricating an element such as a transistor directly over an organic resin such as a plastic substrate, the temperature of the process for fabricating the element needs to be lower than the upper temperature limit of the organic resin. In this example, the formation substrate is a glass substrate and the peeling layer, which is an inorganic film, has high heat resistance; thus, the transistor can be fabricated at a temperature equal to that when a transistor is fabricated over a glass substrate. Thus, the performance and reliability of the transistor can be easily secured.

Figure 26:
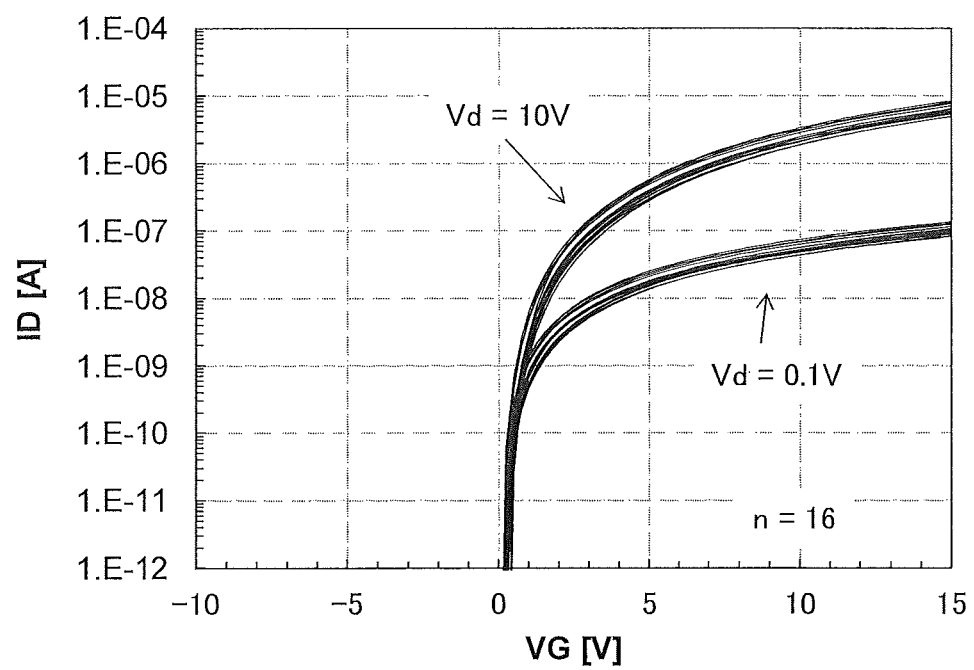
FIG. 26 shows electrical characteristics of a transistor of Example 1.

FIG. 26 shows Id-Vg characteristics of the transistors fabricated in this example. The transistor has a channel width of approximately 2 μm and a channel length of approximately 3.25 μm, to which 1.5-μm design rule is applied. Measurement was performed under two conditions at the source-drain voltages of 0.1 V and 10 V. As shown in FIG. 26, the transistor fabricated in this example shows normally-off characteristics and high uniformity despite its small channel length and width. In addition, the value of drain current is extremely small when the gate voltage is lower than or equal to 0 V.

As the light-emitting element, a tandem (stacked-layer) organic EL element emitting white light was used. The light-emitting element has a top emission structure, where light generated by the light-emitting element is extracted to the outside of the light-emitting panel through a color filter. The pixel configuration shown in FIG. 5A is used. The pixel layout shown in FIGS. 14A and 14B is used.

The size of a display portion of the fabricated display panel is 2.78 inches in diagonal, the number of pixels is 2560×1440, the resolution (pixel density) is 1058 ppi, the pixel size is 24 μm×24 μm (8 μm×RGB×24 μm), and the aperture ratio is 30.4%. The display panel has a frame frequency of 60 Hz, a built-in scan driver, and a COF-mounted source driver.

Figure 27A:
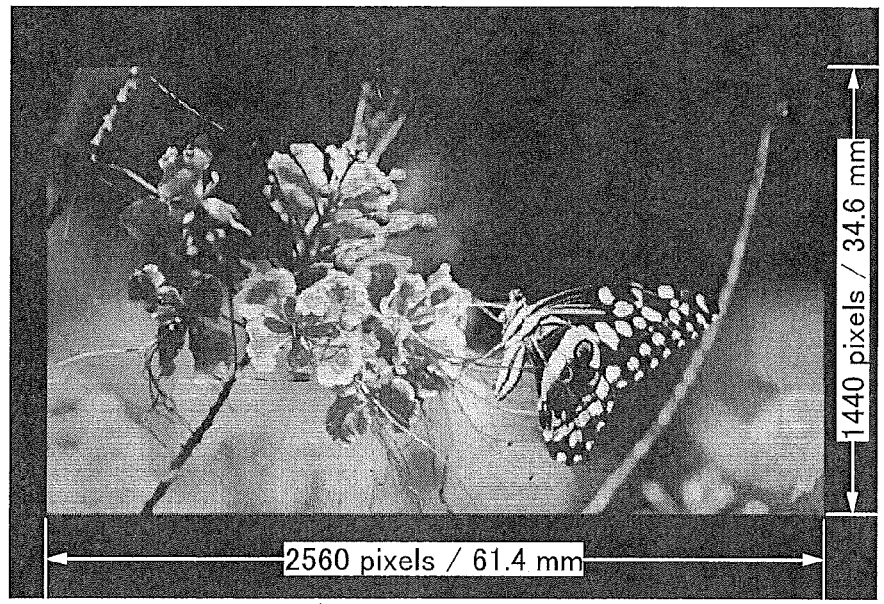
FIGS. 27A and 27B are photographs of a display panel of Example 1.

FIG. 27A is a photograph of the 1058-ppi display panel, which is an extremely high-resolution display using thin film transistors over a glass substrate.

Figure 27B:
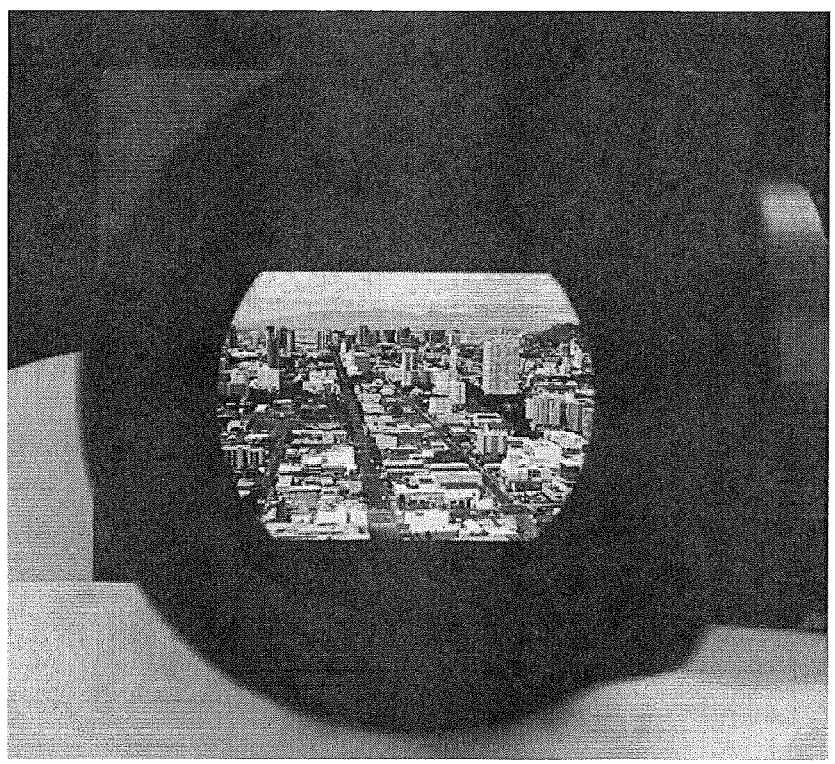

FIG. 27B is a photograph of the display panel taken through a lens. Since the resolution of the display panel is extremely high, the pixels are not visually distinguishable even when the image is enlarged, and a fine image can thus be displayed. The display panel can be used for a view finder, for example.

The above description thus far is Example 1.

Example 2

The color reproducibility of the display panel was examined in this example.

In a light-emitting element with a tandem structure in which two or more light-emitting units are stacked, an intermediate layer having high conductivity between two of the light-emitting units can reduce driving voltage. The increase in pixel resolution, however, leads to flow-in of current between adjacent pixels via the intermediate layer so that the adjacent pixel which should not emit emits light, which causes a problem of reduction in color reproducibility. Such a phenomenon can be referred to as crosstalk.

Figure 28:
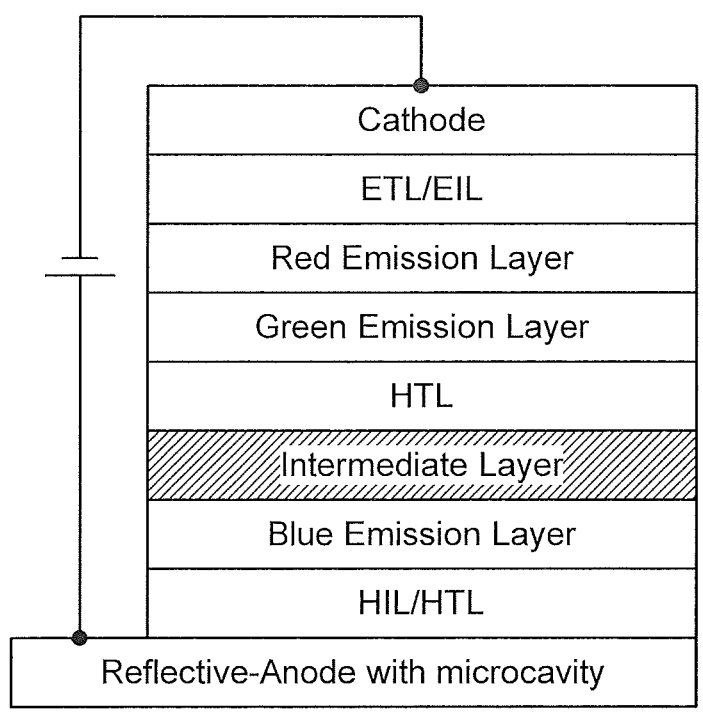
FIG. 28 shows a structure of a light-emitting element of Example 2.

FIG. 28 is a schematic view of a stacked-layer structure of the light-emitting element having a tandem structure in which two light-emitting units are stacked. The light-emitting element includes a light-emitting unit including a light-emitting layer containing a blue fluorescent material, and a light-emitting unit including a light-emitting layer containing a green phosphorescent material and a light-emitting layer containing a red phosphorescent material. The light-emitting element includes an intermediate layer between the light-emitting layer containing a blue fluorescent material and the light-emitting layer containing a green phosphorescent material.

The intermediate layer of the light-emitting element used in this example has a stacked structure of a layer containing lithium oxide with high conductivity and a layer containing an electron transport material (also referred to as an electron transport layer). The electron transport layer is between the layer containing lithium oxide and an anode.

Two measures to reduce the influence of crosstalk were taken in this example.

The first measure is to provide a gap spacer (corresponding to the spacer 215 in FIG. 16) between adjacent pixels. An expected effect is that the thickness of the intermediate layer is reduced and the resistance is accordingly increased on the side surfaces of the gap spacer, so that current flow-in between adjacent pixels via the intermediate layer can be suppressed.

The second measure is to change the structure of the intermediate layer. Although there was an idea for suppressing the influence of crosstalk that the thickness of a layer containing lithium oxide with high conductivity was reduced in order to reduce the conductivity of an intermediate layer, it was difficult to further reduce the thickness of the layer containing lithium oxide with high conductivity and fabricate a light-emitting element in terms of thickness control because of its extremely small thickness (approximately 0.1 nm). In addition, a further reduction in thickness of the layer containing lithium oxide might cause an increase in driving voltage of a light-emitting element. As a result of examination, lithium, which was contained in the layer containing lithium oxide, has been found to be likely to diffuse into an electron transport layer. Thus, a measure to reduce not the thickness of the layer containing lithium oxide with high conductivity but the thickness of the electron transport layer which was in contact with the layer from approximately 15 nm to 10 nm was taken.

In this example, three kinds of samples (display panels) were fabricated by a method similar to that in Example 1: a reference sample 1 ("Ref 1") is a display panel without a gap spacer; a sample 1 ("Sample 1") is a display panel with a gap spacer; and a sample 2 ("Sample 2") is a display panel without a gap spacer in which the structure of the intermediate layer of the light-emitting element is optimized.

Figure 29A:
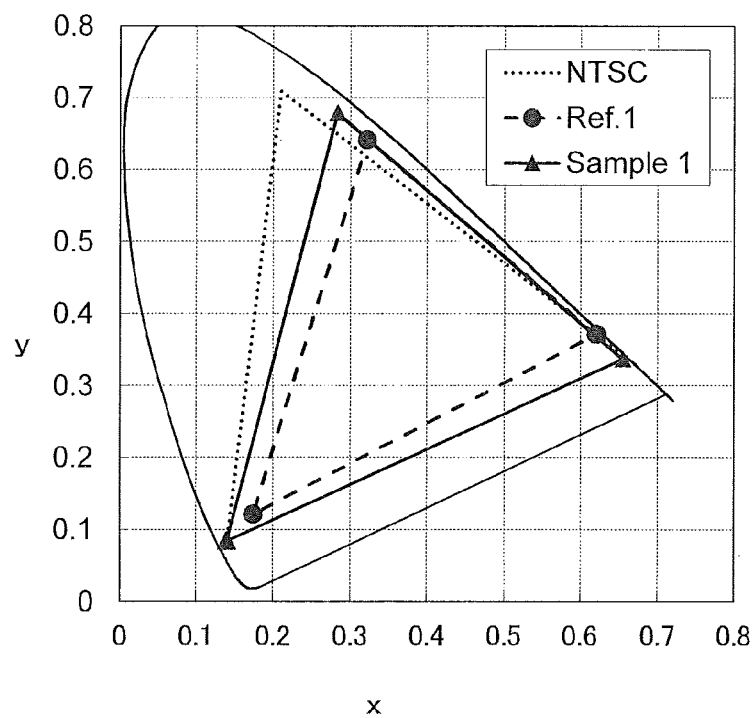
FIGS. 29A and 29B are chromaticity diagrams of Example 2.
Figure 29B:
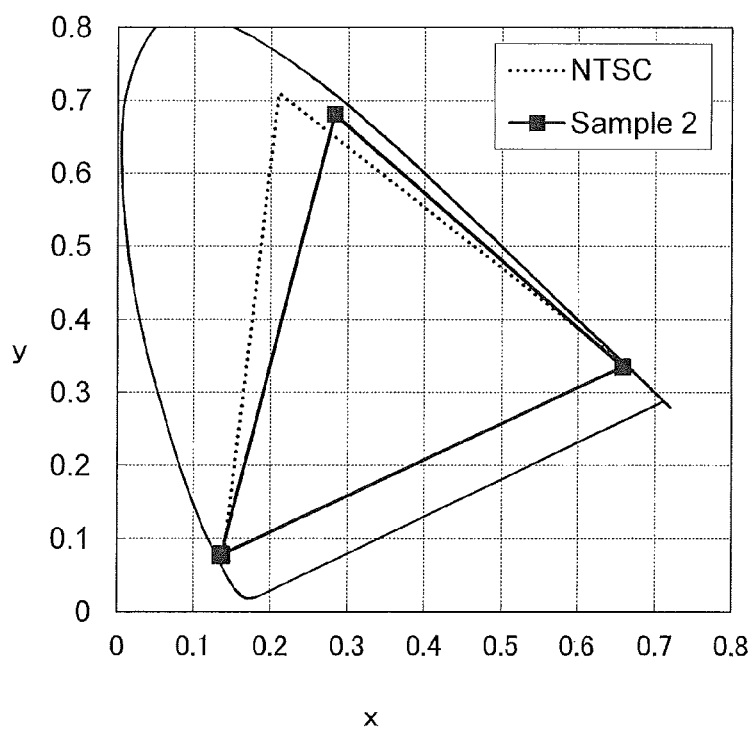

FIGS. 29A and 29B are a chromaticity diagram for the reference sample 1 and the sample 1 and that of the sample 2, respectively.

As seen from FIG. 29A, the color reproducibility of the sample 1, which has a gap spacer, is higher than that of the reference sample 1, which does not have. Similarly, the color reproducibility of the sample 2, in which the structure of the intermediate layer was changed, is also improved as seen from FIG. 29B.

Figure 30:
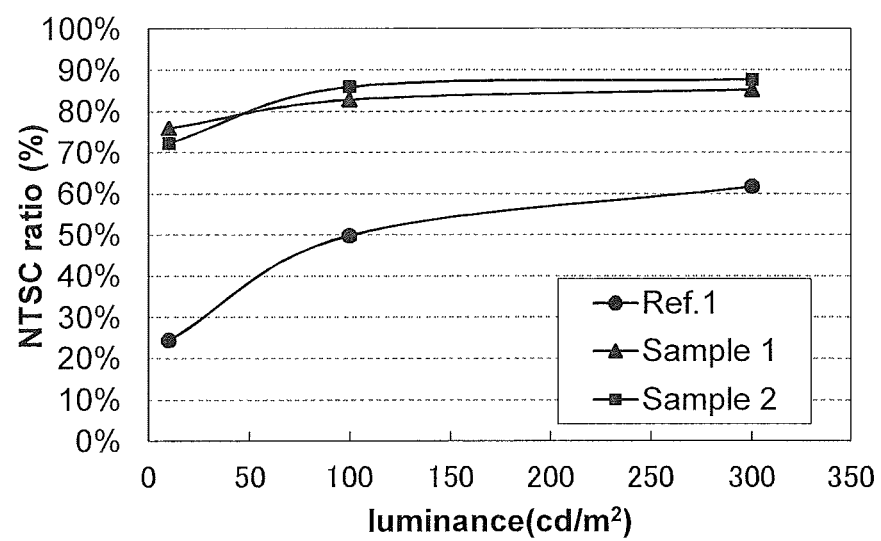
FIG. 30 shows luminance dependence of NTSC ratio of Example 2.

FIG. 30 shows luminance dependence of NTSC ratio of each sample. The results of FIG. 30 show that the influence of crosstalk becomes more pronounced on the lower-luminance side than on the higher-luminance side. In addition, the amount of change of NTSC ratio with respect to the luminance is smaller in the samples 1 and 2 than in the reference sample 1, which means the samples 1 and 2 have high color reproducibility.

Thus, a gap spacer can suppress the influence of crosstalk. In the case of fabricating a display panel in which a gap between substrates is reduced to lower the viewing angle dependency, it is effective to change a structure of an intermediate layer without providing a gap spacer, as in the sample 2. The NTSC ratio of the sample 2, which has no gap spacer, is high, approximately 88% when the luminance was 100 cd/m$^2$ or higher.

The above description thus far is Example 2.

Example 3

In this example, a display panel of one embodiment of the present invention was fabricated and the color reproducibility and the viewing angle dependency were examined.

In this example, three kinds of samples (display panels) were fabricated by a method similar to that in Example 1: a reference sample 2 ("Ref. 2") is a display panel without a gap spacer; a sample 3 ("Sample 3") is a display panel with a gap spacer; and a sample 4 ("Sample 4") is a display panel without a gap spacer in which a measure to reduce the conductivity of an electron transport layer of a light-emitting element has been taken.

In addition, a reference sample 3 ("Ref. 3") with a lower resolution than those of the sample 3, the sample 4, and the reference sample 2 was fabricated. The size of a display portion of the display panel which was used as the reference sample 3 was 9.2 inches in diagonal, the number of pixels was 1080×1920, the resolution (pixel density) was 238 ppi, the pixel size was 106.5 μm×106.5 μm (35.5 μm×RGB× 106.5 μm), and the aperture ratio was 56.0%. The reference sample 3 is a display panel with a gap spacer similarly to the sample 3. The reference sample 3 has a stripe arrangement in which pixel electrodes of RGB subpixels are arranged in the same direction without being out of line. The reference sample 3 was fabricated by a method similar to that in Example 1 except that a different photomask was used.

Figure 31:
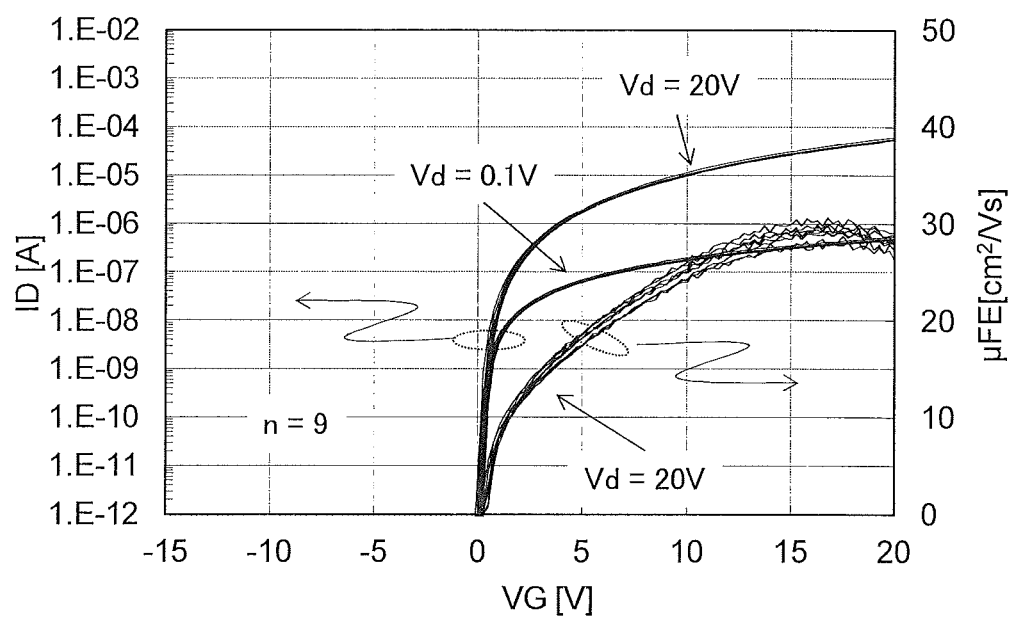
FIG. 31 shows electrical characteristics of a transistor of Example 3.

FIG. 31 shows an example of Id-Vg characteristics of the fabricated transistors. FIG. 31 shows the characteristics of channel-etched transistors using an In—Ga—Zn-based oxide as a semiconductor where a channel is formed. The transistor includes a first gate and a second gate which are electrically connected to each other with a semiconductor provided therebetween. The transistor has a channel width of approximately 3 μm and a channel length of approximately 3 μm. Measurement was performed under two conditions at the source-drain voltages of 0.1 V and 20 V. The source-gate voltage was swept from −15 V to 20 V. In addition, FIG. 31 shows field-effect mobility calculated from data obtained when the source-drain voltage is 20 V. As seen from FIG. 31, the transistors showed normally-off characteristics with extremely small variation. The highest field-effect mobility was as high as approximately 30 cm$^2$/Vs.

Figure 32A:
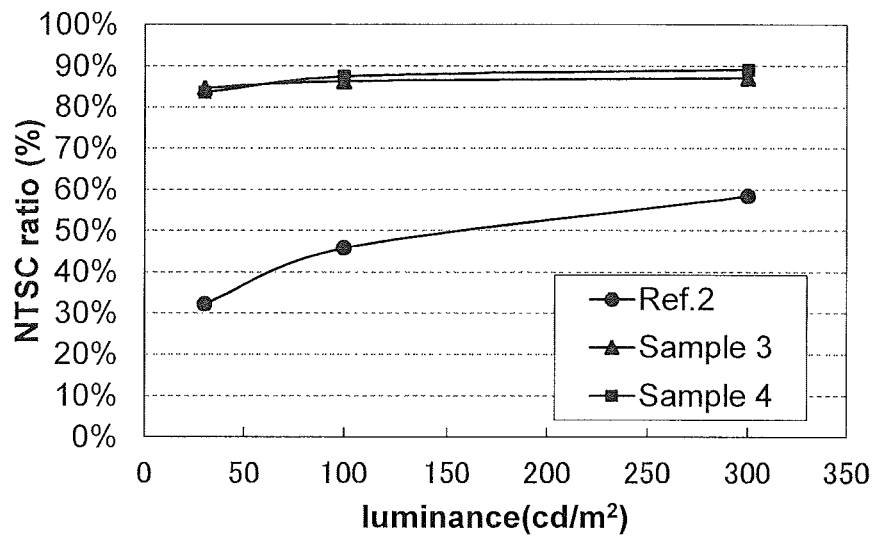
FIGS. 32A and 32B show luminance dependence of NTSC ratio and a chromaticity diagram of Example 3.

FIG. 32A shows luminance dependence of NTSC ratio of each sample. The results of FIG. 32A show that the amount of change of NTSC ratio with respect to the luminance is smaller in the samples 3 and 4 than in the reference sample 2.

Figure 32B:
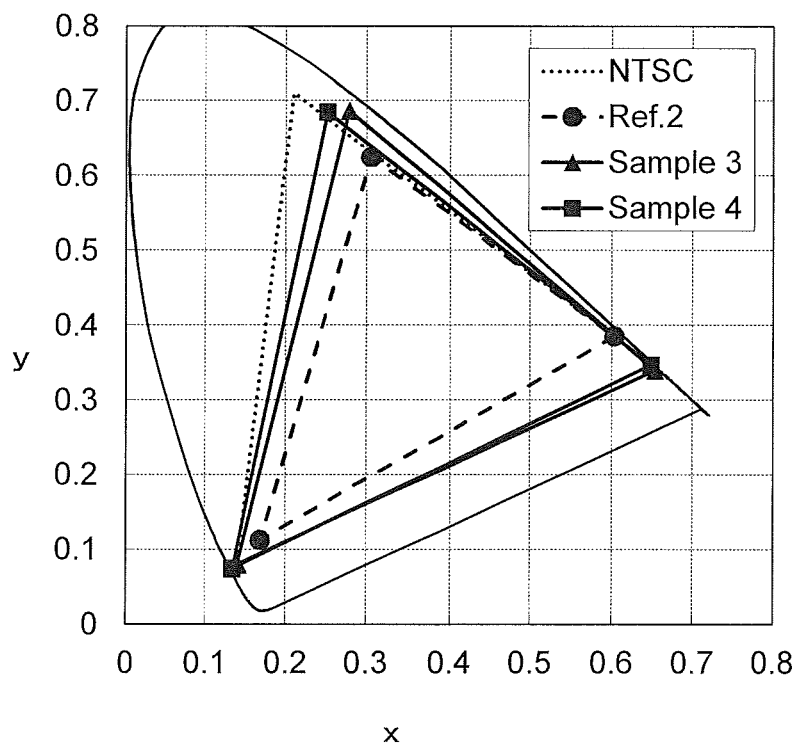

FIG. 32B is a chromaticity diagram of each sample. The color reproducibility of the samples 3 and 4 is improved as compared to the reference sample 2 as seen from FIG. 32B.

The above results show that each of the provision of a gap spacer and the reduction in conductivity of an electron transport layer of a light-emitting element leads to enhancement of color reproducibility.

Next, the viewing angle dependence of chromaticity of the samples 3 and 4 was measured. In measurement of the viewing angle dependence of chromaticity, the direction perpendicular to the surface of the display panel was regarded as 0°, and the luminance spectra were measured at five angles of −60°, −30°, 0°, 30°, and 60°. Then, the chromaticity at each angle was calculated using the spectra. The luminance spectra were measured while the display panel displayed images of four colors of red, green, blue, and white. The viewing angle dependence of the chromaticity was measured in two directions parallel to and perpendicular to the arrangement direction of the same color pixels of the display panel.

In addition, the viewing angle dependence of the chromaticity was measured for the reference sample 3 at seven angles of −60°, −45°, −30°, 0°, 30°, 45°, and 60°.

Figure 33A:
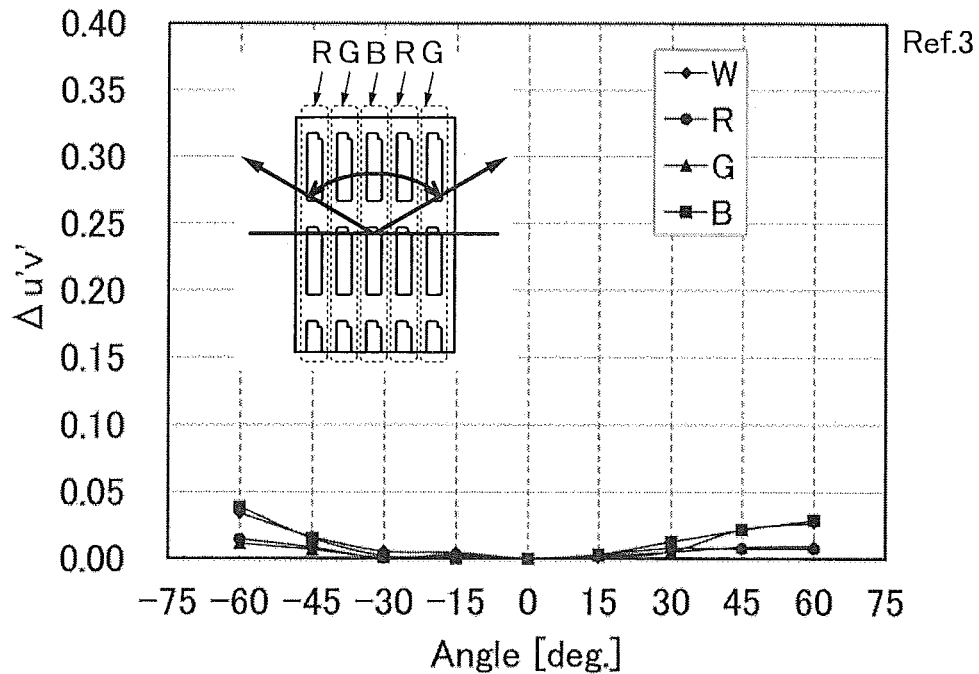
FIGS. 33A and 33B show viewing angle dependence of chromaticity of Example 3.
Figure 33B:
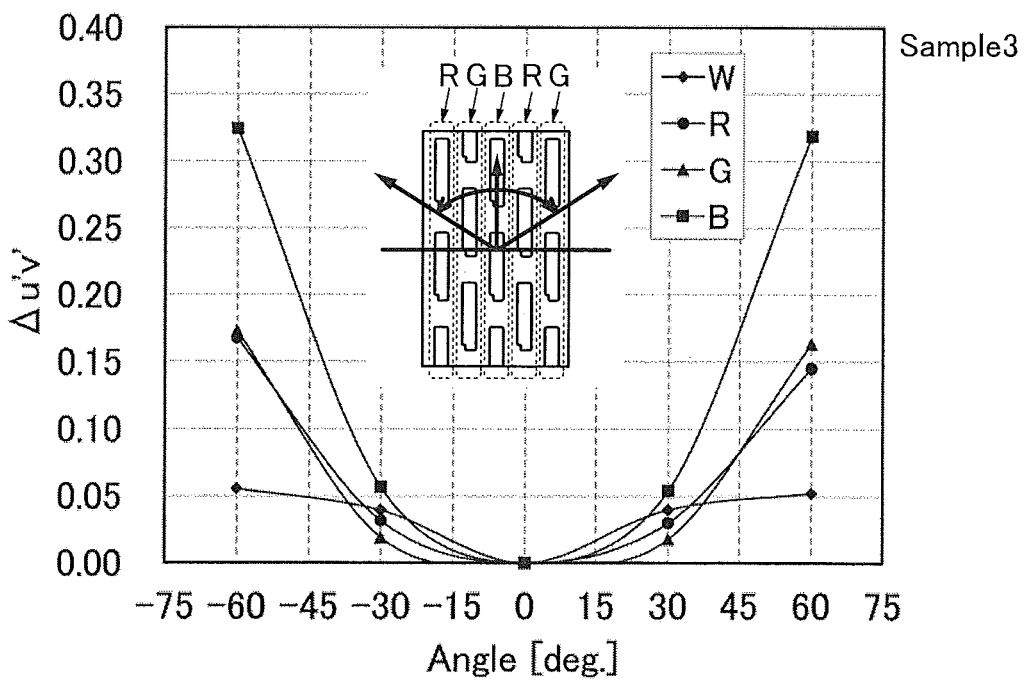

FIGS. 33A and 33B show the viewing angle dependence of chromaticity of the reference sample 3 and that of the sample 3, respectively. FIGS. 33A and 33B show results of measurement in the direction perpendicular to the arrangement direction of the same color pixels.

The horizontal axis and the vertical axis represent angle and the amount of change in chromaticity with reference to data at 0°, respectively.

As shown in FIG. 33B, a phenomenon in which the chromaticity changed as the viewing angle increased was observed in the sample 3. In contrast, the change in the reference sample 3 was smaller than that in the sample 3 as shown in FIG. 33A. In addition, the viewing angle dependence of the chromaticity in the direction parallel to the arrangement direction of different color pixels is particularly obvious. A cause of the phenomenon is considered that light emission from a light-emitting element through a color filter of a pixel adjacent to the element easily occurs by an increase in distance between a light-emitting element and a color filter due to a gap spacer. In addition, FIGS. 33A and 33B show that the influence of a gap spacer on the viewing angle dependence is obvious in the extremely high-resolution display panel, whereas a gap spacer has little influence on the viewing angle dependence in the display panel whose resolution is relatively low.

Figure 34A:
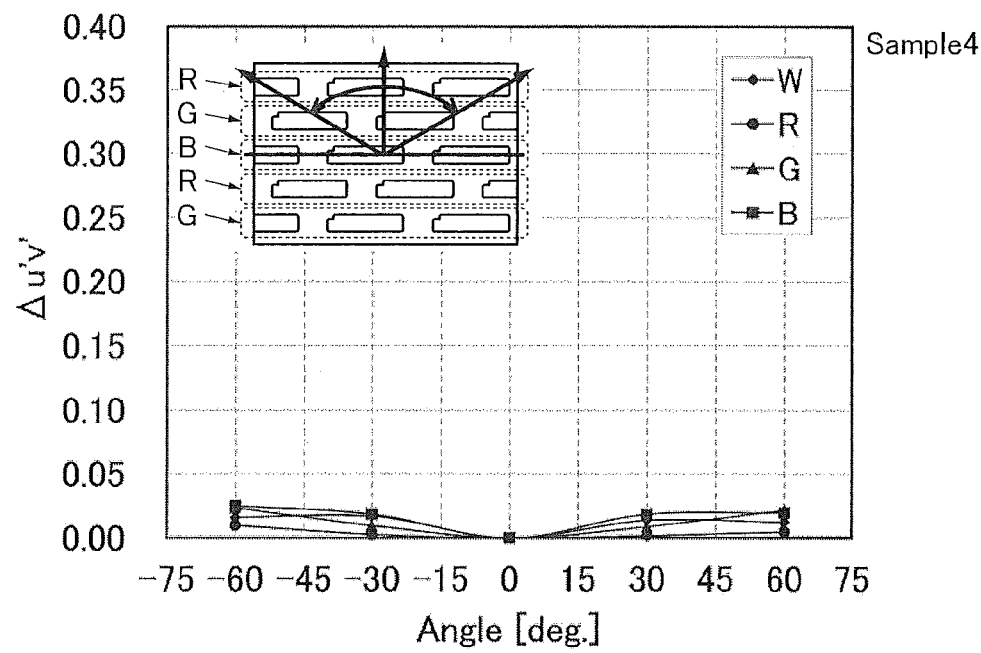
FIGS. 34A and 34B show viewing angle dependence of chromaticity of Example 3.
Figure 34B:
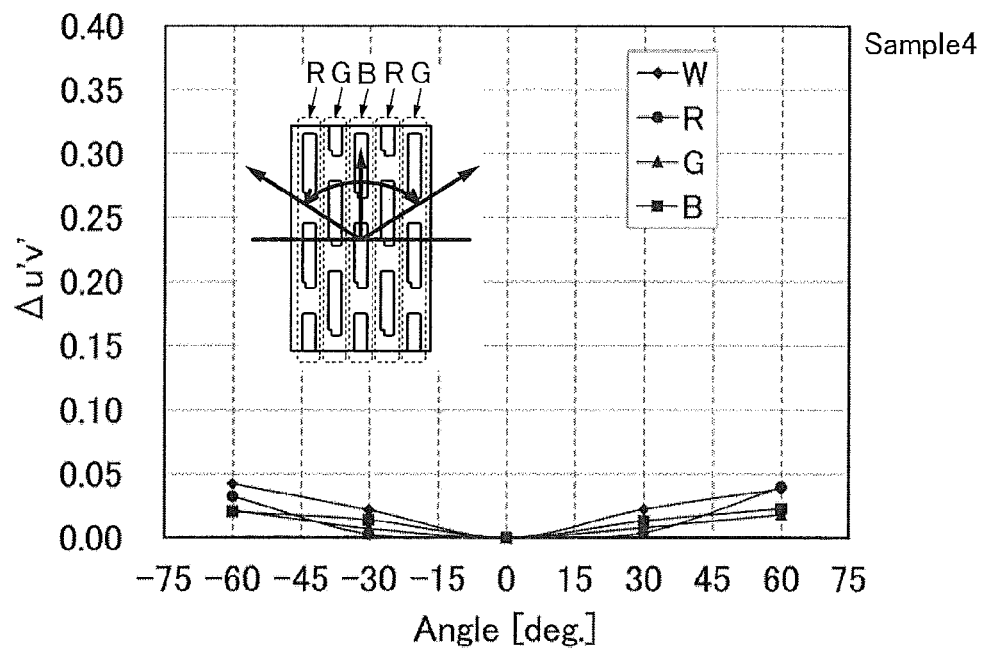

FIGS. 34A and 34B show measurement results of the viewing angle dependence of the chromaticity of the sample 4. FIG. 34A shows results of measurement in the direction parallel to the arrangement direction of the same color pixels, and FIG. 34B shows results of measurement in the direction perpendicular to the arrangement direction thereof.

As shown in FIGS. 34A and 34B, the viewing angle dependence of the chromaticity of the sample 4, in which the measure to reduce the conductivity of the electron transport layer of the light-emitting element has been taken and did not include a gap spacer in order to reduce crosstalk, was significantly reduced as compared to the sample 3.

As a result of the measure to reduce the conductivity of an electron transport layer of a light-emitting element, an extremely-high-resolution display panel having both high color reproducibility and low viewing angle dependence of the chromaticity was fabricated.

The above is the description of Example 3.

EXPLANATION OF REFERENCE

10: display device, 11: pixel portion, 12: circuit, 13: circuit, 14: circuit, 15*a*: terminal portion, 15*b*: terminal portion, 16*a*: wiring, 16*b*: wiring, 16*c*: wiring, 20: pixel unit, 21*a*: pixel, 21*b*: pixel, 22: display region, 30*a*: straight line, 30*b*: straight line, 30*c*: rectangle, 30*d*: rectangle, 31: pixel electrode, 31*a*: pixel electrode, 31*b*: pixel electrode, 32*a*: pixel electrode, 32*b*: pixel electrode, 33*a*: pixel electrode, 33*b*: pixel electrode, 41*a*: pixel circuit, 41*b*: pixel circuit, 42*a*: pixel circuit, 42*b*: pixel circuit, 43*a*: pixel circuit, 43*b*: pixel circuit, 51: wiring, 51*a*: wiring, 51*b*: wiring, 52: wiring, 52*a*: wiring, 52*b*: wiring, 52*c*: wiring, 52*d*: wiring, 53S: wiring group, 53: wiring, 53*a*: wiring, 53*b*: wiring, 53*c*: wiring, 54: wiring, 55: wiring, 57: wiring, 60: display element, 60*a*: display element, 60*b*: display element, 61: transistor, 62: transistor, 63: capacitor, 64: transistor, 71*a*: subpixel, 71*b*: subpixel, 72*a*: subpixel, 72*b*: subpixel, 73*a*: subpixel, 73*b*: subpixel, 80: circuit, 81: transistor, 82: transistor, 83: wiring, 84: wiring, 85: terminal, 86: output terminal, 91_1~5: wiring, 92_1~2: wiring, 93_1~6: transistor, 94: capacitor, 95: display element, 96_1~3: wiring, 97_1~3: wiring, 98_1~6: transistor, 101: substrate, 102: substrate, 211: insulating layer, 212: insulating layer, 213: insulating layer, 214: insulating layer, 215: spacer, 216: insulating layer, 220: adhesive layer, 221: insulating layer, 222: EL layer, 223: electrode, 224*a*: optical adjustment layer, 224*b*: optical adjustment layer, 230*a*: structure, 230*b*: structure, 231: light-blocking layer, 232*a*: coloring layer, 232*b*: coloring layer, 241: FPC, 242: FPC, 243: connection layer, 244: IC, 250: space, 251: transistor, 252: transistor, 253: conductive layer, 260: sealant 261: adhesive layer, 262: adhesive layer, 501: display portion, 503*s*: circuit, 505: touch panel, 509: FPC, 511: wiring, 519: terminal portion, 570: substrate, 590: substrate, 591: electrode, 592: electrode, 594: wiring, 595: touch sensor, 597: adhesive layer, 598: wiring, 599: connection layer, 601: pulse voltage output circuit, 602: current sensing circuit, 603: capacitor, 611: transistor, 612: transistor, 613: transistor, 621: electrode, 622: electrode, 901: housing, 902: housing, 903: display portion, 904: display portion, 905: microphone, 906: speaker, 907: operation button, 908: stylus, 921: housing, 922: display portion, 923: keyboard, 924: pointing device, 7000: display portion, 7001: display portion, 7100: mobile phone, 7101: housing, 7103: operation button, 7104: external connection port, 7105: speaker, 7106: microphone, 7111: remote controller, 7200: television set, 7201: housing, 7203: stand, 7211: remote controller, 7300: portable information terminal, 7301: housing, 7302: operation button, 7303: information, 7304: information, 7305: information, 7306: information, 7310: portable information terminal, 7320: portable information terminal, 7400: lighting device, 7401: stage, 7402: light-emitting portion, 7403: operation switch, 7410: lighting device, 7412: light-emitting portion, 7420: lighting device, 7422: light-emitting portion, 7500: portable information terminal, 7501: housing, 7502: display portion tab, 7503: operation button, 7600: portable information terminal, 7601: housing, 7602: hinge, 7650: portable information terminal, 7651: non-display portion, 7700: portable information terminal, 7701: housing, 7703*a*: button, 7703*b*: button, 7704*a*: speaker, 7704*b*: speaker, 7705: external connection port, 7706: microphone, 7709: battery, 7800: portable information terminal, 7801: band, 7802: input-output terminal, 7803: operation button, 7804: icon, 7805: battery, 8000: camera, 8001: housing, 8002: display portion, 8003: operation button, 8004: shutter button, 8005: connection portion, 8006: lens, 8100: finder, 8101: housing, 8102: display portion, 8103: button, 8200: head-mounted display, 8201: mounting portion, 8202: lens, 8203: main body, 8204: display portion, 8205: cable, 8206: battery, 9700: automobile, 9701: car body, 9702: wheels, 9703: dashboard, 9704: lights, 9710: display portion, 9711: display portion, 9712: display portion, 9713: display portion, 9714: display portion, 9715: display portion, 9721: display portion, 9722: display portion, 9723: display portion.

This application is based on Japanese Patent Application serial no. 2014-185978 filed with Japan Patent Office on Sep. 12, 2014, Japanese Patent Application serial no. 2014-218933 filed with Japan Patent Office on Oct. 28, 2014, Japanese Patent Application serial no. 2014-242929 filed with Japan Patent Office on Dec. 1, 2014, Japanese Patent Application serial no. 2015-110198 filed with Japan Patent Office on May 29, 2015, the entire contents of which are hereby incorporated by reference.

The invention claimed is:
1. A display device comprising:
  a pixel comprising a first subpixel, a second subpixel, and a third subpixel;
  a first wiring; and
  a second wiring,
  wherein the first subpixel comprises a first transistor and a first display element, wherein the second subpixel comprises a second transistor and a second display element,
wherein the third subpixel comprises a third transistor and a third display element,
wherein the first wiring is electrically connected to a gate of the first transistor and a gate of the second transistor,
wherein the second wiring is electrically connected to a gate of the third transistor,
wherein the first display element comprises a first electrode,
wherein the second display element comprises a second electrode
wherein the third display element comprises a third electrode, and
wherein the third electrode is provided between the first electrode and the second electrode,
wherein the first electrode and the second wiring are not overlapped with each other,
wherein the second electrode and the second wiring are not overlapped with each other, and
wherein the third electrode and the first wiring are overlapped with each other.

2. The display device according to claim 1, wherein a straight line through a centroid of the first electrode and a centroid of the second electrode does not overlap with a centroid of the third electrode in a plane view.

3. The display device according to claim 1, wherein a resolution is more than or equal to 400 ppi and less than or equal to 2000 ppi.

4. The display device according to claim 1, comprising a circuit,
wherein the circuit has a function of selectively outputting current flowing through the first display element, and
wherein the circuit has a function of supplying a predetermined potential to the first display element.

5. A display device comprising:
a first pixel comprising a first subpixel, a second subpixel, and a third subpixel;
a second pixel comprising a fourth subpixel, a fifth subpixel, and a sixth subpixel;
a first wiring;
a second wiring;
a third wiring;
a fourth wiring; and
a fifth wiring,
wherein the first subpixel comprises a first transistor and a first display element,
wherein the second subpixel comprises a second transistor and a second display element,
wherein the third subpixel comprises a third transistor and a third display element,
wherein the fourth subpixel comprises a fourth transistor and a fourth display element,
wherein the fifth subpixel comprises a fifth transistor and a fifth display element,
wherein the sixth subpixel comprises a sixth transistor and a sixth display element,
wherein the first wiring is electrically connected to a gate of the first transistor, a gate of the second transistor, and a gate of the fourth transistor,
wherein the second wiring is electrically connected to a gate of the third transistor, a gate of the fifth transistor, and a gate of the sixth transistor,
wherein one of a source and a drain of the first transistor is electrically connected to the third wiring,
wherein one of a source and a drain of the second transistor is electrically connected to the fourth wiring,
wherein one of a source and a drain of the third transistor is electrically connected to the third wiring,
wherein one of a source and a drain of the fourth transistor is electrically connected to the fifth wiring,
wherein one of a source and a drain of the fifth transistor is electrically connected to the fourth wiring, and
wherein one of a source and a drain of the sixth transistor is electrically connected to the fifth wiring.

6. The display device according to claim 5,
wherein the first display element comprises a first electrode,
wherein the second display element comprises a second electrode,
wherein the third display element comprises a third electrode,
wherein the fourth display element comprises a fourth electrode,
wherein the fifth display element comprises a fifth electrode,
wherein the sixth display element comprises a sixth electrode,
wherein the third electrode is provided between the first electrode and the second electrode,
wherein the fourth electrode is provided between the fifth electrode and the sixth electrode, and
wherein the second electrode is adjacent to the fifth electrode.

7. The display device according to claim 6,
wherein a centroid of the first electrode, a centroid of the second electrode, and a centroid of the fourth electrode are in a first line,
wherein a centroid of the third electrode, a centroid of the fifth electrode, and a centroid of the sixth electrode are in a second line, and
the first line is parallel to and does not overlap with the second line.

8. The display device according to claim 6,
wherein the first electrode and the second wiring are not overlapped with each other,
wherein the second electrode and the second wiring are not overlapped with each other,
wherein the third electrode and the first wiring are overlapped with each other
wherein the fourth electrode and the second wiring are not overlapped with each other,
wherein the fifth electrode and the first wiring are overlapped with each other, and
wherein the sixth electrode and the first wiring are overlapped with each other.

9. The display device according to claim 5,
wherein the first display element and the fifth display element have a function of emitting light of a first color,
wherein the second display element and the sixth display element have a function of emitting light of a second color, and
wherein the third display element and the fourth display element have a function of emitting light of a third color.

10. The display device according to claim 5, wherein a resolution is more than or equal to 400 ppi and less than or equal to 2000 ppi.

11. The display device according to claim 5, comprising a circuit,
wherein the circuit has a function of selectively outputting current flowing through the first display element, and
wherein the circuit has a function of supplying a predetermined potential to the first to third display element.

12. A display device comprising:
  a first pixel comprising a first subpixel, a second subpixel, and a third subpixel;
  a first wiring; and
  a second wiring,
  wherein the first subpixel comprises a first transistor and a first display element comprising a first electrode,
  wherein the second subpixel comprises a second transistor and a second display element comprising a second electrode,
  wherein the third subpixel comprises a third transistor and a third display element comprising a third electrode,
  wherein the first wiring is electrically connected to a gate of the first transistor and a gate of the second transistor,
  wherein the second wiring is electrically connected to a gate of the third transistor,
  wherein the first electrode, the second electrode, and the third electrode are along a first direction parallel to the first wiring,
  wherein the first transistor and the second transistor are along the first direction, and
  wherein the first transistor and the third transistor are along a second direction perpendicular to the first wiring.

13. The display device according to claim 12, wherein the third electrode is provided between the first electrode and the second electrode.

14. The display device according to claim 12, further comprising:
  a second pixel comprising a fourth subpixel, a fifth subpixel, and a sixth subpixel;
  wherein the fourth subpixel comprises a fourth transistor and a fourth display element comprising a fourth electrode,
  wherein the fifth subpixel comprises a fifth transistor and a fifth display element comprising a fifth electrode,
  wherein the sixth subpixel comprises a sixth transistor and a sixth display element comprising a sixth electrode,
  wherein the first wiring is electrically connected to the gate of the first transistor, the gate of the second transistor, and a gate of the fourth transistor,
  wherein the second wiring is electrically connected to the gate of the third transistor, a gate of the fifth transistor, and a gate of the sixth transistor, and
  wherein the fourth electrode, the fifth electrode, and the sixth electrode are along the first direction.

15. The display device according to claim 14,
  wherein the first transistor, the second transistor, and the fourth transistor are along the first direction,
  wherein the third transistor, the fifth transistor, and the sixth transistor are along the first direction,
  wherein the first transistor and the third transistor are along the second direction,
  wherein the second transistor and the fifth transistor are along the second direction, and
  wherein the fourth transistor and the sixth transistor are along the second direction.

16. A display device comprising:
  a pixel comprising a first subpixel, a second subpixel, and a third subpixel;
  a first wiring;
  a second wiring;
  a third wiring; and
  a fourth wiring,
  wherein the first subpixel comprises a first transistor and a first display element,
  wherein the second subpixel comprises a second transistor and a second display element,
  wherein the third subpixel comprises a third transistor and a third display element,
  wherein the first wiring is electrically connected to a gate of the first transistor and a gate of the second transistor,
  wherein the second wiring is electrically connected to a gate of the third transistor,
  wherein the third wiring is electrically connected to one of a source and a drain of the first transistor and one of a source and a drain of the third transistor, and
  wherein the fourth wiring is electrically connected to one of a source and a drain of the second transistor.

17. The display device according to claim 16,
  wherein the first display element can emit light of red color,
  wherein the second display element can emit light of blue color, and
  wherein the third display element can emit light of green color.

18. The display device according to claim 16,
  wherein the first transistor and the second transistor are arranged in a first direction which is parallel to the first wiring, and
  wherein the first transistor and the third transistor are arranged in a second direction which is parallel to the third wiring.

19. The display device according to claim 16, wherein a resolution is more than or equal to 400 ppi and less than or equal to 2000 ppi.

20. The display device according to claim 16, comprising a circuit,
  wherein the circuit has a function of selectively outputting current flowing through the first display element, and
  wherein the circuit has a function of supplying a predetermined potential to the first display element.

* * * * *

UNITED STATES PATENT AND TRADEMARK OFFICE
CERTIFICATE OF CORRECTION

| | | |
|---|---|---|
| PATENT NO. | : 9,525,017 B2 | Page 1 of 1 |
| APPLICATION NO. | : 14/848698 | |
| DATED | : December 20, 2016 | |
| INVENTOR(S) | : Hideaki Shishido et al. | |

It is certified that error appears in the above-identified patent and that said Letters Patent is hereby corrected as shown below:

In the Specification

Column 2, Line 52; Change "subpixel, includes" to --subpixel includes--.

Column 20, Line 49; Change "(FIFE)." to --(PTFE).--.

Column 26, Line 33; Change "example; in" to --example, in--.

Column 32, Line 64; Change "waveform is in" to --waveforms in--.

Column 41, Line 39; Change "area and" to --area, and--.

Column 43, Line 29; Change "("Ref 1")" to --("Ref. 1")--.

In the Claims

Column 47, Line 12, Claim 1; Change "electrode" to --electrode,--.

Column 48, Line 67, Claim 11; Change "potential to the first to third display element." to --potential to the first display element.--.

Signed and Sealed this
Sixth Day of June, 2017

Michelle K. Lee
*Director of the United States Patent and Trademark Office*